(12) United States Patent
Kim et al.

(10) Patent No.: US 10,297,601 B2
(45) Date of Patent: May 21, 2019

(54) SEMICONDUCTOR DEVICES WITH LAYERS COMMONLY CONTACTING FINS AND METHODS OF MANUFACTURING THE SAME

(71) Applicant: Samsung Electronics Co., Ltd., Suwon-si, Gyeonggi-do (KR)

(72) Inventors: Jin-Bum Kim, Seoul (KR); Myung-Gil Kang, Suwon-si (KR); Kang-Hun Moon, Incheon (KR); Cho-Eun Lee, Pocheon-si (KR); Su-Jin Jung, Hwaseong-si (KR); Min-Hee Choi, Suwon-si (KR); Yang Xu, Hwaseong-si (KR); Dong-Suk Shin, Yongin-si (KR); Kwan-Heum Lee, Suwon-si (KR); Hoi-Sung Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 15/351,739

(22) Filed: Nov. 15, 2016

(65) Prior Publication Data
US 2017/0148797 A1    May 25, 2017

(30) Foreign Application Priority Data
Nov. 20, 2015  (KR) ......................... 10-2015-0163323

(51) Int. Cl.
*H01L 27/11*    (2006.01)
*H01L 29/66*    (2006.01)
(Continued)

(52) U.S. Cl.
CPC .. *H01L 27/1104* (2013.01); *H01L 21/823431* (2013.01); *H01L 23/485* (2013.01);
(Continued)

(58) Field of Classification Search
CPC ............ H01L 29/785; H01L 29/66795; H01L 29/7848; H01L 27/0886; H01L 21/823431;
(Continued)

(56) References Cited

U.S. PATENT DOCUMENTS 9,054,189 B1    6/2015 Kim et al.
2005/0199919 A1    9/2005 Liu et al.
(Continued)

FOREIGN PATENT DOCUMENTS

JP    2014-063928    4/2014
KR    1020140106270    9/2014

*Primary Examiner* — David Chen
(74) *Attorney, Agent, or Firm* — Myers Bigel, P.A.

(57) ABSTRACT

A semiconductor device may include a first active fin, a plurality of second active fins, a first source/drain layer structure, and a second source/drain layer structure. The first active fin may be on a first region of a substrate. The second active fins may be on a second region of the substrate. The first and second gate structures may be on the first and second active fins, respectively. The first source/drain layer structure may be on a portion of the first active fin that is adjacent to the first gate structure. The second source/drain layer structure may commonly contact upper surfaces of the second active fins adjacent to the second gate structure. A top surface of the second source/drain layer structure may be further from the surface of the substrate than a top surface of the first source/drain layer structure is to the surface of the substrate.

19 Claims, 88 Drawing Sheets

(51) Int. Cl.
*H01L 29/78* (2006.01)
*H01L 23/528* (2006.01)
*H01L 27/088* (2006.01)
*H01L 29/08* (2006.01)
*H01L 29/161* (2006.01)
*H01L 29/45* (2006.01)
*H01L 23/485* (2006.01)
*H01L 21/8234* (2006.01)
*H01L 29/417* (2006.01)
*H01L 27/092* (2006.01)
*H01L 29/165* (2006.01)

(52) U.S. Cl.
CPC ...... *H01L 23/5283* (2013.01); *H01L 27/0886* (2013.01); *H01L 29/0847* (2013.01); *H01L 29/161* (2013.01); *H01L 29/41791* (2013.01); *H01L 29/456* (2013.01); *H01L 29/66545* (2013.01); *H01L 29/66795* (2013.01); *H01L 29/785* (2013.01); *H01L 29/7848* (2013.01); H01L 27/0924 (2013.01); H01L 29/165 (2013.01)

(58) Field of Classification Search
CPC . H01L 27/0924; H01L 29/165; H01L 21/845; H01L 21/823814; H01L 29/41791
USPC ............... 257/288, 347, 368, 401, E21.409, 257/E21.632, E29.255
See application file for complete search history.

(56) References Cited

U.S. PATENT DOCUMENTS

| | | | |
|---|---|---|---|
| 2012/0161238 A1* | 6/2012 | Scheiper | H01L 21/823412 257/368 |
| 2013/0089959 A1 | 4/2013 | Kwok et al. | |
| 2013/0248948 A1 | 9/2013 | Ma et al. | |
| 2014/0084339 A1 | 3/2014 | Nishimori et al. | |
| 2014/0167120 A1* | 6/2014 | Chi | H01L 27/0886 257/288 |
| 2014/0197456 A1 | 7/2014 | Wang et al. | |
| 2014/0239255 A1 | 8/2014 | Kang et al. | |
| 2014/0252489 A1 | 9/2014 | Yu et al. | |
| 2014/0264590 A1 | 9/2014 | Yu et al. | |
| 2014/0299934 A1* | 10/2014 | Kim | H01L 29/7848 257/347 |
| 2014/0374831 A1* | 12/2014 | Liaw | H01L 27/1104 257/368 |
| 2015/0035023 A1* | 2/2015 | Kim | H01L 29/785 257/288 |
| 2015/0035074 A1 | 2/2015 | Obradovic et al. | |
| 2015/0287711 A1* | 10/2015 | Kim | H01L 27/0207 257/344 |
| 2016/0027918 A1* | 1/2016 | Kim | H01L 29/7848 257/401 |
| 2016/0365452 A1* | 12/2016 | Tung | H01L 29/7853 |

* cited by examiner

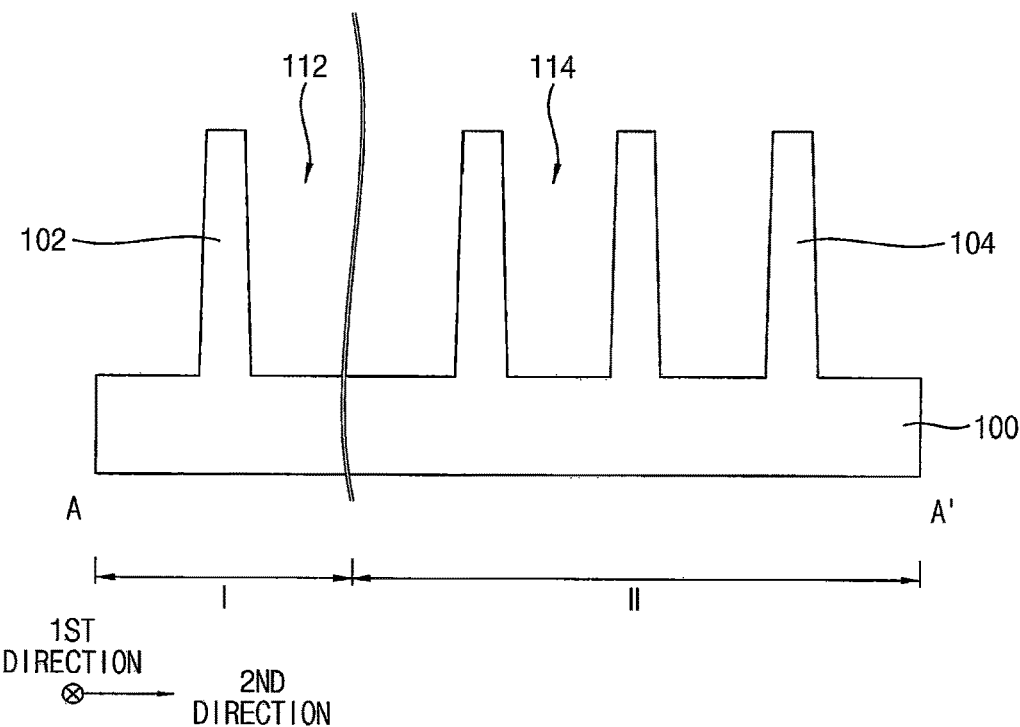
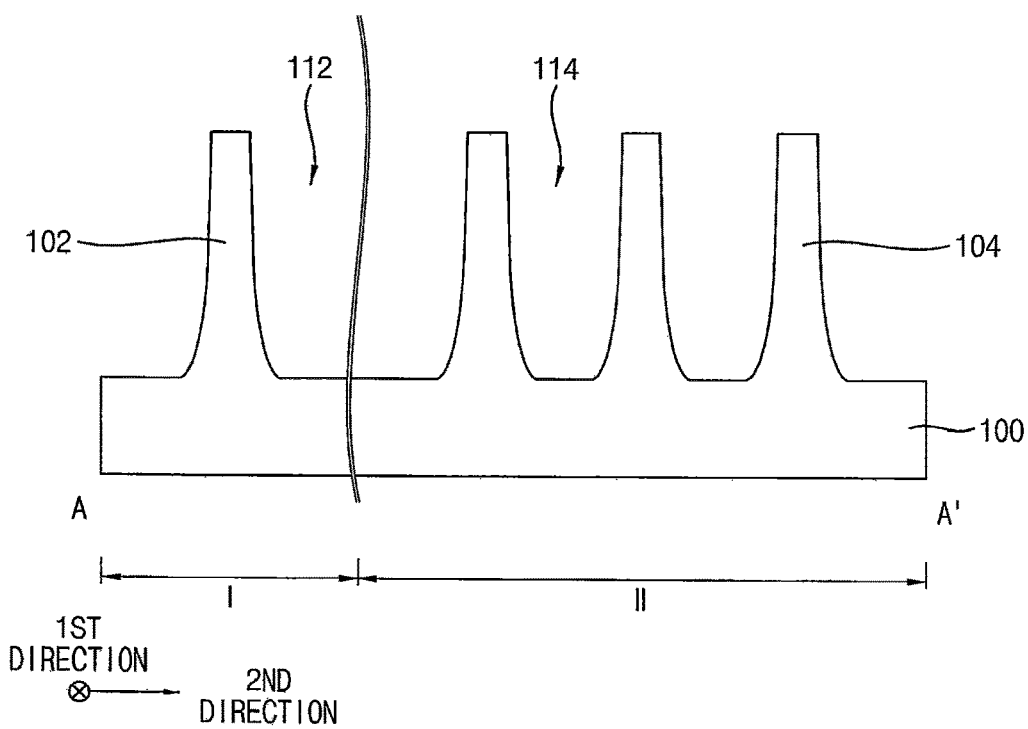

SEMICONDUCTOR DEVICES WITH LAYERS COMMONLY CONTACTING FINS AND METHODS OF MANUFACTURING THE SAME

CROSS-REFERENCE TO RELATED APPLICATION

This application claims priority under 35 U.S.C. § 119 to Korean Patent Application No. 10-2015-0163323, filed on Nov. 20, 2015 in the Korean Intellectual Property Office (KIPO), the contents of which are hereby incorporated herein by reference in their entirety.

BACKGROUND

1. Field

Example embodiments of the inventive concepts relate to semiconductor devices, and more particularly, to semiconductor devices including epitaxial layers and methods of manufacturing the same.

2. Description of the Related Art

In a fin-based field effect transistor (finFET), a source/drain layer may be formed on an active fin by a selective epitaxial growth (SEG) process. The source/drain layer may grow both in vertical and horizontal directions, and when the active fins are close to each other, the source/drain layers grown from the active fins, respectively, may be merged with each other. In a static random access memory (SRAM) device, when the source/drain layers grown from the active fins of neighboring transistors are merged with each other, an electric failure may occur.

SUMMARY

The inventive concepts provide semiconductor devices having good characteristics and methods of manufacturing semiconductor devices having good characteristics.

According to some embodiments of the inventive concepts, semiconductor devices are provided. A semiconductor device may include a first active fin, a plurality of second active fins, a first source/drain layer structure, and a second source/drain layer structure. The first active fin may be on a first region of a surface of a substrate. The surface of the substrate may include the first region and a second region. The second active fins may be on the second region of the substrate. The first and second gate structures may be on the first and second active fins, respectively. The first source/drain layer structure may be on a portion of the first active fin that is adjacent to the first gate structure. The second source/drain layer structure may commonly contact upper surfaces of the second active fins adjacent to the second gate structure, and a top surface of the second source/drain layer structure may be further from the surface of the substrate than a top surface of the first source/drain layer structure is to the surface of the substrate.

In some embodiments, the first source/drain layer structure may include a first semiconductor layer on the first active fin, a second semiconductor layer on the first semiconductor layer, and a third semiconductor layer on the second semiconductor layer. The second source/drain layer structure may include fourth semiconductor layers on the respective second active fins that are spaced apart from each other, a continuous fifth semiconductor layer commonly on the fourth semiconductor layers, and a continuous sixth semiconductor layer on the fifth semiconductor layer.

In some embodiments, the first and fourth semiconductor layers may include silicon-germanium with a first germanium concentration, the second and fifth semiconductor layers may include silicon-germanium with a second germanium concentration greater than the first germanium concentration, and the third and sixth semiconductor layers may include silicon-germanium with a third germanium concentration greater than the second germanium concentration.

In some embodiments, the first and fourth semiconductor layers may further include p-type impurities with a fourth impurity concentration, the second and fifth semiconductor layers may further include p-type impurities with a fifth impurity concentration greater than the fourth impurity concentration, and the third and sixth semiconductor layers may further include p-type impurities with a sixth impurity concentration greater than the fifth impurity concentration.

In some embodiments, the first and fourth semiconductor layers may include silicon carbide with a first carbon concentration, the second and fifth semiconductor layers may include silicon carbide with a second carbon concentration greater than the first carbon concentration, and the third and sixth semiconductor layers may include silicon carbide with a third carbon concentration greater than the second carbon concentration.

In some embodiments, the first and fourth semiconductor layers may further include n-type impurities with a fourth impurity concentration, the second and fifth semiconductor layers may further include n-type impurities with a fifth impurity concentration greater than the fourth impurity concentration, and the third and sixth semiconductor layers may further include n-type impurities with a sixth impurity concentration greater than the fifth impurity concentration.

In some embodiments, the first and second active fins may include respective longest dimensions that extend in a first direction substantially parallel to the surface of the substrate, and the first and second gate structures may include respective longest dimensions that extend in a second direction that is substantially parallel to the surface of the substrate and crosses the first direction.

In some embodiments, a cross-section of the second semiconductor layer taken along the second direction may have a first shape including upper sidewall surfaces defining an angle with respect to the surface of the substrate and facing away from the substrate, lower sidewall surfaces defining an angle with respect to the surface of the substrate and facing towards the surface of the substrate, and a top surface that is parallel to the surface of the substrate. The third semiconductor layer may be formed on the upper sidewall surfaces of the second semiconductor layer. A cross-section of the fifth semiconductor layer taken along the second direction may have a shape including a plurality of second shapes that are connected to each other in the second direction. The second shapes may be on respective ones of the second active fins and may include upper sidewall surfaces defining an angle with respect to the surface of the substrate and facing away from the substrate and lower sidewall surfaces defining an angle with respect to the surface of the substrate and facing towards the surface of the substrate. The sixth semiconductor layer may be formed on the upper sidewall surfaces of the fifth semiconductor layer.

In some embodiments, a top surface of the sixth semiconductor layer may be substantially coplanar with a top surface of the fifth semiconductor layer.

In some embodiments, a cross-section of the sixth semiconductor layer taken along the second direction may include a top surface that is substantially flat and substantially parallel to the surface of the substrate along the second direction.

In some embodiments, in a cross-section taken along the second direction, a thickness of the sixth semiconductor layer on outer ones of the upper sidewall surfaces of outermost ones of the second shapes of the fifth semiconductor layer may be less than a thickness of the sixth semiconductor layer on inner ones of the upper sidewall surfaces of the outermost ones of the second shapes of the fifth semiconductor layer and less than thicknesses of the sixth semiconductor layer on upper sidewall surfaces of inner ones of the second shapes of the fifth semiconductor layer.

In some embodiments, in a cross-section taken along the second direction, a thickness of the third semiconductor layer on upper sidewall surfaces of the second semiconductor layer may be less than a thickness of the sixth semiconductor layer on inner ones of the upper sidewall surfaces of outermost ones of the second shapes of the fifth semiconductor layer and less than thicknesses of the sixth semiconductor layer on upper sidewall surfaces of inner ones of the second shapes of the fifth semiconductor layer.

In some embodiments, a cross-section of the second semiconductor layer taken along the second direction may have a first shape including upper sidewall surfaces defining an angle with respect to the surface of the substrate and facing away from the substrate and lower sidewall surfaces defining an angle with respect to the surface of the substrate and facing towards the surface of the substrate. The third semiconductor layer may be formed on the upper sidewall surfaces of the second semiconductor layer. A cross-section of the fifth semiconductor layer taken along the second direction may have a shape including a plurality of second shapes that are connected to each other in the second direction. The second shapes may be on respective ones of the second active fins and may include upper sidewall surfaces defining an angle with respect to the surface of the substrate and facing away from the substrate and lower sidewall surfaces defining an angle with respect to the surface of the substrate and facing towards the surface of the substrate. The sixth semiconductor layer may be formed on the upper sidewall surfaces of the fifth semiconductor layer.

In some embodiments, a top surface of the sixth semiconductor layer may be farther from the surface of the substrate than a top surface of the fifth semiconductor layer is to the surface of the substrate.

In some embodiments, a cross-section of the sixth semiconductor layer taken along the second direction may include a central top surface that is substantially flat and substantially parallel to the surface of the substrate along the second direction.

In some embodiments, in a cross-section taken along the second direction, a thickness of the sixth semiconductor layer on outer ones of the upper sidewall surfaces of outermost ones of the second shapes of the fifth semiconductor layer may be less than a thickness of the sixth semiconductor layer on inner ones of the upper sidewall surfaces of the outermost ones of the second shapes of the fifth semiconductor layer and less than thicknesses of the sixth semiconductor layer on upper sidewall surfaces of inner ones of the second shapes of the fifth semiconductor layer.

In some embodiments, in a cross-section taken along the second direction, a thickness of the third semiconductor layer on upper sidewall surfaces of the second semiconductor layer may be less than a thickness of the sixth semiconductor layer on inner ones of the upper sidewall surfaces of outermost ones of the second shapes of the fifth semiconductor layer and less than thicknesses of the sixth semiconductor layer on upper sidewall surfaces of inner ones of the second shapes of the fifth semiconductor layer.

In some embodiments, the first source/drain layer structure may include a first silicon layer at least partially covering the second and third semiconductor layers, and the second source/drain layer structure may include a second silicon layer at least partially covering the fifth and sixth semiconductor layers.

In some embodiments, the semiconductor device further include a first contact plug on the first source/drain layer structure, and a second contact plug on the second source/drain layer structure.

In some embodiments, a first length of the first contact plug in a vertical direction that is substantially perpendicular to the surface of the substrate may be greater than a second length of the second contact plug in the vertical direction.

In some embodiments, a top surface of the first contact plug may be substantially coplanar with a top surface of the second contact plug, and a bottom of the first contact plug may be closer to the surface of the substrate than a bottom of the second contact plug is to the surface of the substrate.

In some embodiments, bottoms of the first and second contact plugs may be substantially flat and substantially parallel to the surface of the substrate.

In some embodiments, the bottom of the first contact plug may have a central portion that is farther from the surface of the substrate than edge portions thereof are to the surface of the substrate, and the bottom of the second contact plug may have a flat central portion that is farther from the surface of the substrate than edge portions thereof are to the surface of the substrate.

In some embodiments, the semiconductor device may further include a first metal silicide pattern between the first source/drain layer structure and the first contact plug, and a second metal silicide pattern between the second source/drain layer structure and the second contact plug.

In some embodiments, the first active fin may include a plurality of first active fins, and the first source/drain layer structure may include a plurality of structures that are spaced apart from each other with ones of the plurality of structures on respective ones of the plurality of first active fins.

In some embodiments, the first region may be a static random access memory (SRAM) region including an SRAM device, and the second region may be a logic region including a logic device.

According to some embodiments of the inventive concepts, semiconductor devices are provided. A semiconductor device may include a first active fin, a plurality of second active fins, first and second gate structures, a second source/drain layer structure, a first contact plug, and a second contact plug. The first active fin may be on a first region of a surface of a substrate, and the surface of the substrate may include the first region and a second region. The second active fins may be formed on the second region of the substrate. The first and second gate structures may be formed on the first and second active fins, respectively. The first source/drain layer structure may be formed on the first active fin adjacent the first gate structure. The second source/drain layer structure may commonly contact upper surfaces of the second active fins adjacent the second gate structure and a top surface of the second source/drain layer structure may be substantially coplanar with a top surface of the first source/drain layer structure. The first contact plug may be formed on the first source/drain layer structure. The second contact plug may be formed on the second source/drain layer structure, and a bottom of the second contact plug may be substantially flat and substantially parallel to the surface of the substrate.

In some embodiments, the first source/drain layer structure may include a first semiconductor layer on the first active fin, a second semiconductor layer on the first semiconductor layer, and a third semiconductor layer on the second semiconductor layer. The second source/drain layer structure may include fourth semiconductor layers on the respective second active fins that are spaced apart from each other, a continuous fifth semiconductor layer commonly on the fourth semiconductor layers, and a continuous sixth semiconductor layer on the fifth semiconductor layer.

In some embodiments, the first and fourth semiconductor layers may include silicon-germanium with a first germanium concentration, the second and fifth semiconductor layers may include silicon-germanium with a second germanium concentration greater than the first germanium concentration, and the third and sixth semiconductor layers may include silicon-germanium with a third germanium concentration greater than the second germanium concentration.

In some embodiments, the first and second active fins may include respective longest dimensions that extend in a first direction substantially parallel to the surface of the substrate, and the first and second gate structures may include respective longest dimensions that extend in a second direction that is substantially parallel to the surface of the substrate and crosses the first direction.

In some embodiments, a cross-section of the second semiconductor layer taken along the second direction may have a first shape that includes upper sidewall surfaces defining an angle with respect to the surface of the substrate and facing away from the substrate, lower sidewall surfaces defining an angle with respect to the surface of the substrate and facing towards the surface of the substrate, and a top surface that is parallel to the surface of the substrate. The third semiconductor layer may be formed on upper sidewall surfaces of the second semiconductor layer. A cross-section of the fifth semiconductor layer taken along the second direction may have a shape including a plurality of second shapes that are connected to each other in the second direction. The second shapes may be on respective ones of the second active fins and may include upper sidewall surfaces defining an angle with respect to the surface of the substrate and facing away from the substrate and lower sidewall surfaces defining an angle with respect to the surface of the substrate and facing towards the surface of the substrate. The sixth semiconductor layer may be formed on the upper sidewall surfaces of the fifth semiconductor layer.

In some embodiments, a top surface of the sixth semiconductor layer may be substantially coplanar with a top surface of the fifth semiconductor layer.

In some embodiments, a cross-section of the sixth semiconductor layer taken along the second direction may include a top surface that is substantially flat and substantially parallel to the surface of the substrate along the second direction.

In some embodiments, in a cross-section taken along the second direction, a thickness of the sixth semiconductor layer on outer ones of the upper sidewall surfaces of outermost ones of the second shapes of the fifth semiconductor layer may be less than a thickness of the sixth semiconductor layer on inner ones of the upper sidewall surfaces of the outermost ones of the second shapes of the fifth semiconductor layer and less than thicknesses of the sixth semiconductor layer on upper sidewall surfaces of inner ones of the second shapes of the fifth semiconductor layer.

In some embodiments, in a cross-section taken along the second direction, a thickness of the third semiconductor layer on upper sidewall surfaces of the second semiconductor layer may be less than a thickness of the sixth semiconductor layer on inner ones of the upper sidewall surfaces of outermost ones of the second shapes of the fifth semiconductor layer and less than thicknesses of the sixth semiconductor layer on upper sidewall surfaces of inner ones of the second shapes of the fifth semiconductor layer.

In some embodiments, the first source/drain layer structure may include a first silicon layer at least partially covering the second and third semiconductor layers, and the second source/drain layer structure may include a second silicon layer at least partially covering the fifth and sixth semiconductor layers.

In some embodiments, a first length of the first contact plug in a vertical direction that is substantially perpendicular to the surface of the substrate may be substantially equal to a second length of the second contact plug in the vertical direction.

In some embodiments, a bottom of the first contact plug may be substantially flat and substantially parallel to the surface of the substrate.

In some embodiments, the semiconductor device may further include a first metal silicide pattern between the first source/drain layer structure and the first contact plug, and a second metal silicide pattern between the second source/drain layer structure and the second contact plug.

According to some embodiments of the inventive concepts, semiconductor devices are provided. A semiconductor device may include a first active fin, a plurality of second active fins, a plurality of third active fins, first, second and third gate structures, a first epitaxial layer structure, a second epitaxial layer structure, a third epitaxial layer structure, a first contact plug, a second contact plug, and a third contact plug. The first active fin may be on a first region of a surface of a substrate, and the surface of the substrate may include the first region, a second region and a third region. The second active fins and the third active fins may be formed on the second and third regions, respectively, of the substrate. The first, second and third gate structures may be formed on the first, second and third active fins, respectively. The first epitaxial layer structure may be formed on the first active fin adjacent the first gate structure. The second epitaxial layer structure may commonly contact upper surfaces of the second active fins adjacent the second gate structure. The third epitaxial layer structure may commonly contact upper surfaces of the third active fins adjacent the third gate structure. The first contact plug may be formed on the first epitaxial layer structure. The second contact plug may be formed on the second epitaxial layer structure. The third contact plug may be formed on the third epitaxial layer structure. A bottom of at least one of the second and third contact plugs may be substantially flat and substantially parallel to the surface of the substrate.

In some embodiments, the second epitaxial layer structure may include silicon-germanium, and the third epitaxial layer structure may include silicon carbide.

In some embodiments, a bottom of the second contact plug and a bottom of the third contact plug may be substantially flat and substantially parallel to the surface of the substrate.

In some embodiments, a first length of the first contact plug in a vertical direction that is substantially perpendicular to the surface of the substrate may be greater than second and third lengths of the second and third contact plugs, respectively, in the vertical direction.

In some embodiments, top surfaces of the second and third epitaxial layer structures may be farther from the surface of the substrate than a top surface of the first epitaxial layer is to the surface of the substrate.

In some embodiments, the second epitaxial layer may include silicon-germanium, and the third epitaxial layer may include silicon.

In some embodiments, a bottom of the second contact plug may be substantially flat and substantially parallel to the surface of the substrate, and a bottom of the third contact plug may be bent.

In some embodiments, first and third lengths of the respective first and third contact plugs in a vertical direction that is substantially perpendicular to the surface of the substrate may be each greater than a second length of the second contact plug in the vertical direction.

In some embodiments, top surfaces of the first and third epitaxial layer structures may be each closer to the surface of the substrate than a top surface of the second epitaxial layer is to the surface of the substrate.

In some embodiments, the first region may be an SRAM region including an SRAM device, and the second and third regions may be logic regions including logic devices.

According to some embodiments of the inventive concepts, methods of manufacturing semiconductor devices are provided. In a method, an isolation pattern may be formed on a surface of a substrate. The isolation pattern may cover lower portions of a first active fin and a plurality of second active fins. The substrate may include first and second regions, and the first and second active fins may be in the first and second active regions, respectively. First and second dummy gate structures may be formed on the first and second active fins, respectively. First and second source/drain layer structures may be formed by a selective epitaxial growth (SEG) process on portions of the first and second active fins that are adjacent the first and second gate structures, respectively. The second source/drain layer structure may commonly contact upper surfaces of the second active fins, and a top surface of the second source/drain layer structure may be farther from the surface of the substrate than a top surface of the first source/drain layer structure is to the surface of the substrate. The first and second dummy gate structures may be replaced with first and second gate structures, respectively.

In some embodiments, forming the first and second source/drain layer structures may include forming first and second recesses by etching upper portions of the first and second active fins that are adjacent the first and second dummy gate structures, respectively. Forming the first and second source/drain layer structures may include forming the first and second source/drain layer structures to fill the first and second recesses, respectively.

In some embodiments, the SEG process may include using a silicon source gas, a germanium source gas and hydrogen chloride (HCl) gas.

In some embodiments, the silicon source gas may include silane ($SiH_4$) gas and/or disilane ($Si_2H_6$) gas.

In some embodiments, the SEG process that forms the first and second source/drain layer structures may include a first SEG process including providing the silicon source gas and the germanium source gas with respective first and second flow rates to form first and fourth semiconductor layers in the respective first and second recesses. The SEG process that forms the first and second source/drain layer structures may include a second SEG process including providing the silicon source gas and the germanium source gas with respective third and fourth flow rates to form second and fifth semiconductor layers on the respective first and fourth semiconductor layers. The SEG process that forms the first and second source/drain layer structures may include a third SEG process including providing the silicon source gas and the germanium source gas with respective fifth and sixth flow rates to form third and sixth semiconductor layers in the respective second and fifth semiconductor layers.

In some embodiments, a ratio of the fourth flow rate to the third flow rate in the second SEG process may be greater than a ratio of the second flow rate to the first flow rate in the first SEG process, and a ratio of the sixth flow rate to the fifth flow rate in the third SEG process may be greater than the ratio of the fourth flow rate to the third flow rate in the second SEG process.

In some embodiments, the first to third SEG processes may further include providing p-type impurity source gases with seventh to ninth flow rates in the respective first to third SEG processes.

In some embodiments, the eighth flow rate may be greater than the seventh flow rate, and the ninth flow rate may be greater than the eighth flow rate.

In some embodiments, the second SEG process may form the second and fifth semiconductor layers having a {111} crystal plane. The third SEG process may form the third and sixth semiconductor layers on upper sidewall surfaces of the respective second and fifth semiconductor layers facing away from the substrate, and not on lower sidewall surfaces of the respective second and fifth semiconductor layers facing towards the substrate.

In some embodiments, a cross-section of the second semiconductor layer taken along a direction that is substantially parallel to the surface of the substrate and parallel to the first and second gate structures may have a first shape that includes upper sidewall surfaces defining an angle with respect to the surface of the substrate and facing away from the substrate and lower sidewall surfaces defining an angle with respect to the surface of the substrate and facing towards the surface of the substrate. The third semiconductor layer may be formed on the upper sidewall surfaces of the second semiconductor layer. A cross-section of the fifth semiconductor layer taken along the direction may have a shape including a plurality of second shapes that are connected to each other in the direction. The second shapes may be on respective ones of the second active fins and may include upper sidewall surfaces defining an angle with respect to the surface of the substrate and facing away from the substrate, lower sidewall surfaces defining an angle with respect to the surface of the substrate and facing towards the surface of the substrate, and a top surface that is parallel to the surface of the substrate. The sixth semiconductor layer may be formed on the upper sidewall surfaces of the fifth semiconductor layer.

In some embodiments, a top surface of the sixth semiconductor layer may be substantially flat and substantially parallel to the surface of the substrate.

In some embodiments, a thickness of the sixth semiconductor layer on outer ones of the upper sidewall surfaces of outermost ones of the second shapes of the fifth semiconductor layer may be less than a thickness of the sixth semiconductor layer on inner ones of the upper sidewall surfaces of the outermost ones of the second shapes of the fifth semiconductor layer and less than thicknesses of the sixth semiconductor layer on upper sidewall surfaces of inner ones of the second shapes of the fifth semiconductor layer.

In some embodiments, a thickness of the third semiconductor layer on upper sidewall surfaces of the second semiconductor layer may be less than a thickness of the sixth semiconductor layer on inner ones of the upper sidewall surfaces of outermost ones of the second shapes of the fifth semiconductor layer and less than thicknesses of the sixth semiconductor layer on upper sidewall surfaces of inner ones of the second shapes of the fifth semiconductor layer.

In some embodiments, after the third SEG process, a fourth SEG process may include providing dichlorosilane ($SiH_2Cl_2$) gas to form first and second silicon layers on the third and sixth semiconductor layers, respectively.

In some embodiments, the SEG process may include using a silicon source gas, a carbon source gas and hydrogen chloride (HCl) gas.

In some embodiments, the silicon source gas may include silane ($SiH_4$) gas and/or di silane ($Si_2H_6$) gas.

In some embodiments, the SEG process that forms the first and second source/drain layer structures may include a first SEG process including providing the silicon source gas and the carbon source gas with respective first and second flow rates to form first and fourth semiconductor layers in the respective first and second recesses. The SEG process that forms the first and second source/drain layer structures may include a second SEG process including providing the silicon source gas and the carbon source gas with respective third and fourth flow rates to form second and fifth semiconductor layers on the respective first and fourth semiconductor layers. The SEG process that forms the first and second source/drain layer structures may include a third SEG process including providing the silicon source gas and the carbon source gas with respective fifth and sixth flow rates to form third and sixth semiconductor layers in the respective second and fifth semiconductor layers.

In some embodiments, the first to third SEG processes may further include providing n-type impurity source gases with seventh to ninth flow rates in the respective first to third SEG processes.

In some embodiments, the second SEG process may form the second and fifth semiconductor layers having a {111} crystal plane. The third SEG process may form the third and sixth semiconductor layers on upper sidewall surfaces of the respective second and fifth semiconductor layers facing away from the substrate, and not on lower sidewall surfaces of the respective second and fifth semiconductor layers facing towards the substrate.

In some embodiments, after the first and second source/drain layer structures are formed, an insulating interlayer covering the first and second source/drain layer structures and sidewalls of the first and second dummy gate structures may be formed. After the first and second dummy gate structures are replaced with the first and second gate structures, the insulating interlayer may be partially etched to form first and second contact holes that expose upper surfaces of the first and second source/drain layer structures. First and second contact plugs may be formed in the first and second contact holes, respectively.

In some embodiments, the first contact hole may be deeper than the second contact hole.

In some embodiments, bottoms of the first and second contact holes may be flat.

In some embodiments, bottoms of the first and second contact holes may be bent.

In some embodiments, after the first and second contact holes are formed, first and second metal silicide patterns may be formed on the first and second source/drain layer structures exposed by the first and second contact holes, respectively.

According to some embodiments of the inventive concepts, methods of manufacturing semiconductor devices are provided. In a method, an isolation pattern may be formed on a surface of a substrate. The isolation pattern may cover lower portions of a first active fin and a plurality of second active fins. The substrate may include first and second regions, and the first and second active fins may be in the first and second active regions, respectively. First and second dummy gate structures may be formed on the first and second active fins, respectively. First and second source/drain layer structures may be formed by an SEG process on portions of the first and second active fins that are adjacent the first and second gate structures, respectively. The second source/drain layer structure may commonly contact upper surfaces of the second active fins, and a top surface of the second source/drain layer structure may be substantially coplanar with a top surface of the first source/drain layer structure. The first and second dummy gate structures may be replaced with first and second gate structures, respectively. A first contact plug may be formed on the first source/drain layer structure. A second contact plug may be formed on the second source/drain layer structure, and a bottom of the second contact plug may be substantially flat and substantially parallel to the surface of the substrate.

In some embodiments, forming the first and second source/drain layer structures may include forming first and second recesses by etching upper portions of the first and second active fins that are adjacent the first and second dummy gate structures, respectively. The SEG process may include using a silicon source gas, a germanium source gas and hydrogen chloride (HCl) gas to form the first and second source/drain layer structures filling the first and second recesses, respectively. The silicon source gas may include silane ($SiH_4$) gas and/or disilane ($Si_2H_6$) gas.

In some embodiments, the SEG process that forms the first and second source/drain layer structures may include a first SEG process including providing the silicon source gas and the germanium source gas with respective first and second flow rates to form first and fourth semiconductor layers in the respective first and second recesses. The SEG process that forms the first and second source/drain layer structures may include a second SEG process including providing the silicon source gas and the germanium source gas with respective third and fourth flow rates to form second and fifth semiconductor layers on the respective first and fourth semiconductor layers. The SEG process that forms the first and second source/drain layer structures may include a third SEG process including providing the silicon source gas and the germanium source gas with respective fifth and sixth flow rates to form third and sixth semiconductor layers in the respective second and fifth semiconductor layers.

In some embodiments, the second SEG process may form the second and fifth semiconductor layers having a {111} crystal plane. The third SEG process may form the third and sixth semiconductor layers on upper sidewall surfaces of the respective second and fifth semiconductor layers facing away from the substrate and not on lower sidewall surfaces of the respective second and fifth semiconductor layers facing towards the substrate in the third SEG process.

In some embodiments, a cross-section of the second semiconductor layer taken along a direction that is substantially parallel to the surface of the substrate and parallel to the first and second gate structures may have a first shape comprising upper sidewall surfaces defining an angle with respect to the surface of the substrate and facing away from the substrate and lower sidewall surfaces defining an angle with respect to the surface of the substrate and facing towards the surface of the substrate. The third semiconductor layer may be formed on the upper sidewall surfaces of the second semiconductor layer. A cross-section of the fifth semiconductor layer taken along the direction may have a shape including a plurality of second shapes that are connected to each other in the direction. The second shapes may be on respective ones of the second active fins and may include upper sidewall surfaces defining an angle with respect to the surface of the substrate and facing away from the substrate, lower sidewall surfaces defining an angle with respect to the surface of the substrate and facing towards the surface of the substrate, and a top surface that is parallel to the surface of the substrate. The sixth semiconductor layer may be formed on upper sidewall surfaces of the fifth semiconductor layer.

In some embodiments, a top surface of the sixth semiconductor layer may be substantially flat and substantially parallel to the surface of the substrate.

According to some embodiments of the inventive concepts, methods of manufacturing semiconductor devices are provided. In a method, an isolation pattern may be formed on a surface of a substrate. The isolation pattern may cover lower portions of a first active fin, a plurality of second active fins, and a plurality of third active fins. The substrate may include first, second and third regions, and the first to third active fins may be in the first to third active regions, respectively. First, second and third dummy gate structures may be formed on the first to third active fins, respectively. First, second and third source/drain layer structures may be formed in an SEG process on portions of the first to third active fins that are adjacent the first to third gate structures, respectively. The second source/drain layer structure may commonly contact upper surfaces of the second active fins, and the third source/drain layer structure may commonly contact upper surfaces of the third active fins. The first to third dummy gate structures may be replaced with first, second and third gate structures, respectively. First, second and third contact plugs may be formed on the first to third source/drain layer structures, respectively. A bottom of at least one of the second and third contact plugs may be substantially flat and substantially parallel to the surface of the substrate.

In some embodiments, the first source/drain layer structures on neighboring ones of the first active fins may not be electrically connected to each other, while the second source/drain layer commonly contacting neighboring ones of the second active fins may have a desired volume. Thus, the electrical failure between the first transistors may be prevented in the first region, while a proper stress may be applied to the channel of the second transistor and the performance of the second transistor may be improved.

According to some embodiments of the inventive concepts, semiconductor devices are provided. A semiconductor device may include a substrate. The semiconductor device may include an active fin on the substrate that may extend with a longest dimension in a first direction that is parallel to a surface of the substrate. The semiconductor device may include a gate pattern on the active fin that may extend with a longest dimension in a second direction that is parallel to the surface of the substrate and that crosses the first direction. The semiconductor device may include a first semiconductor layer that may be on a bottom and sidewalls of a recessed portion of the active fin that is adjacent the gate pattern. The first semiconductor layer may include silicon germanium with a first germanium concentration. The semiconductor device may include a second semiconductor layer on the first semiconductor layer having a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate. The second semiconductor layer may include silicon germanium with a second germanium concentration that is greater than the first germanium concentration. The semiconductor device may include a third semiconductor layer that is on the upper sidewall surfaces of the second semiconductor layer and not on the lower sidewall surfaces of the second semiconductor layer. The third semiconductor layer may include silicon germanium with a third germanium concentration that is greater than the second germanium concentration.

In some embodiments, the first semiconductor layer may include p-type impurities with a first impurity concentration. The second semiconductor layer may include p-type impurities with a second impurity concentration that is greater than the first impurity concentration. The third semiconductor layer may include p-type impurities with a third impurity concentration that is greater than the second impurity concentration.

In some embodiments, the active fin and the gate pattern may be a first active fin and a first gate pattern, respectively, on a first region of the substrate. The semiconductor device may further include a plurality of second active fins on a second region of the substrate that extend parallel to each other with longest dimensions in the first direction. The semiconductor device may include a second gate pattern on the plurality of second active fins that extends with a longest dimension in the second direction. The semiconductor device may include a plurality of fourth semiconductor layers that are on bottoms and sidewalls of recessed portions of respective ones of the plurality of second active fins that are adjacent the second gate pattern. The fourth semiconductor layers may include silicon germanium with a fourth germanium concentration and being spaced apart from each other. The semiconductor device may include a fifth semiconductor layer on the plurality of fourth semiconductor layers. The fifth semiconductor layer may include a plurality of shapes. Ones of the plurality of shapes may be on respective ones of the plurality of fourth semiconductor layers and may have a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate. The fifth semiconductor layer may include silicon germanium with a fifth germanium concentration that is greater than the fourth germanium concentration. Adjacent ones of the shapes of the fifth semiconductor layer may contact each other. The semiconductor device may include a sixth semiconductor layer that is on the upper sidewall surfaces of the shapes of the fifth semiconductor layer and not on the lower sidewall surfaces of the shapes of the fifth semiconductor layer. The sixth semiconductor layer may include silicon germanium with a sixth germanium concentration that is greater than the fifth germanium concentration.

In some embodiments, the plurality of second active fins may include two outermost ones of the second active fins and at least one inner second active fin that is between the outermost ones of the second active fins. The plurality of shapes of the fifth semiconductor layer may include outermost shapes on the outermost ones of the second active fins and at least one inner shape that is on the at least one inner second active fin. The outermost shapes of the fifth semiconductor layer may include inner upper sidewall surfaces that are adjacent to the at least one inner shape and outer upper sidewall surfaces opposite from the at least one inner shape. A thickness of the third semiconductor layer on the upper sidewall surfaces of the second semiconductor layer may be less than a thickness of the sixth semiconductor layer on the inner upper sidewall surfaces of the outermost shapes of the fifth semiconductor layer and less than thicknesses of the sixth semiconductor layer on the upper sidewall surfaces of the inner shapes of the fifth semiconductor layer. A thickness of the sixth semiconductor layer on the outer upper sidewall surfaces of the outermost shapes of the fifth semiconductor layer may be less than a thickness of the sixth semiconductor layer on the inner upper sidewall surfaces of the outermost shapes of the fifth semiconductor layer and less than thicknesses of the sixth semiconductor layer on the upper sidewall surfaces of the inner shapes of the fifth semiconductor layer.

In some embodiments, the semiconductor device may further include a plurality of third active fins on a third region of the substrate that extend parallel to each other with longest dimensions in the first direction. The plurality of third active fins may include outermost ones of the third active fins and at least one inner third active fin that is between the outermost ones of the third active fins. The semiconductor device may include a third gate pattern on the plurality of third active fins that extends with a longest dimension in the second direction. The semiconductor device may include a plurality of seventh semiconductor layers that are on bottoms and sidewalls of recessed portions of respective ones of the plurality of third active fins that are adjacent the third gate pattern. The seventh semiconductor layers may include silicon carbide with a first carbon concentration and may be spaced apart from each other. The semiconductor device may include an eighth semiconductor layer on the plurality of seventh semiconductor layers. The eighth semiconductor layer may include a plurality of shapes. Ones of the plurality of shapes may be on respective ones of the plurality of seventh semiconductor layers and may have a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate. The eighth semiconductor layer may include silicon carbide with a second carbon concentration that is greater than the first carbon concentration. Adjacent ones of the shapes of the eighth semiconductor layer may contact each other. The semiconductor device may include a ninth semiconductor layer that is on the upper sidewall surfaces of the shapes of the eighth semiconductor layer and not on the lower sidewall surfaces of the shapes of the eighth semiconductor layer. The ninth semiconductor layer may include silicon carbide with a third carbon concentration that is greater than the second carbon concentration.

It is noted that aspects of the inventive concepts described with respect to one embodiment may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The above and other objects, features, and advantages of the present disclosure will become more apparent to those of ordinary skill in the art by describing in detail embodiments of the inventive concepts thereof with reference to the accompanying drawings, in which.

DETAILED DESCRIPTION OF EMBODIMENTS

Figure 1:
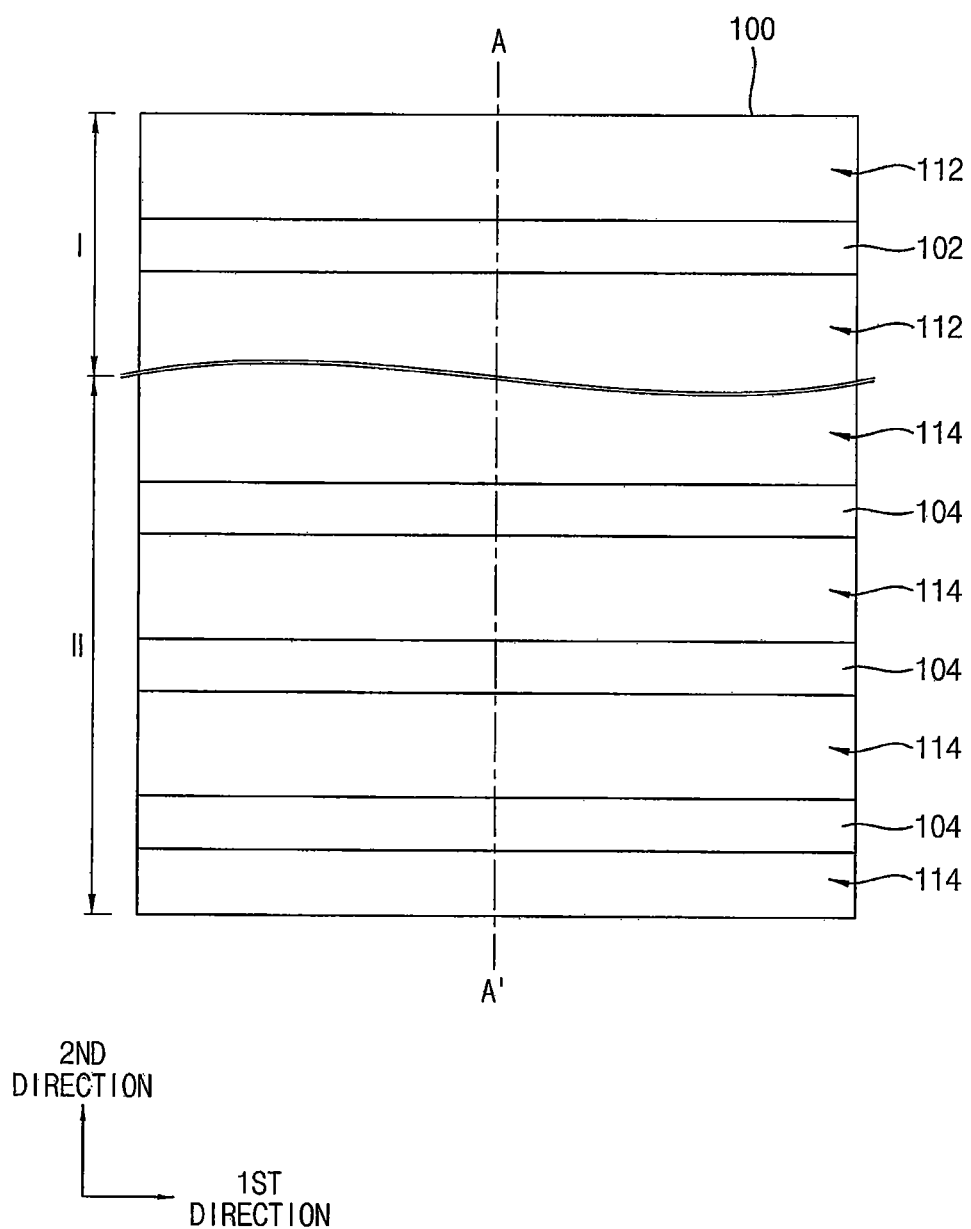
FIGS. 1 to 59 are plan views and cross-sectional views schematically illustrating intermediate process operations of methods of manufacturing semiconductor devices according to some embodiments of the inventive concepts.

The inventive concepts will be described more fully hereinafter with reference to the accompanying drawings, in which some embodiments are shown. The present inventive concepts may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms may be used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. As used herein, unless otherwise described, a surface or other element referred to as "top" or "upper" is a surface or element that is more remote from a substrate in a direction that is perpendicular to a major surface of the substrate as compared to other surfaces or elements. As used herein, unless otherwise described, a surface or other element referred to as "bottom" or "lower" is closer to a substrate in a direction that is perpendicular to a major surface of the substrate as compared to other surfaces or elements.

The terminology used herein is for the purpose of describing some embodiments of the inventive concepts and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, embodiments should not be construed as limited to the particular shapes of regions that are illustrated herein but are to include deviations in shapes that result, for example, from manufacturing. For example, an implanted region that is illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions that are illustrated in the figures are schematic in nature and their shapes are not intended to illustrate the actual shape of a region of a device and are not intended to limit the scope of the present inventive concepts.

Elements may be illustrated and/or described in singular and/or plural form. However, it will be understood that, unless otherwise described herein, embodiments may contain multiple instances of like elements. Descriptions in singular form may apply to one or more of a plurality of elements present in embodiments of the inventive concept.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 58:
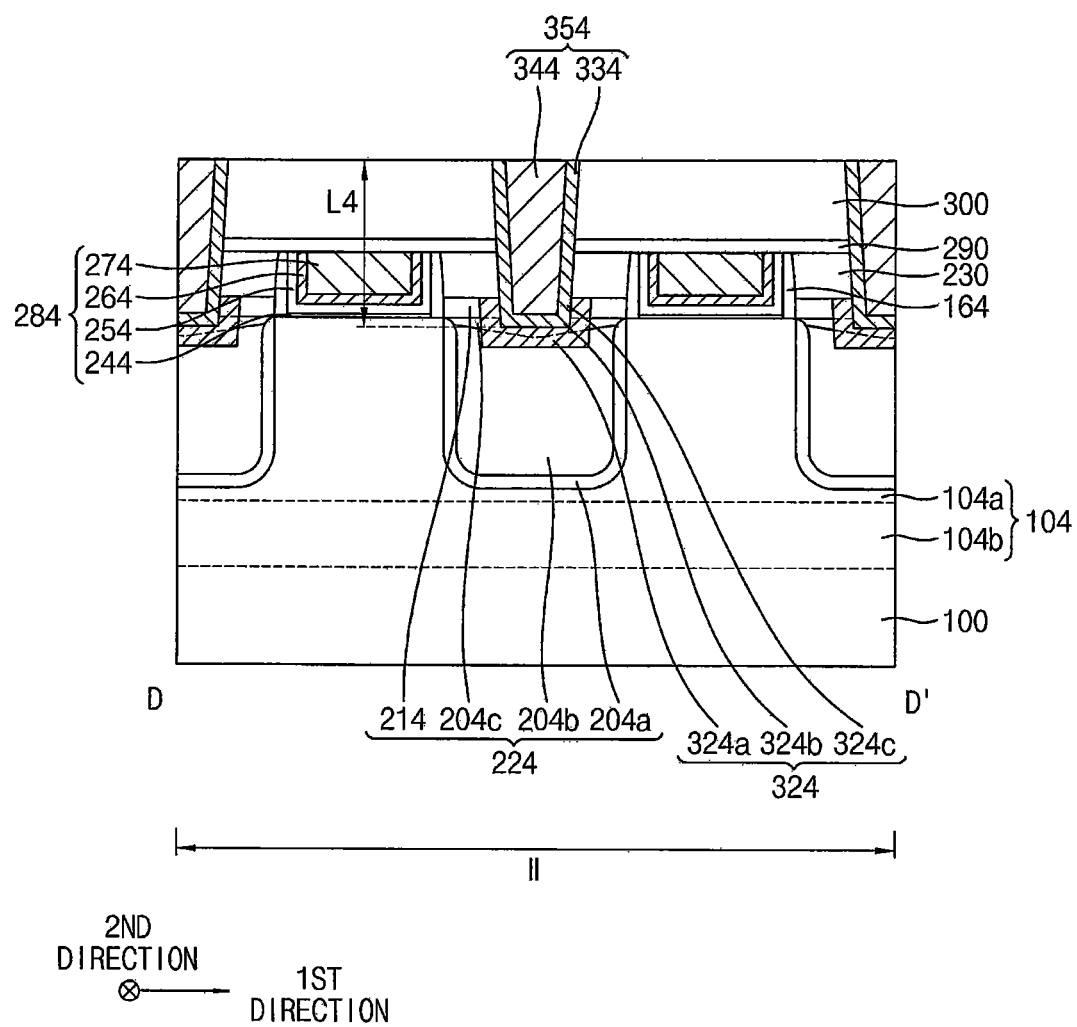
Figure 59:
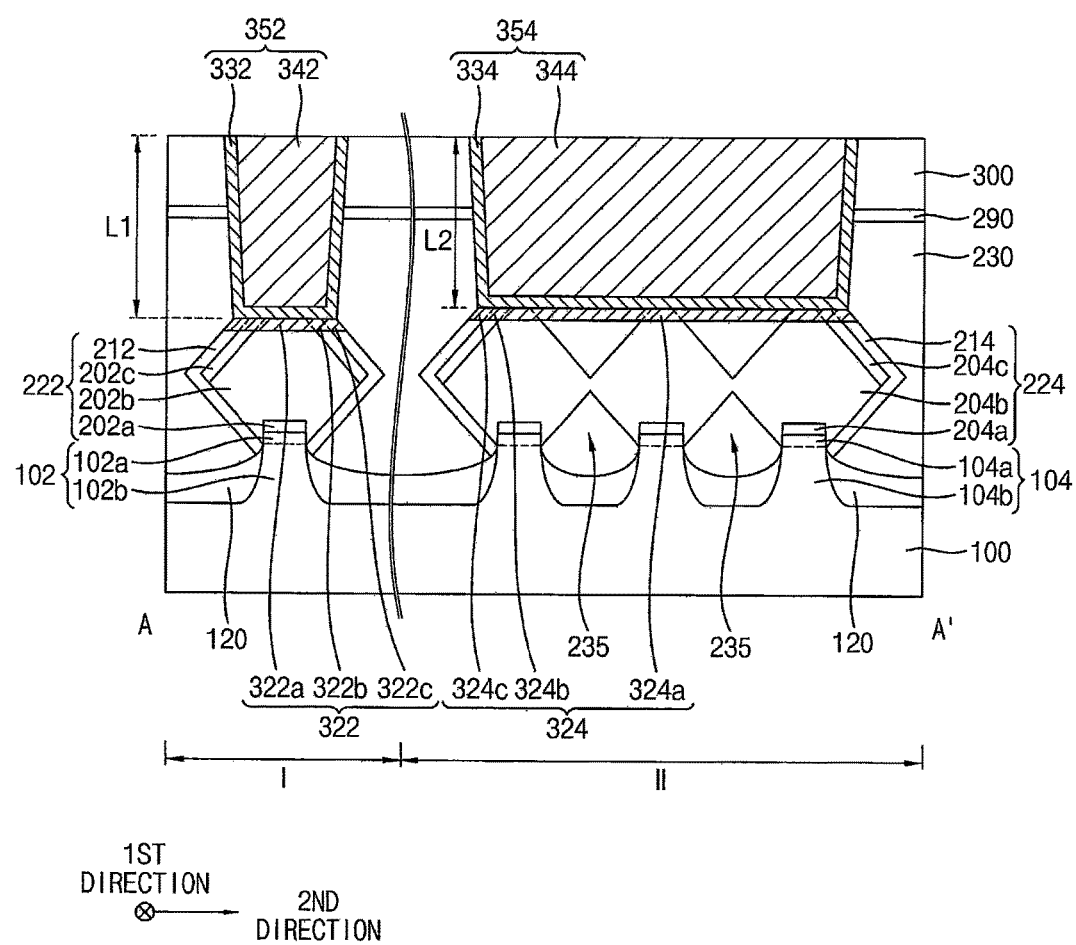

FIGS. 1 to 59 are plan views and cross-sectional views schematically illustrating intermediate operations of methods of manufacturing semiconductor devices according to some embodiments of the inventive concepts. Particularly, FIGS. 1, 4, 6, 9, 12, 17, 21, 28, 32, 36 and 43 are plan views, and FIGS. 2-3, 5, 7-8, 10-11, 13-16, 18-20, 22-27, 29-31, 33-35, 37-42 and 44-59 are cross-sectional views.

Figure 7:
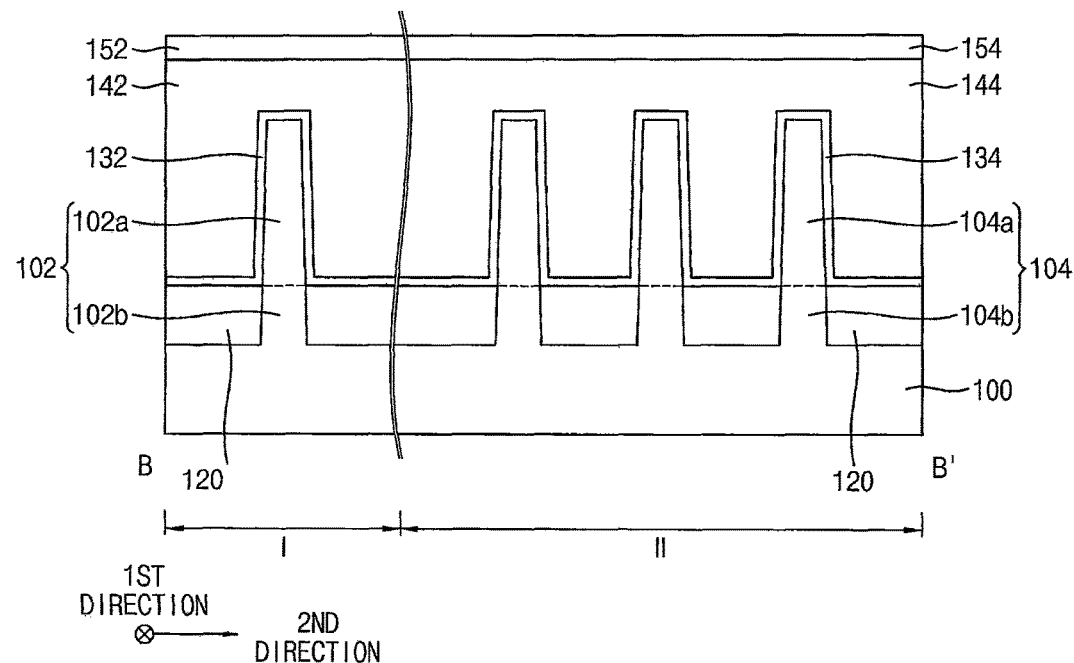
Figure 33:
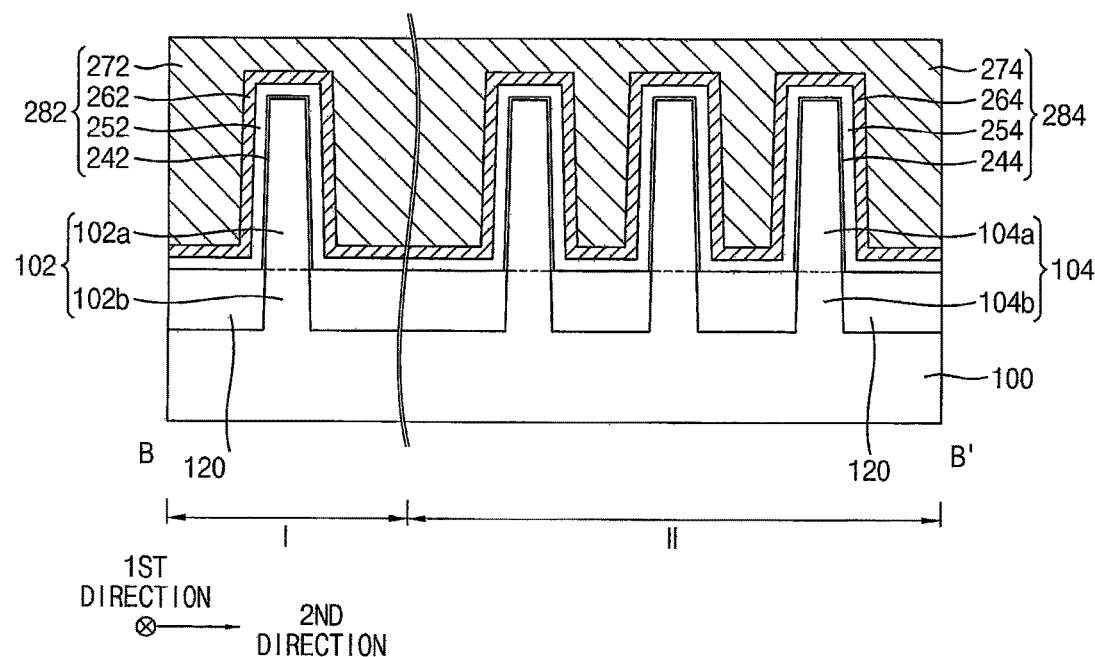
Figure 34:
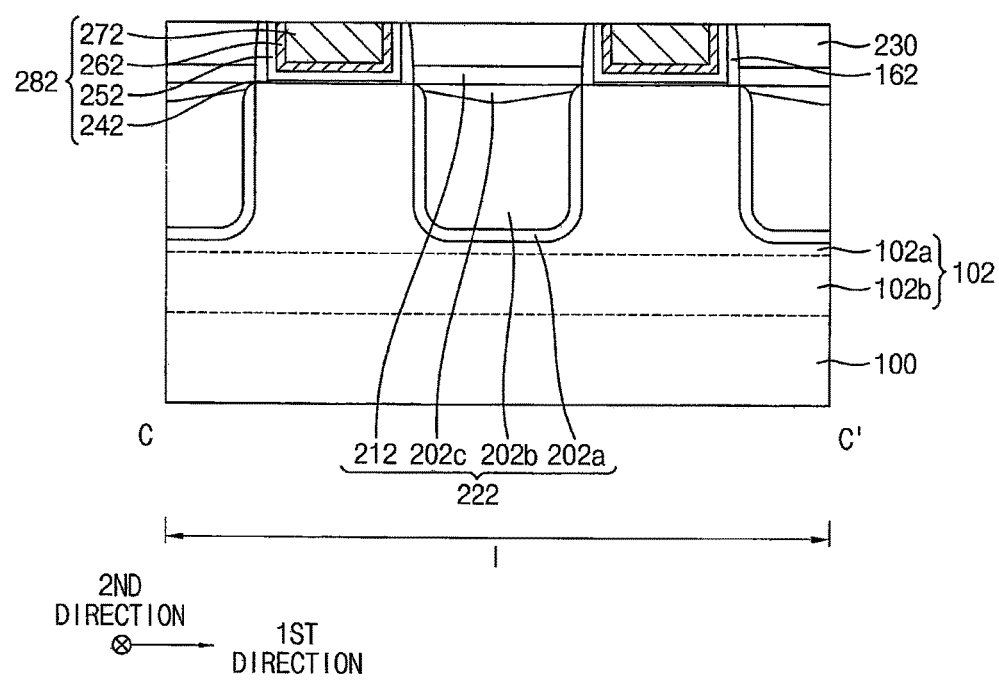
Figure 35:
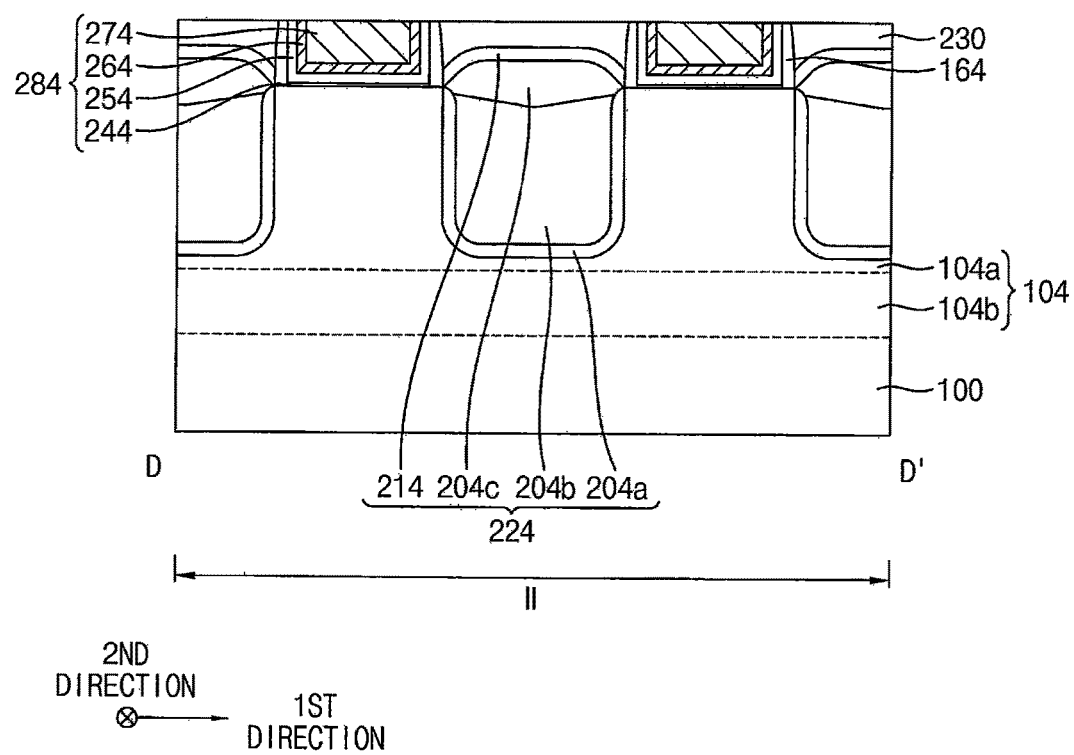
Figure 36:
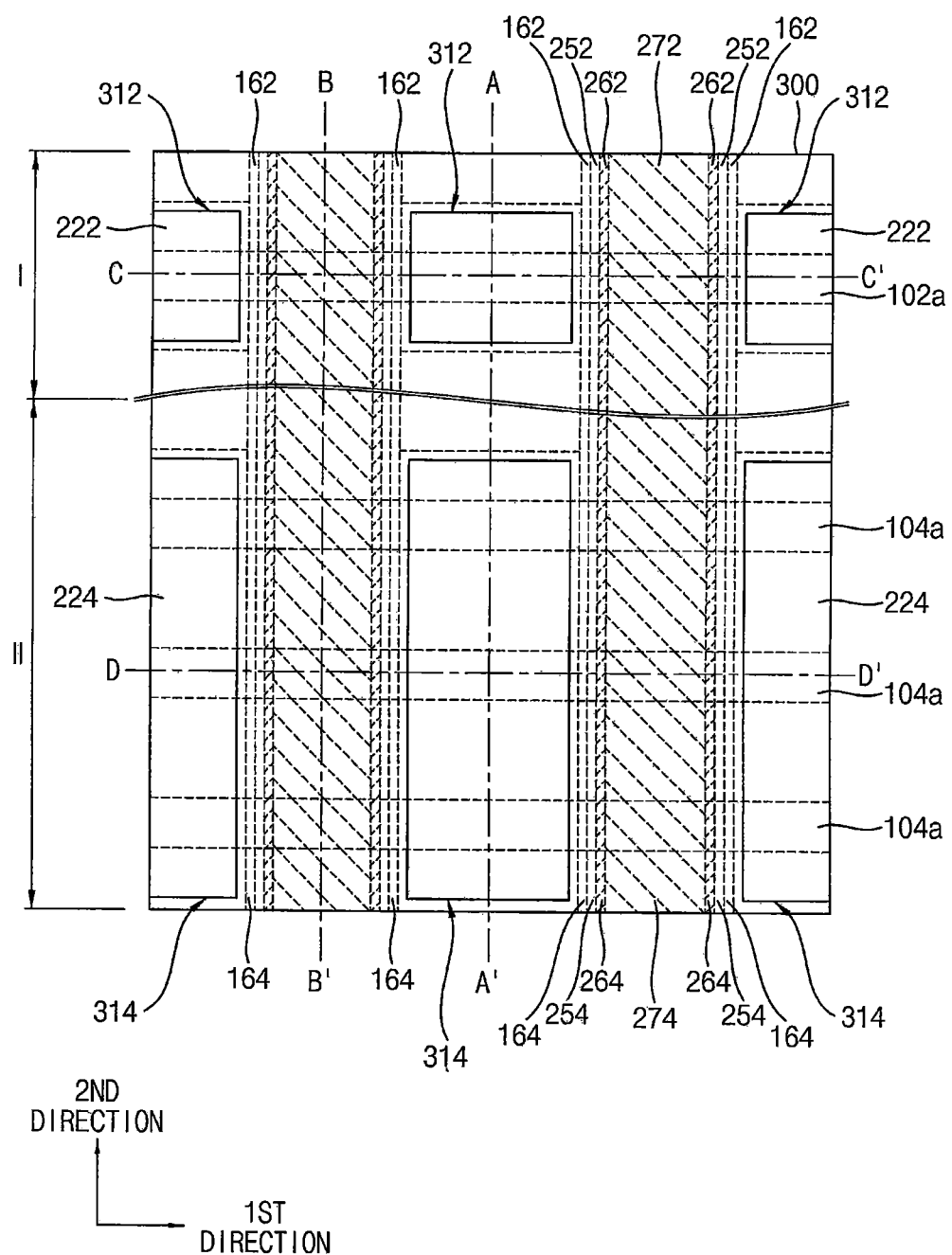
Figure 37:
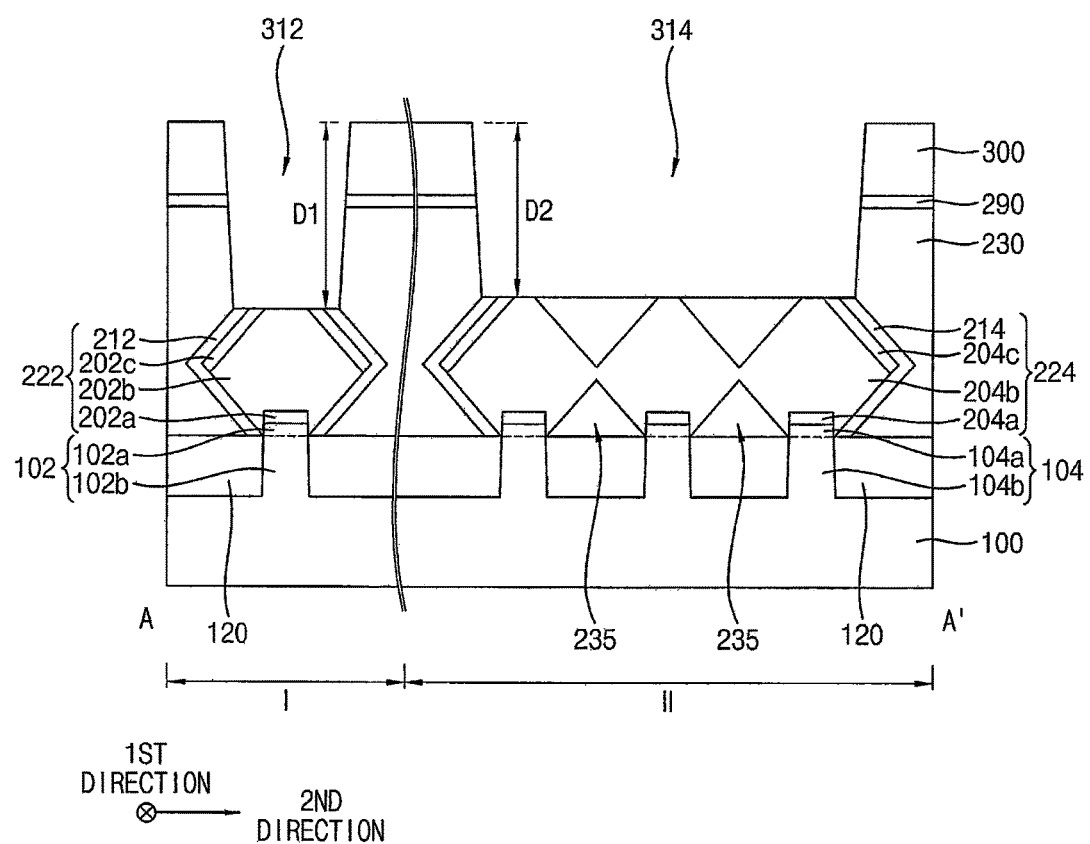
Figure 38:
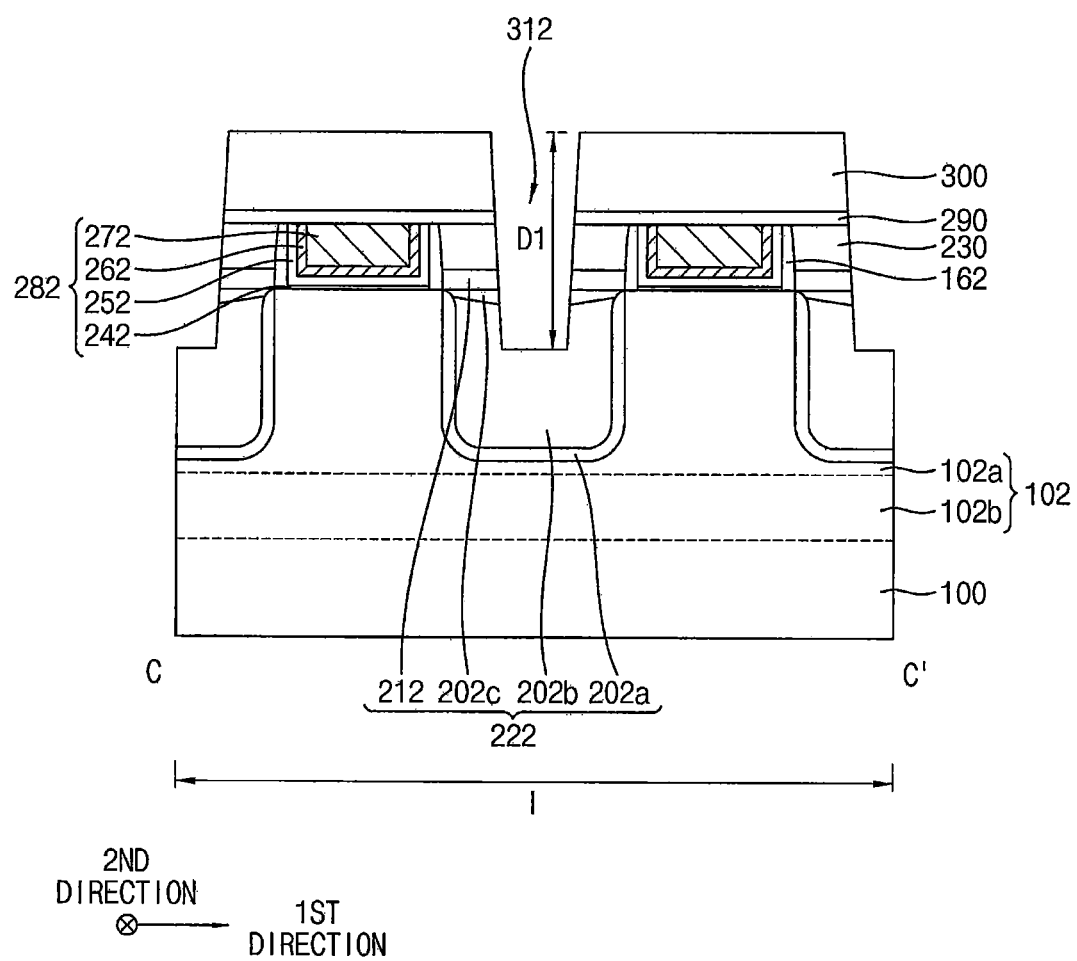
Figure 39:
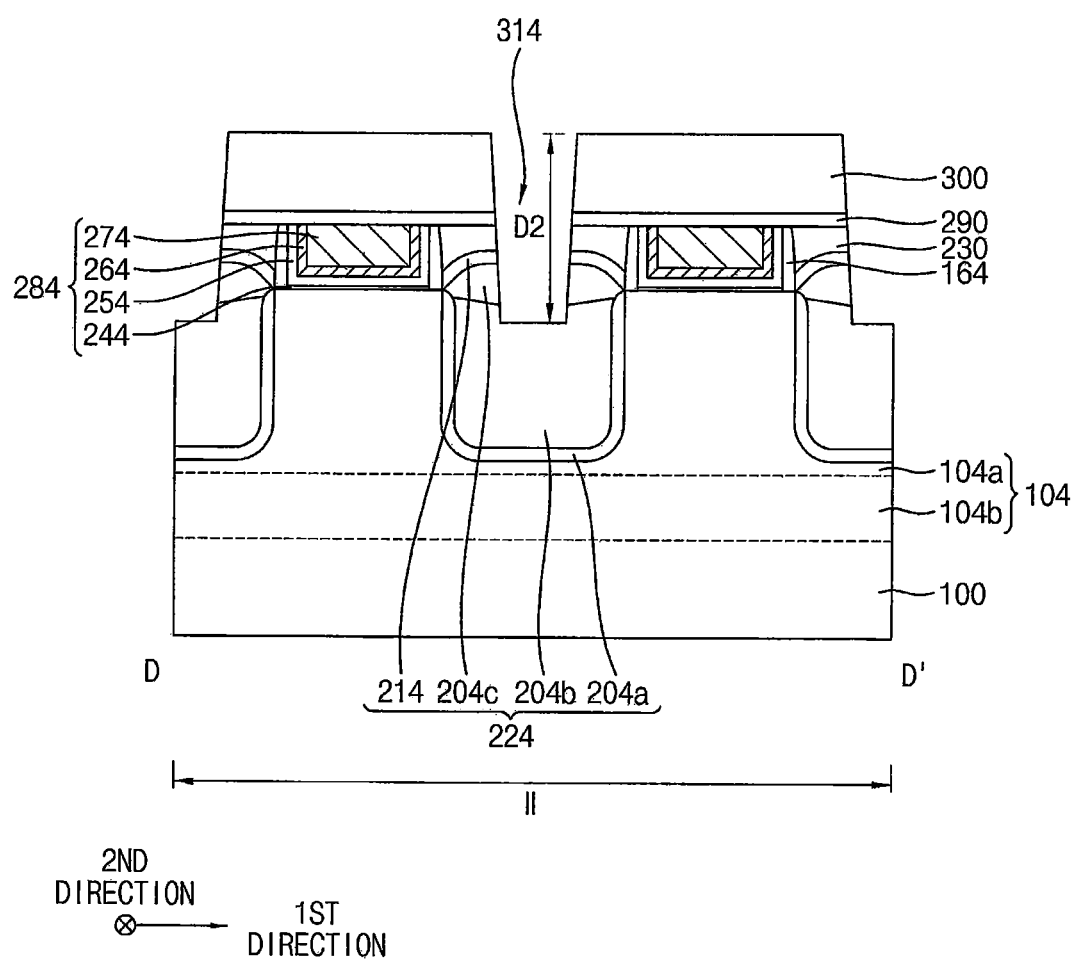
Figure 45:
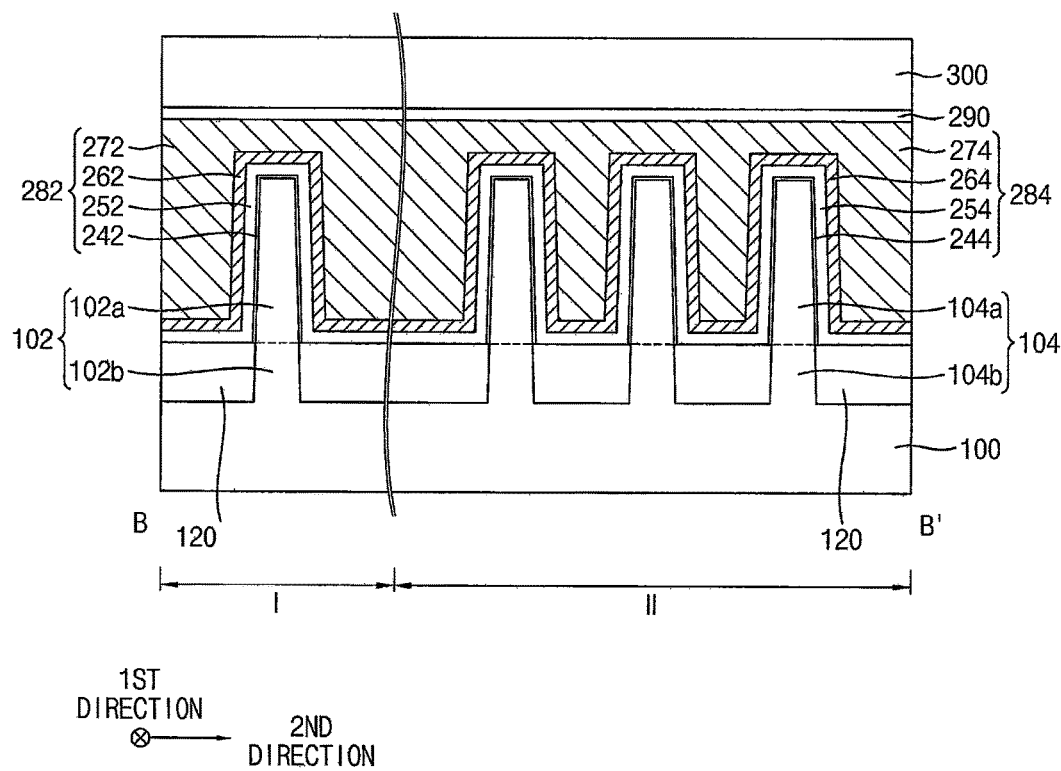
Figure 46:
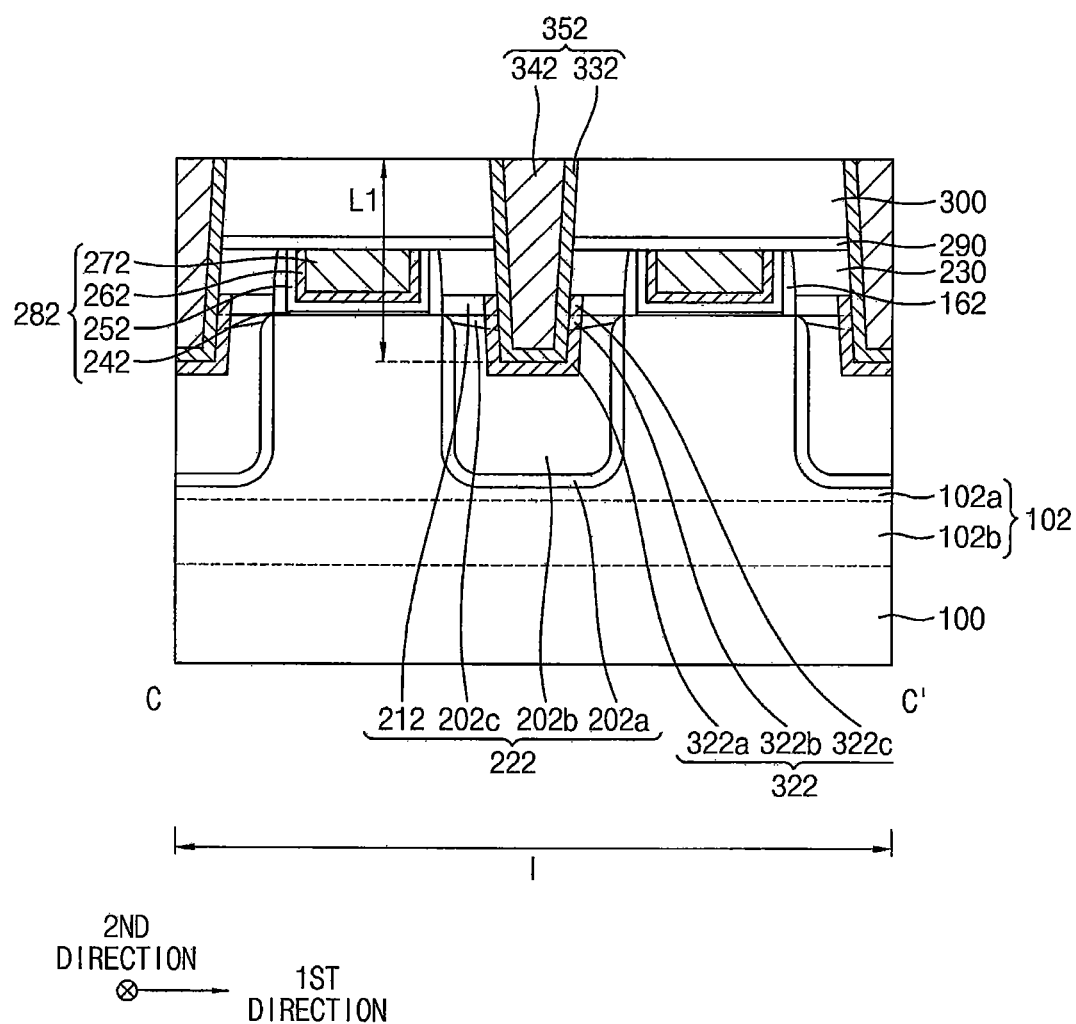
Figure 47:
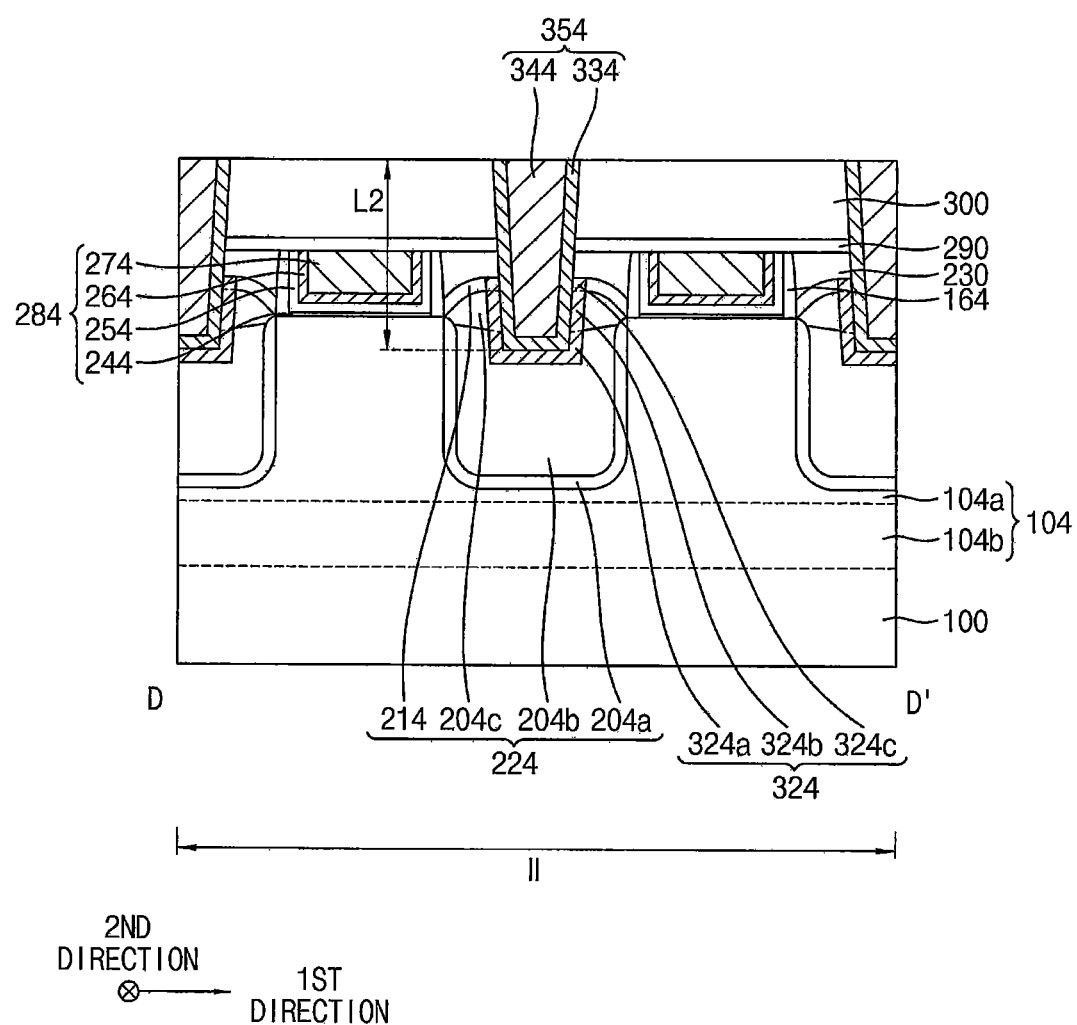

FIGS. 2-3, 5, 10, 13, 15-16, 18, 22, 25, 27, 29, 37, 40, 44, 48, 51, 54, 57 and 59 are cross-sectional views taken along lines A-A' of corresponding plan views, respectively. FIGS. 7, 33 and 45 are cross-sectional views taken along lines B-B' of corresponding plan views, respectively. FIGS. 8, 11, 14, 19, 23, 30, 34, 38, 41, 46, 49, 52 and 55 are cross-sectional views taken along lines C-C' of corresponding plan views, respectively. FIGS. 20, 24, 26, 31, 35, 39, 42, 47, 50, 53, 56 and 58 are cross-sectional views taken along lines D-D' of corresponding plan views, respectively.

Referring to FIGS. 1 and 2, an upper portion of a substrate 100 may be partially etched to form first and second recesses 112 and 114. The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

The substrate 100 may include first and second regions I and II. In some embodiments, the first region I may serve as a static random access memory (SRAM) region in which SRAM devices may be formed, and the second region II may serve as a logic region in which logic devices may be formed. Alternatively, both of the first and second regions I and II may serve as logic regions or peripheral circuit regions in which peripheral circuits for memory devices may be formed. A width of the first recess 112 in the first region I may be greater than a width of the second recess 114 in the second region II.

As the first and second recesses 112 and 114 are formed on the substrate 100, first and second active regions 102 and 104 may be defined in the first and second regions I and II, respectively, of the substrate 100. The first and second active regions 102 and 104 may protrude from an upper surface of the substrate 100, and thus may be also referred to as first and second active fins 102 and 104. A region of the substrate 100 in which the first and second active fins 102 and 104 are not formed may be referred to as a field region.

In some embodiments, the first and second active fins 102 and 104 may extend in a first direction that is substantially parallel to the upper surface of the substrate 100, and a plurality of first active fins 102 and a plurality of second active fins 104 may be formed in a second direction, which may be substantially parallel to the upper surface of the substrate 100 and may cross the first direction. For example, the first and second directions may cross each other at a right angle, and thus may be substantially perpendicular to each other. In other words the first and second active fins 102 and 104 may extend perpendicular to each other with a longest dimension of ones of the first and second active fins 102 and 104 in the first direction and separated from each other by distances between each other in the second direction. In some embodiments, a distance between the first active fins 102 in the second direction may be greater than a distance between the second active fins 104 in the second direction.

In some embodiments, ones of the first and second active fins 102 and 104 may have a constant width from a top toward a bottom thereof, or a sidewall of ones of the first and second active fins 102 and 104 may have a constant slope with respect to the upper surface of the substrate 100.

However, referring to FIG. 3, in some embodiments, ones of the first and second active fins 102 and 104 may have a width gradually increasing from a top toward a bottom thereof and a slope of the sidewall may gradually decrease. Hereinafter, for the convenience of explanation, only the first and second active fins 102 and 104 as shown in FIG. 2 will be described.

Figure 4:
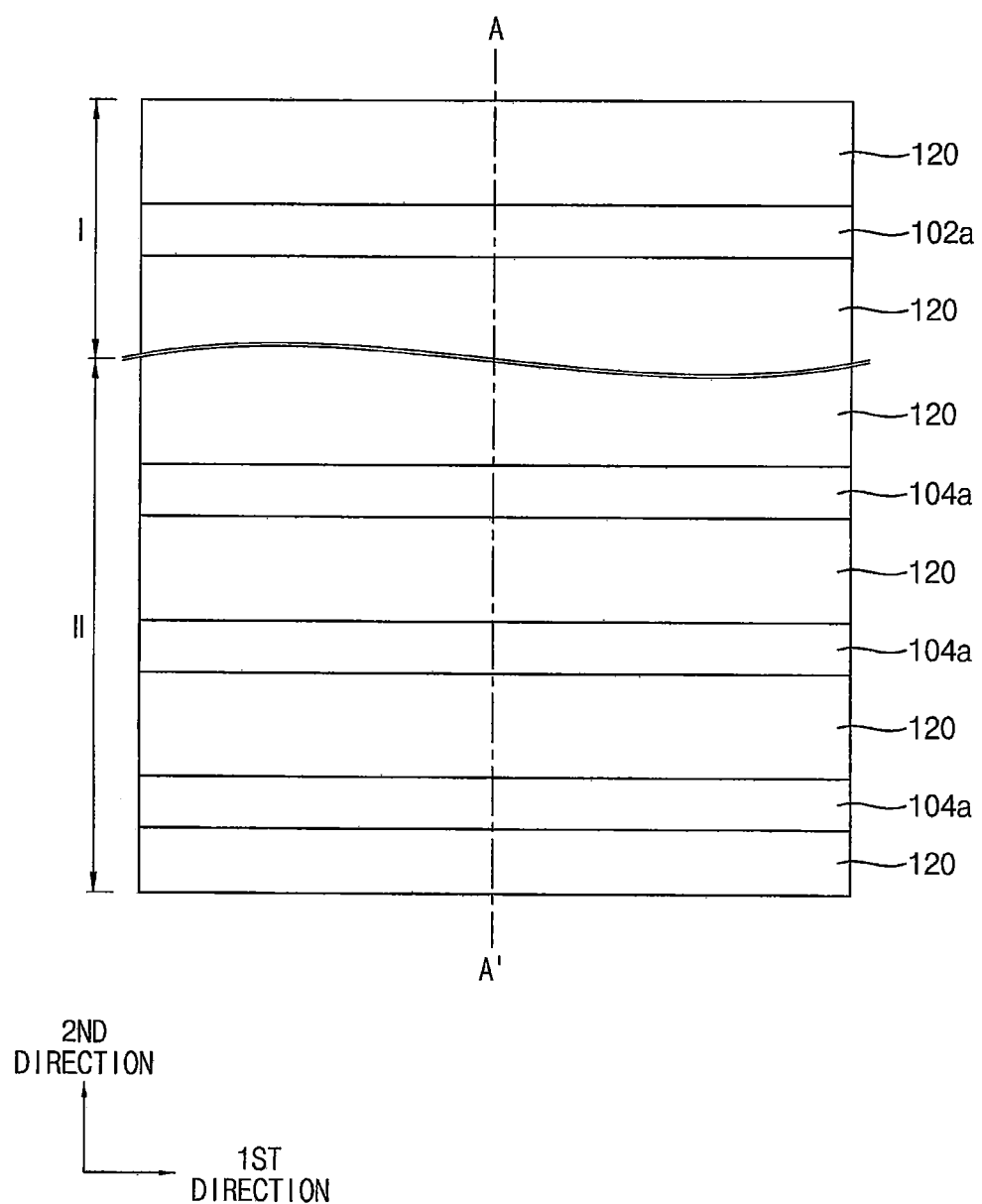
Figure 5:
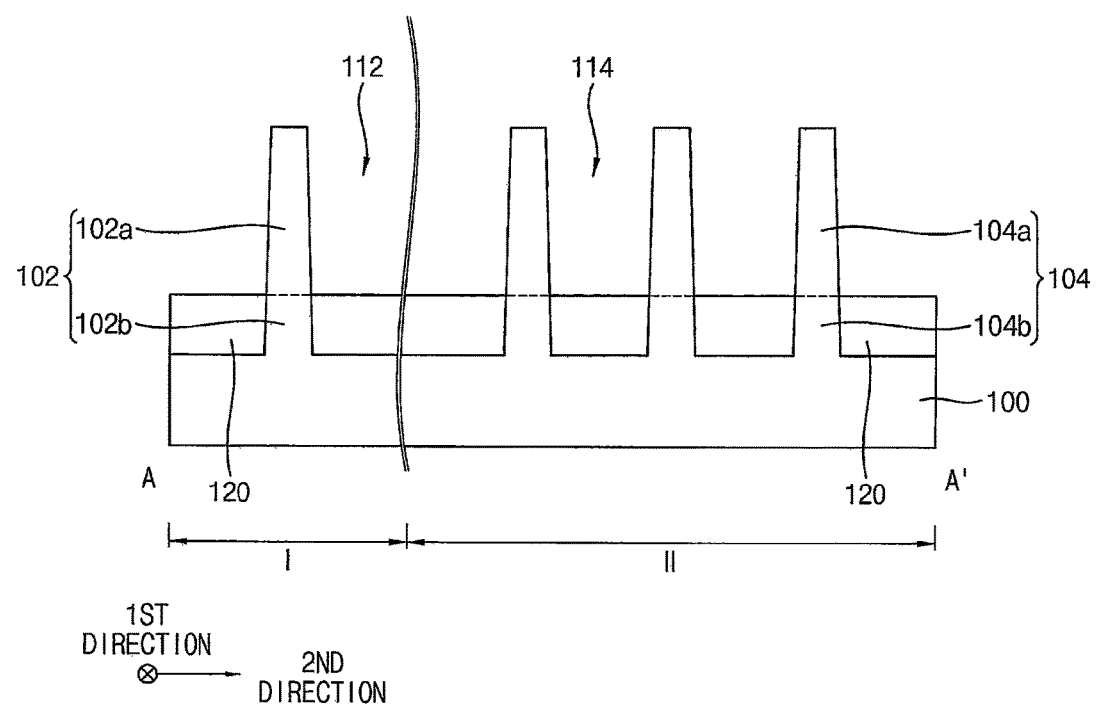

Referring to FIGS. 4 and 5, an isolation pattern 120 may be formed on the substrate 100 to fill lower portions of the first and second recesses 112 and 114. In some embodiments, the isolation pattern 120 may be formed by forming an isolation layer on the substrate 100 to sufficiently fill the first and second recesses 112 and 114, planarizing the isolation layer until upper surfaces of the first and second active fins 102 and 104 may be exposed, and removing an upper portion of the isolation layer to expose upper portions of the first and second recesses 112 and 114. The isolation pattern 120 may be a portion of the isolation layer remaining after removing the upper portion of the isolation layer. In some embodiments, the isolation layer may be formed of an oxide, e.g., silicon oxide.

In some embodiments, ones of the first active fins 102 may include a first lower active pattern 102*b* whose sidewall may be covered by the isolation pattern 120, and a first upper active pattern 102*a* that is not covered by the isolation pattern 120 but protruding therefrom. Additionally, ones of the second active fins 104 may include a second lower active pattern 104*b* whose sidewall may be covered by the isolation pattern 120, and a second upper active pattern 104*a* that is not covered by the isolation pattern 120 but protruding therefrom. In some embodiments, the first and second upper active patterns 102*a* and 104*a* may have widths in the second direction that may be slightly less than widths of the first and second lower active patterns 102*b* and 104*b*, respectively.

In some embodiments, the isolation pattern 120 may be formed to have a multi-layered structure. Particularly, the isolation pattern 120 may include first and second liners sequentially stacked on an inner wall of ones of the first and second recesses 112 and 114, and a filling insulation layer filling a remaining portion of the first and second recesses 112 and 114 on the second liner. For example, the first liner may be formed of an oxide, e.g., silicon oxide, the second liner may be formed of a nitride, e.g., silicon nitride, or polysilicon, and the filling insulation layer may be formed of an oxide, e.g., silicon oxide.

Figure 6:
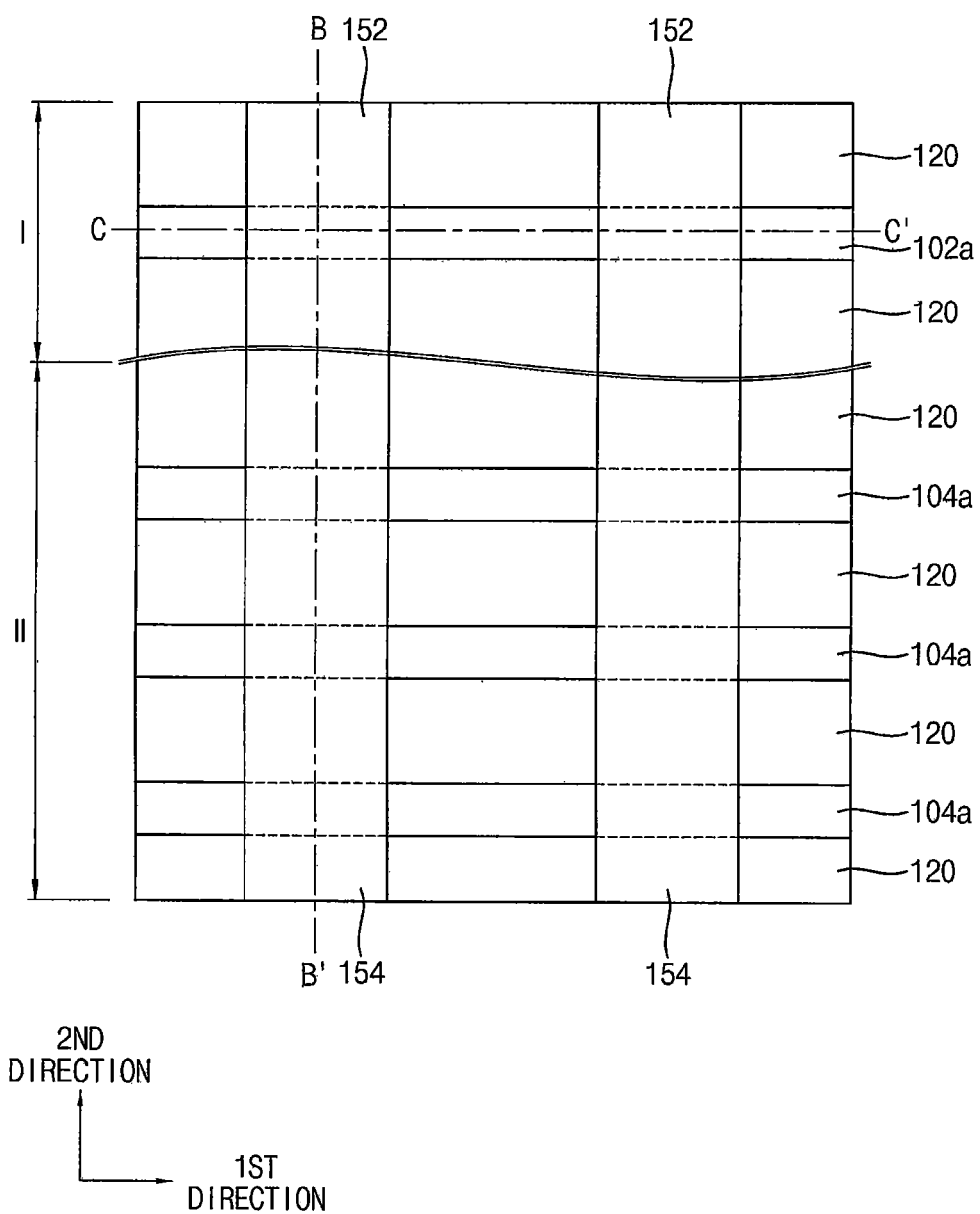
Figure 8:
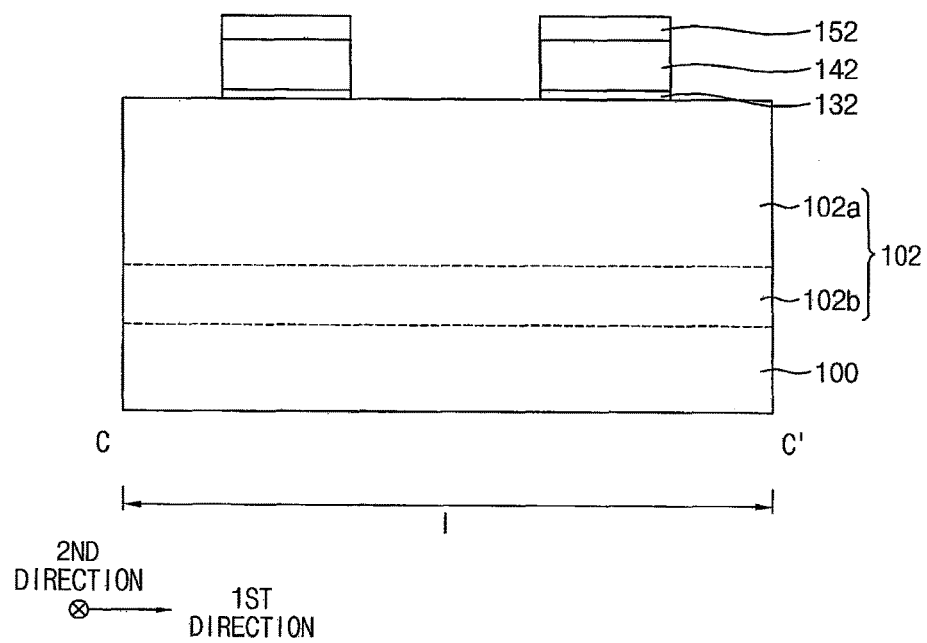

Referring to FIGS. 6 to 8, first and second dummy gate structures may be formed on the first and second regions I and II, respectively, of the substrate 100.

The first and second dummy gate structures may be formed by sequentially forming a dummy gate insulation layer, a dummy gate electrode layer and a dummy gate mask layer on the first and second active fins 102 and 104 of the substrate 100 and the isolation pattern 120, patterning the dummy gate mask layer to form first and second dummy gate masks 152 and 154 in the first and second regions I and II, respectively, and sequentially etching the dummy gate electrode layer and the dummy gate insulation layer using the first and second dummy gate masks 152 and 154 as an etching mask.

Thus, the first dummy gate structure may include a first dummy gate insulation pattern 132, a first dummy gate electrode 142 and the first dummy gate mask 152 sequentially stacked on the first region I of the substrate 100, and the second dummy gate structure may include a second dummy gate insulation pattern 134, a second dummy gate electrode 144 and the second dummy gate mask 154 sequentially stacked on the second region II of the substrate 100

In some embodiments, the dummy gate insulation layer may be formed of an oxide, e.g., silicon oxide, the dummy gate electrode layer may be formed of, e.g., polysilicon, and the dummy gate mask layer may be formed of a nitride, e.g., silicon nitride. In some embodiments, the dummy gate insulation layer may be formed by a chemical vapor deposition (CVD) process, an atomic layer deposition (ALD) process, etc. Alternatively, the dummy gate insulation layer may be formed by a thermal oxidation process on an upper portion of the substrate 100, and in this case, the dummy gate insulation layer may be formed only on the first and second upper active patterns 102*a* and 104*a*. The dummy gate electrode layer and the dummy gate mask layer may be formed by a CVD process, an ALD process, etc.

In some embodiments, the first and second dummy gate structures may be formed to extend in the second direction, and a plurality of first dummy gate structures and a plurality of second dummy gate structures may be formed in the first direction. FIGS. 6 to 8 show that the first and second dummy gate structures extend in the second direction along the same line, however, the inventive concepts may not be limited thereto, and the first and second dummy gate structures may extend along different lines. In other words, first and second dummy gate structures may be offset from each other.

Figure 9:
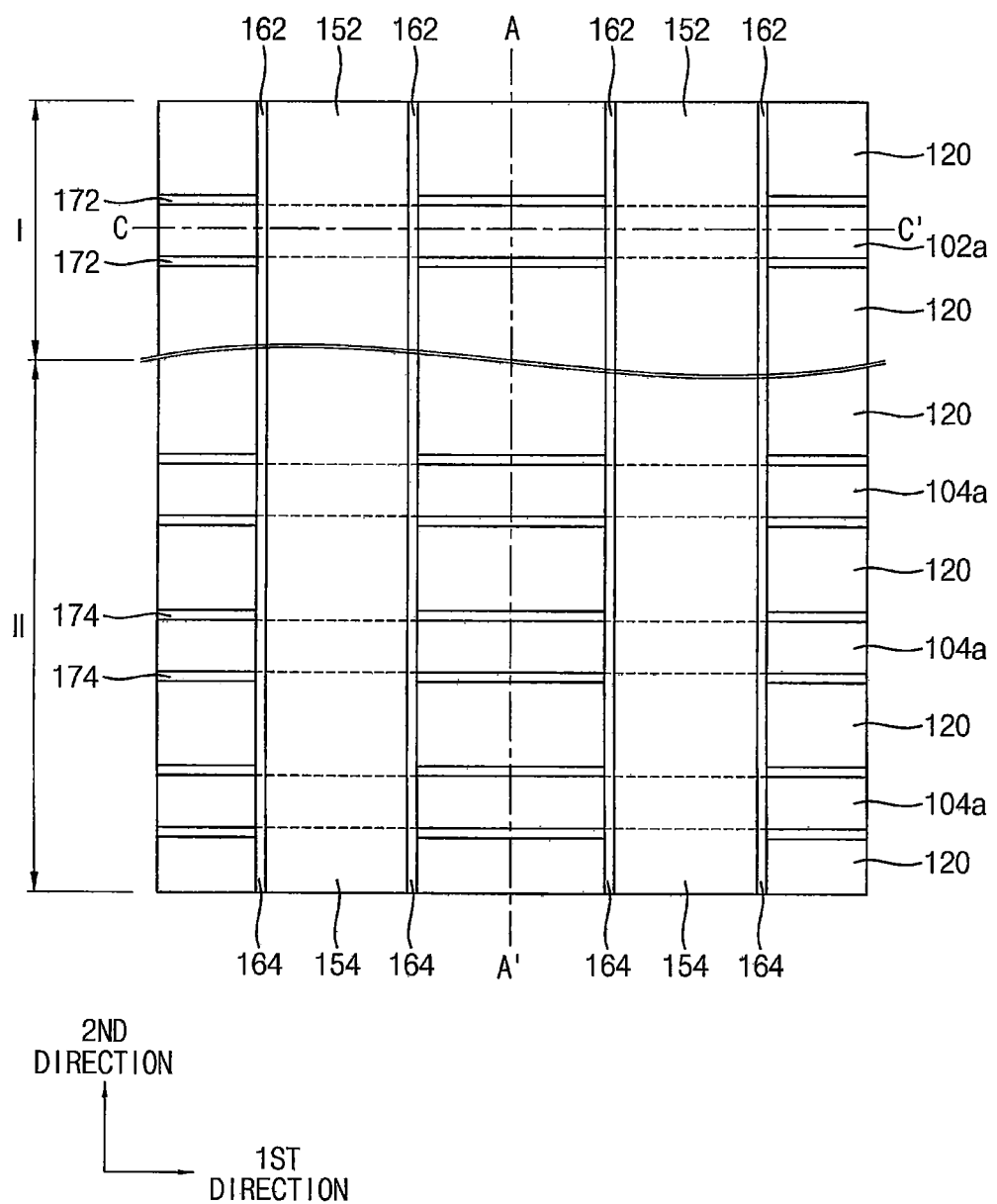
Figure 10:
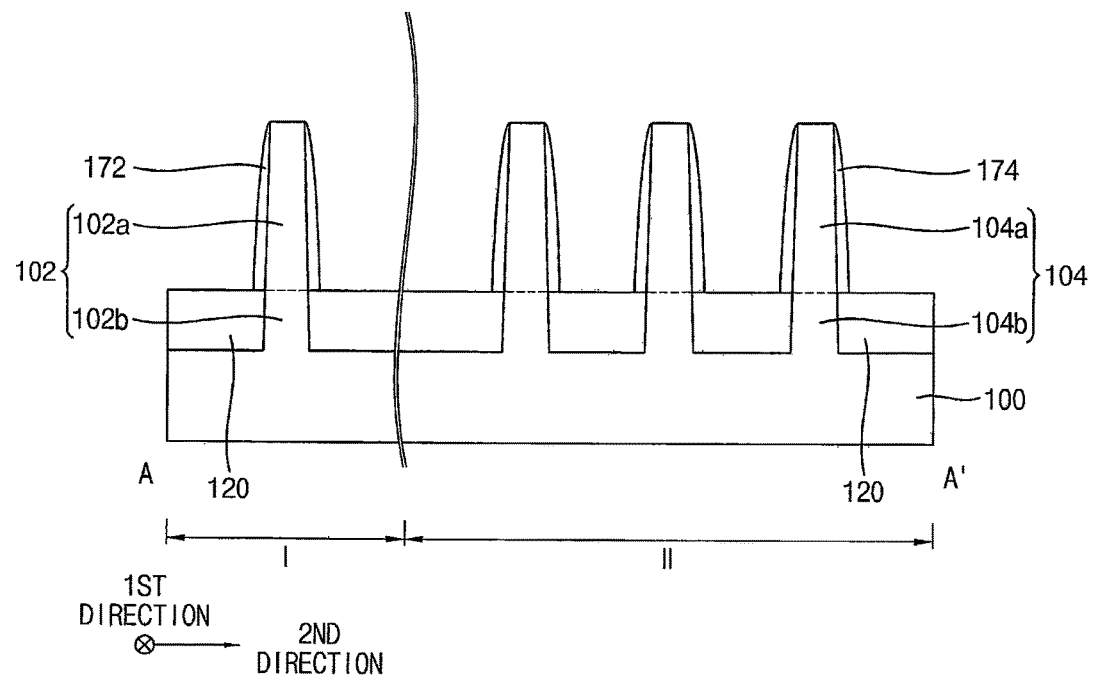
Figure 11:
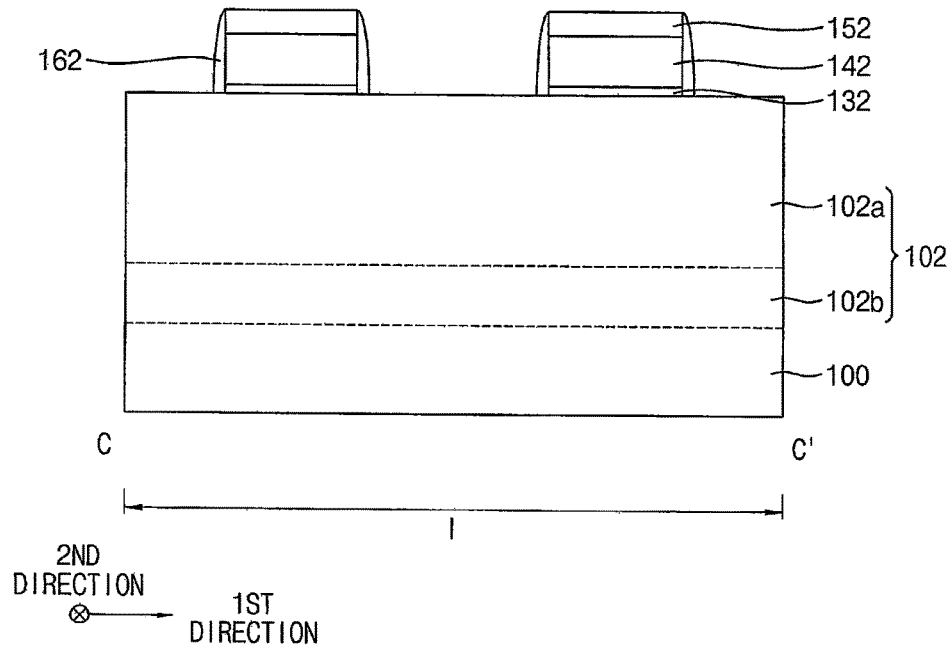

Referring to FIGS. 9 to 11, first and second gate spacers 162 and 164 may be formed on sidewalls of the first and second dummy gate structures, respectively. First and second fin spacers 172 and 174 may be also formed on sidewalls of the first and second upper active patterns 102*a* and 104*a*, respectively. In some embodiments, the first and second gate spacers 162 and 164 and the first and second fin spacers 172 and 174 may be formed by forming a spacer layer on the first and second dummy gate structures, the first and second active fins 102 and 104 and the isolation pattern 120, and anisotropically etching the spacer layer. The spacer layer may be formed of a nitride, e.g., silicon nitride, silicon oxycarbonitride, etc.

The first and second gate spacers 162 and 164 may be formed on opposite sidewalls of the first and second dummy gate structures, respectively, in the first direction, and the first and second fin spacers 172 and 174 may be formed on opposite sidewalls of the first and second active fins 102 and 104, respectively, in the second direction.

Figure 12:
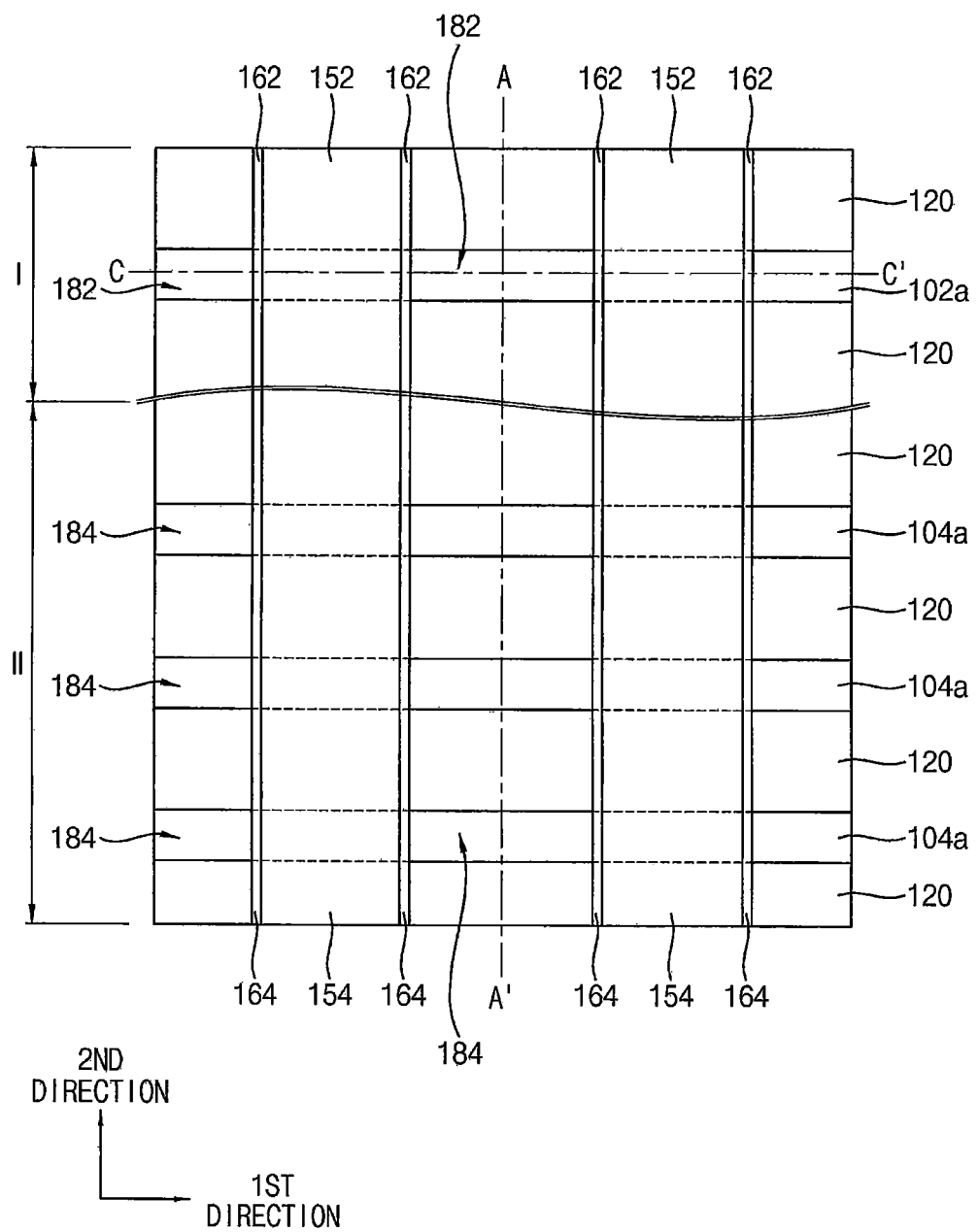
Figure 13:
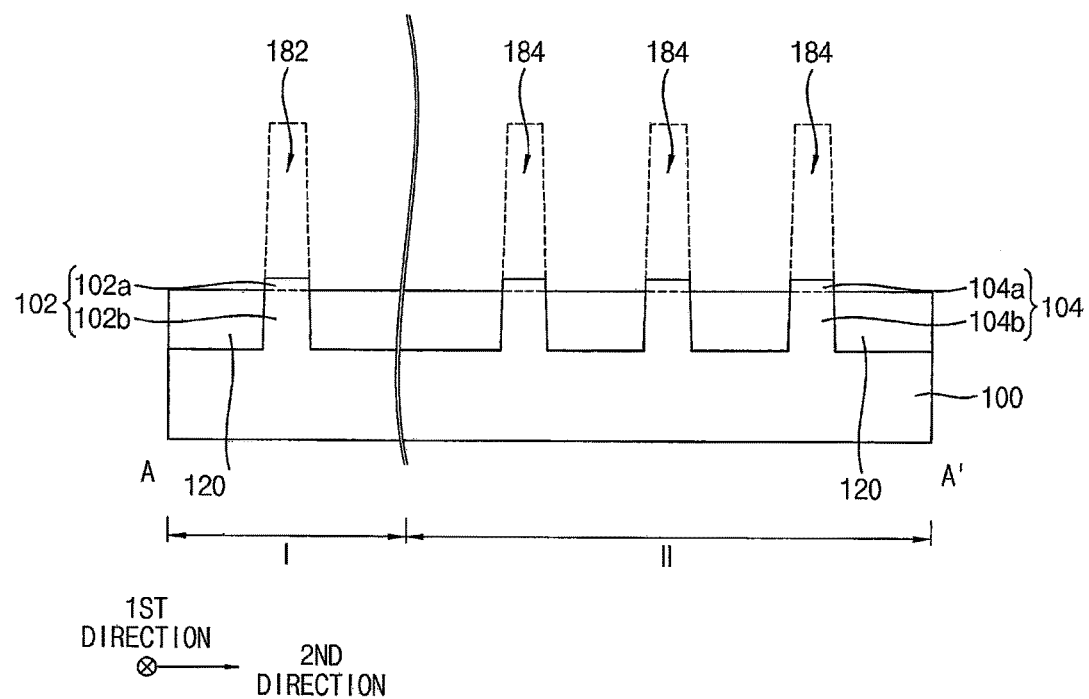
Figure 14:
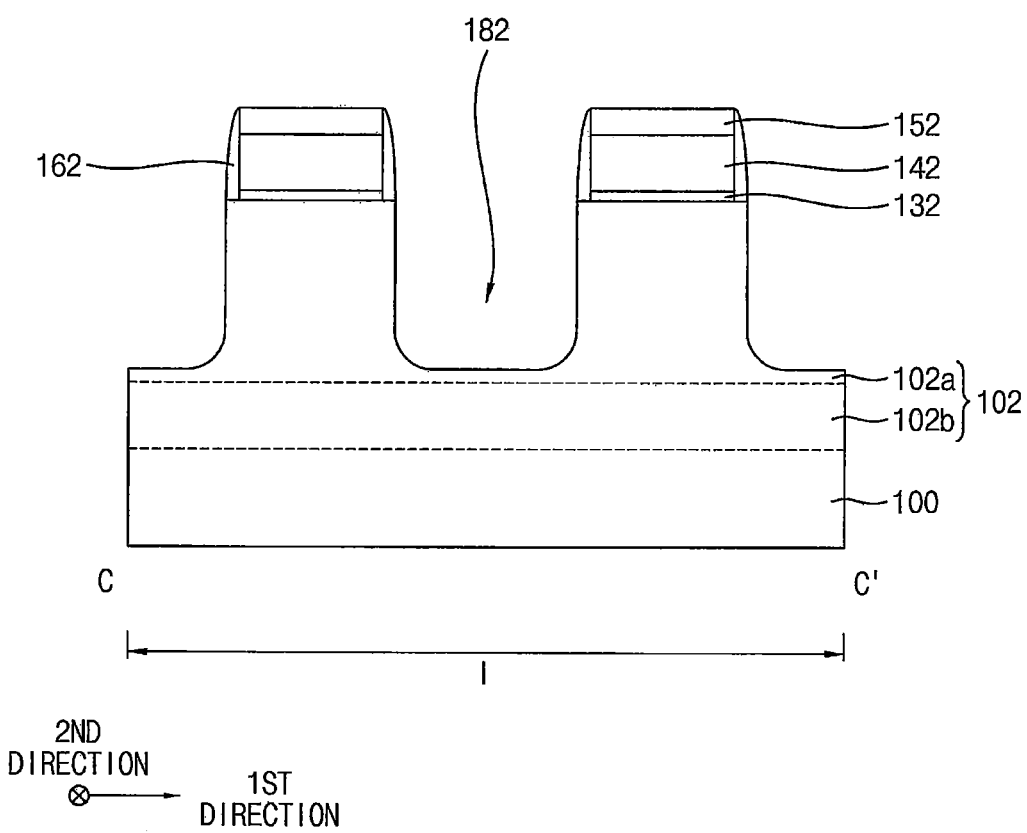

Referring to FIGS. 12 to 14, upper portions of the first and second active fins 102 and 104 that are adjacent the first and second dummy gate structures, respectively, may be etched to form third and fourth recesses 182 and 184, respectively.

Particularly, the upper portions of the first and second active fins 102 and 104 may be removed using the first and second dummy gate structures and the first and second gate spacers 162 and 164 on sidewalls thereof as an etching mask to form the third and fourth recesses 182 and 184. The first and second fin spacers 172 and 174 may be also removed.

FIGS. 12 to 14 show that the first and second upper active patterns 102*a* and 104*a* of the first and second active fins 102 and 104, respectively, may be partially removed to form the third and fourth recesses 182 and 184, respectively, however, the inventive concepts may not be limited thereto. In some embodiments, not only the first and second upper active patterns 102*a* and 104*a* but also portions of the first and second lower active patterns 102*b* and 104*b* may be removed to form the third and fourth recesses 182 and 184. In some embodiments, the etching process for forming the first and second gate spacers 162 and 164 and the etching process for forming the third and fourth recesses 182 and 184 may be performed in-situ. In some embodiments, the third and fourth recesses 182 and 184 may be formed to have substantially the same depth, and thus top surfaces of the remaining first and second active fins 102 and 104 under the third and fourth recesses 182 and 184, respectively, may have substantially the same height.

Figure 15:
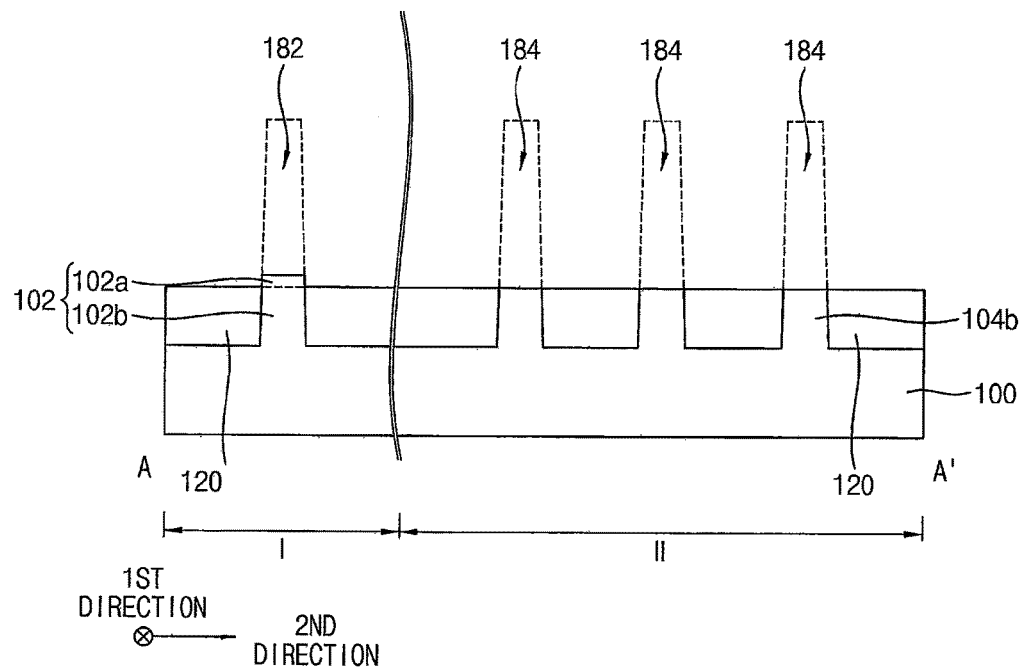

Alternatively, referring to FIG. 15, the third and fourth recesses 182 and 184 may be formed to have different depths from each other, and thus the top surfaces of the remaining first and second active fins 102 and 104 under the third and fourth recesses 182 and 184, respectively, may have different heights from each other. In some embodiments, the top surface of the first active fin 102 may be higher than that of the second active fin 104. Hereinafter, for the convenience of explanation, only the first and second active fins 102 and 104 as shown in FIGS. 12 to 14 will be described.

Figure 16:
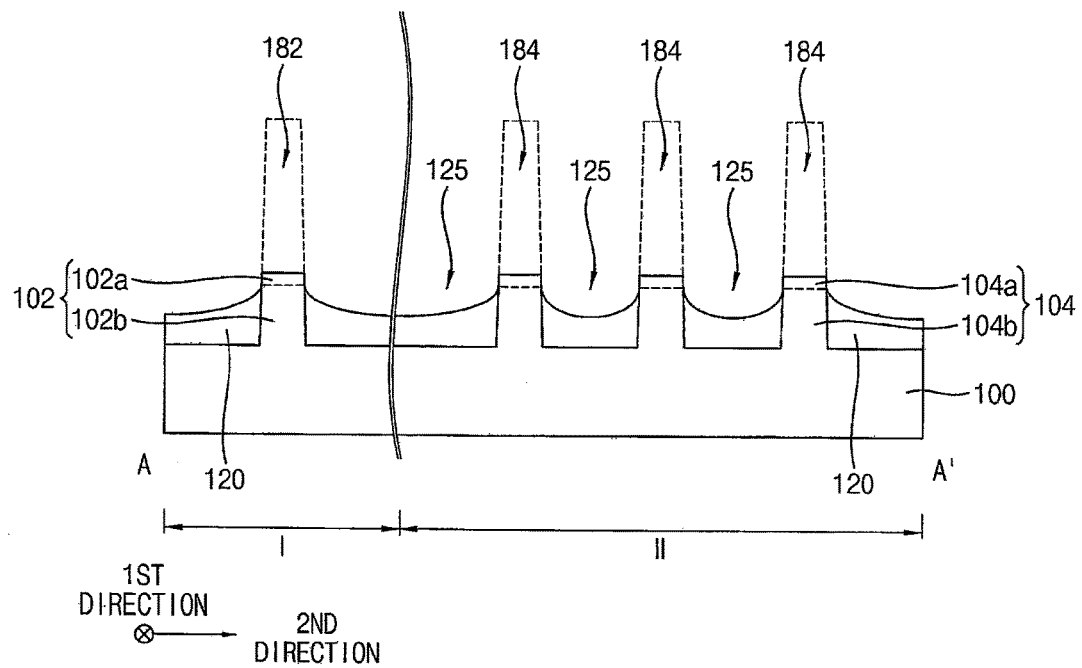
Figure 17:
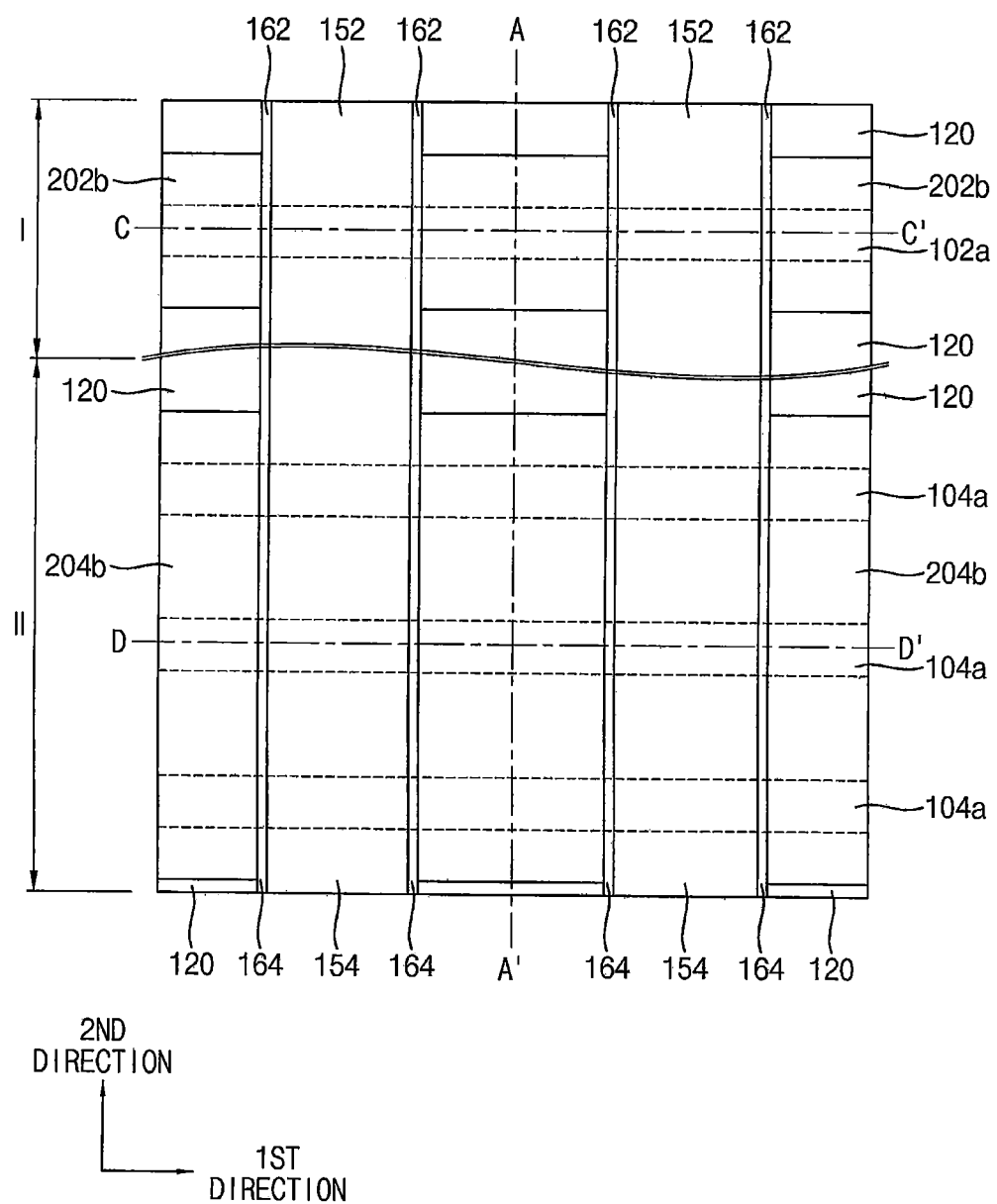

Referring to FIG. 16, when the upper portions of the first and second active fins 102 and 104 are etched to form the third and fourth recesses 182 and 184, respectively, an upper portion of the isolation pattern 120 may be partially etched to form a fifth recess 125 thereon. In some embodiments, the fifth recess 125 may have a central bottom lower than edge bottoms adjacent the first and second active fins 102 and 104.

Referring to FIGS. 17 to 20, first and fourth semiconductor layers 202a and 204a may be formed in the third and fourth recesses 182 and 184, respectively, and second and fifth semiconductor layers 202b and 204b may be formed on the first and fourth semiconductor layers 202a and 204a, respectively. In some embodiments, the first and fourth semiconductor layers 202a and 204a may be formed by a first selective epitaxial growth (SEG) process using upper surfaces of the first and second active fins 102 and 104 exposed by the third and fourth recesses 182 and 184, respectively, as a seed. Thus, the first and fourth semiconductor layers 202a and 204a may be conformally formed on bottoms and opposite sidewalls of the third and fourth recesses 182 and 184, respectively, in the first direction.

In some embodiments, the first SEG process may be formed by loading the substrate 100 having the resultant structures thereon into a process chamber, and providing a silicon source gas, a germanium source gas, an etching gas and a carrier gas. The first SEG process may be performed using e.g., silane ($SiH_4$) gas, disilane ($Si_2H_6$) gas, dichlorosilane (DCS) ($SiH_2Cl_2$) gas, etc., serving as the silicon source gas, e.g., germane ($GeH_4$) gas serving as the germanium source gas, e.g., hydrogen chloride (HCl) gas serving as the etching gas, and e.g., hydrogen ($H_2$) gas serving as the carrier gas. Thus, a respective single crystalline silicon-germanium layer may be formed to serve as ones of the first and fourth semiconductor layers 202a and 204a. In some embodiments, the silicon source gas may be provided with a first flow rate, and the germanium source gas may be provided with a second flow rate in the first SEG process.

In the first SEG process, a p-type impurity source gas, e.g., diborane ($B_2H_6$) gas may be also used to form a respective single crystalline silicon-germanium layer doped with p-type impurities serving as ones of the first and fourth semiconductor layers 202a and 204a. In some embodiments, the p-type impurity source gas may be provided with a third flow rate in the first SEG process.

In some embodiments, the second and fifth semiconductor layers 202b and 204b may be formed on the first and fourth semiconductor layers 202a and 204a, respectively, by a second SEG process. In some embodiments, the second SEG process may be performed using substantially the same gases as the first SEG process, and thus a respective single crystalline silicon-germanium layer may be formed to serve as ones of the second and fifth semiconductor layers 202b and 204b. However, the flow rates of the gases may be controlled so that the second and fifth semiconductor layers 202b and 204b may have a germanium concentration greater than that of the first and fourth semiconductor layers 202a and 204a. In some embodiments, the silicon source gas may be provided with a fourth flow rate less than the first flow rate, and the germanium source gas may be provided with a fifth flow rate greater than the second flow rate in the second SEG process.

Thus, when the substrate 100 is a silicon substrate, the first and fourth semiconductor layers 202a and 204a having a relatively low germanium concentration may be formed between the substrate 100 and the second and fifth semiconductor layers 202b and 204b, respectively, and thus the lattice mismatch between the second and fifth semiconductor layers 202b and 204b and the first and second active fins 102 and 104, respectively, may decrease. Thus, the first and fourth semiconductor layers 202a and 204a may serve as a buffer layer between the substrate 100 and the second and fifth semiconductor layers 202b and 204b, respectively.

The flow rate of the p-type impurity source gas provided in the second SEG process may be controlled so that the second and fifth semiconductor layers 202b and 204b may have a p-type impurity concentration greater than that of the first and fourth semiconductor layers 202a and 204a. In some embodiments, the p-type impurity source gas, e.g., diborane ($B_2H_6$) gas may be provided with a sixth flow rate greater than the third flow rate in the second SEG process.

The second and fifth semiconductor layers 202b and 204b may be formed on the first and fourth semiconductor layers 202a and 204a, respectively, to partially fill the third and fourth recesses 182 and 184, respectively, and may be grown in both vertical and horizontal directions. For example, when the substrate 100 is a (111) silicon substrate and the first and second active fins 102 and 104 have the <110> crystal direction, the second and fifth semiconductor layers 202b and 204b may have a growth rate lowest in the <111> crystal direction, and thus the second and fifth semiconductor layers 202b and 204b may have the {111} crystal plane.

In some embodiments, the second semiconductor layer 202b may have a cross-section taken along the second direction, and the cross-section of the second semiconductor layer 202b may have a first shape with five sides similar to a pentagon. In the first shape, four of the sides, not including a bottom side that is adjacent to an upper surface of the substrate 100 or an upper surface of the isolation pattern 120, may have an angle of about 54.7 degrees with respect to the upper surface of the substrate 100 or the upper surface of the isolation pattern 120.

As used herein, a semiconductor layer may be described as having a cross-sectional shape that is similar to a pentagon when the semiconductor layer has a cross-sectional shape that includes five sides. However, one of the sides of the first shape that is similar to a pentagon of the second semiconductor layer 202b may be partially or completely consumed by the first semiconductor layer 202a and/or the first upper active pattern 102a. Therefore the first shape of the second semiconductor layer 202b may be referred to as being similar to a pentagon even where the bottom side of the first shape is partially or completely within other structures and the perimeter of the actual cross-sectional shape of the second semiconductor layer 202b may contain additional sides that are adjacent to sidewalls of the first upper active pattern 102a, sidewalls of the first semiconductor layer 202a, and/or an upper surface of the first semiconductor layer 202a, as illustrated in FIG. 18.

Figure 18:
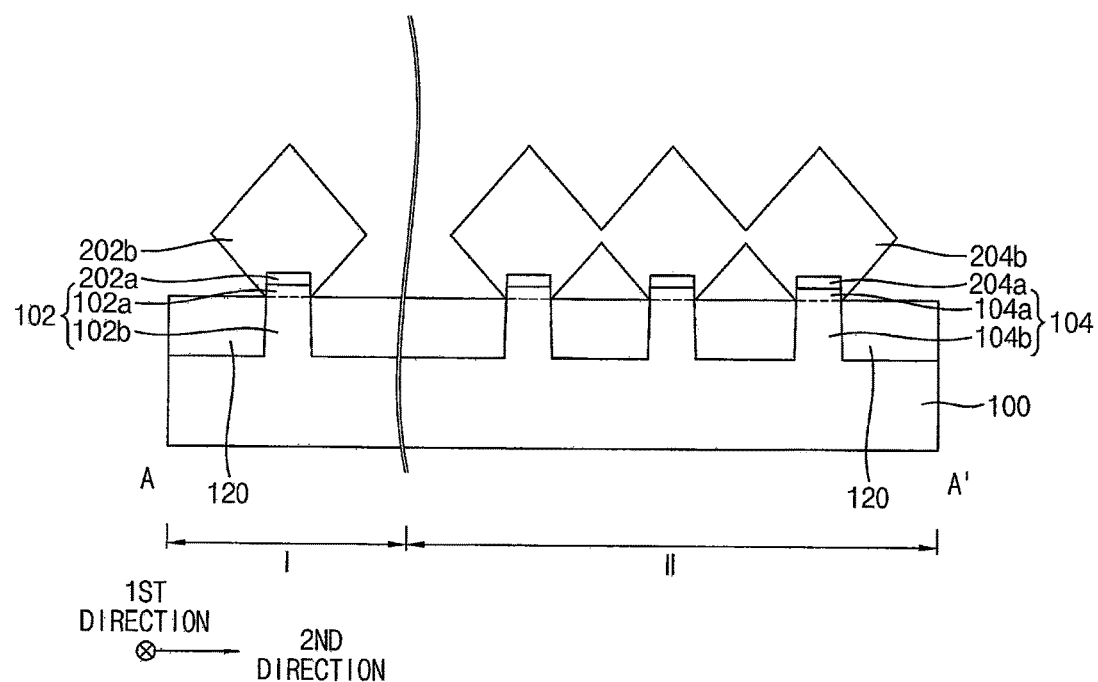

In other words, as illustrated in FIG. 18, the shape of the second semiconductor layer 202b may include upper sidewall surfaces defining an angle with respect to the surface of the substrate and facing away from the substrate and lower sidewall surfaces defining an angle with respect to the surface of the substrate and facing towards the surface of the substrate.

Figure 19:
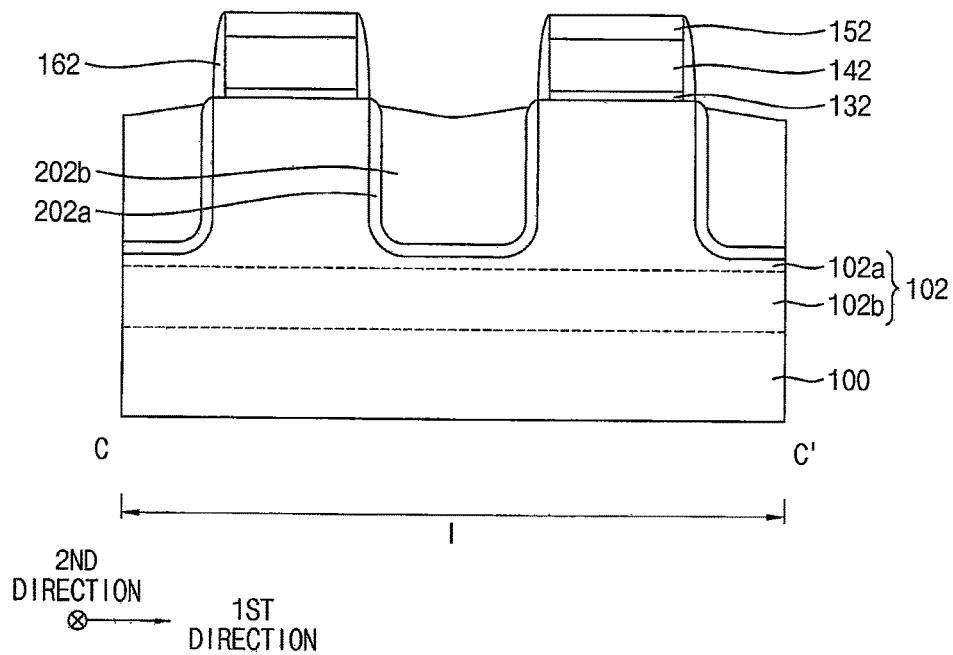
Figure 20:
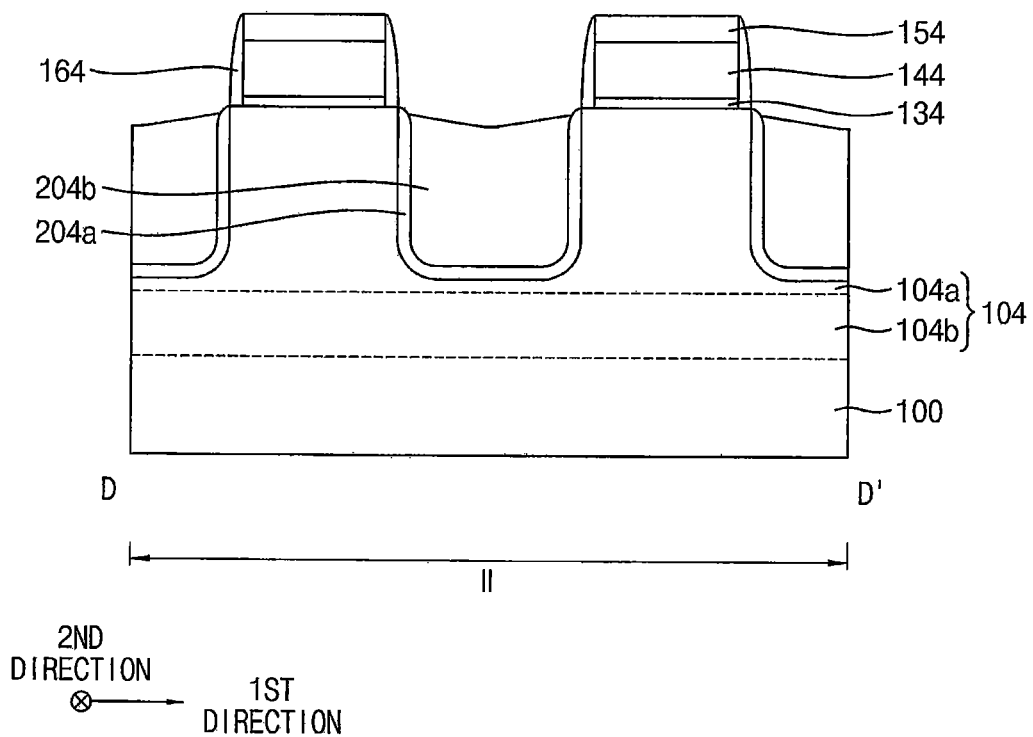
Figure 21:
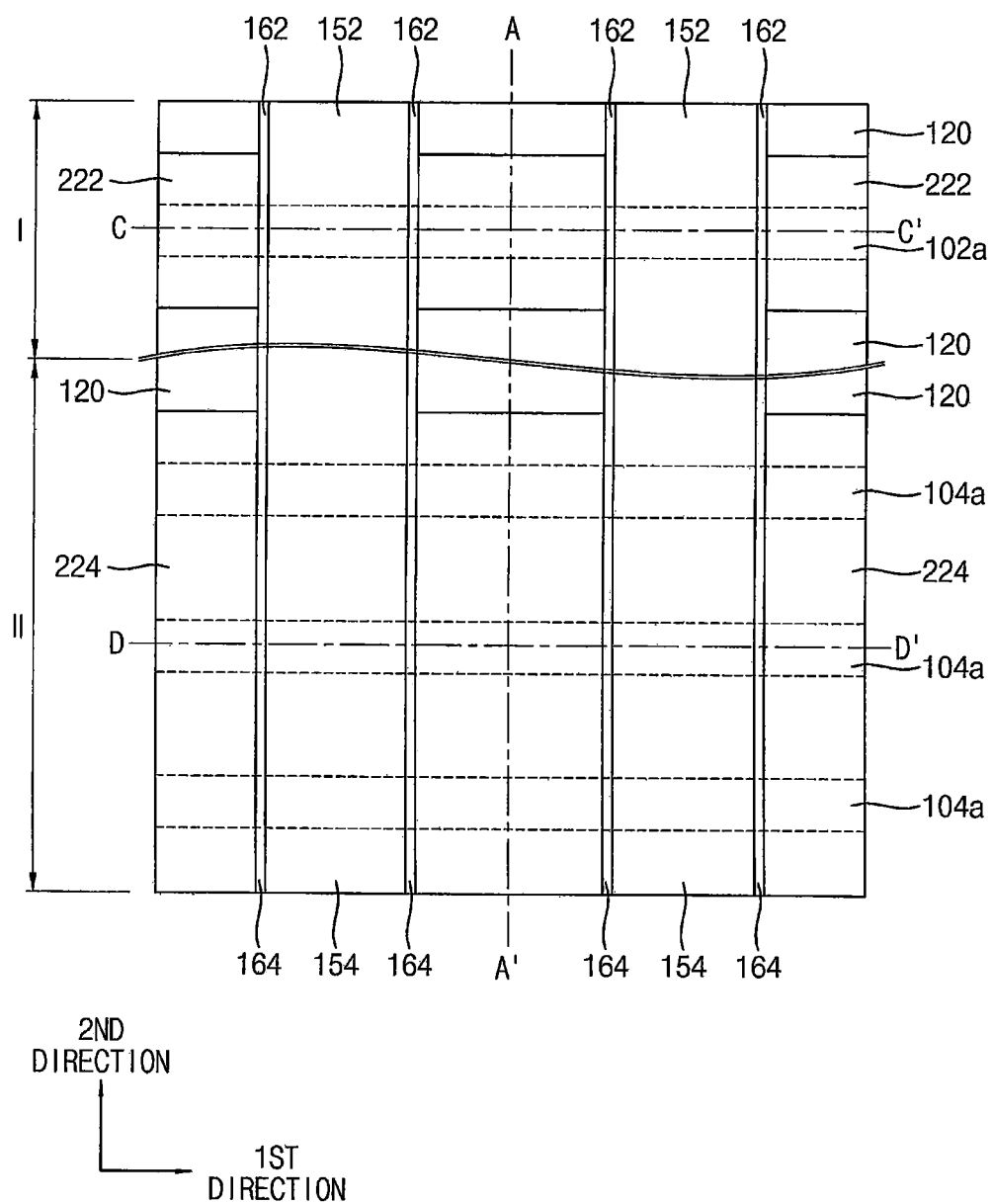
Figure 22:
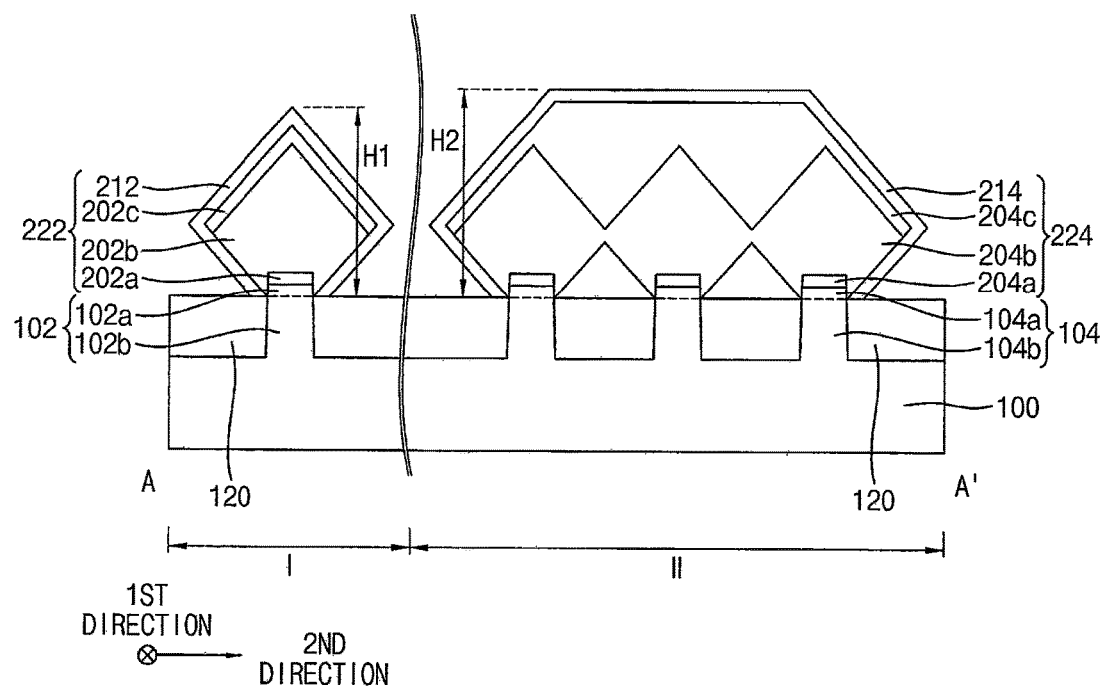
Figure 23:
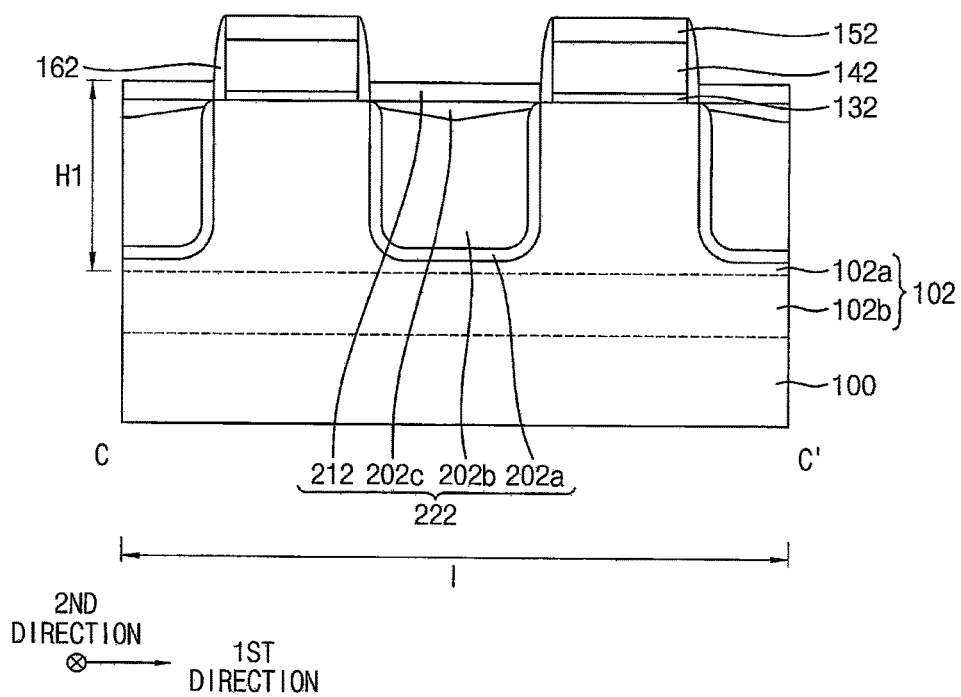
Figure 24:
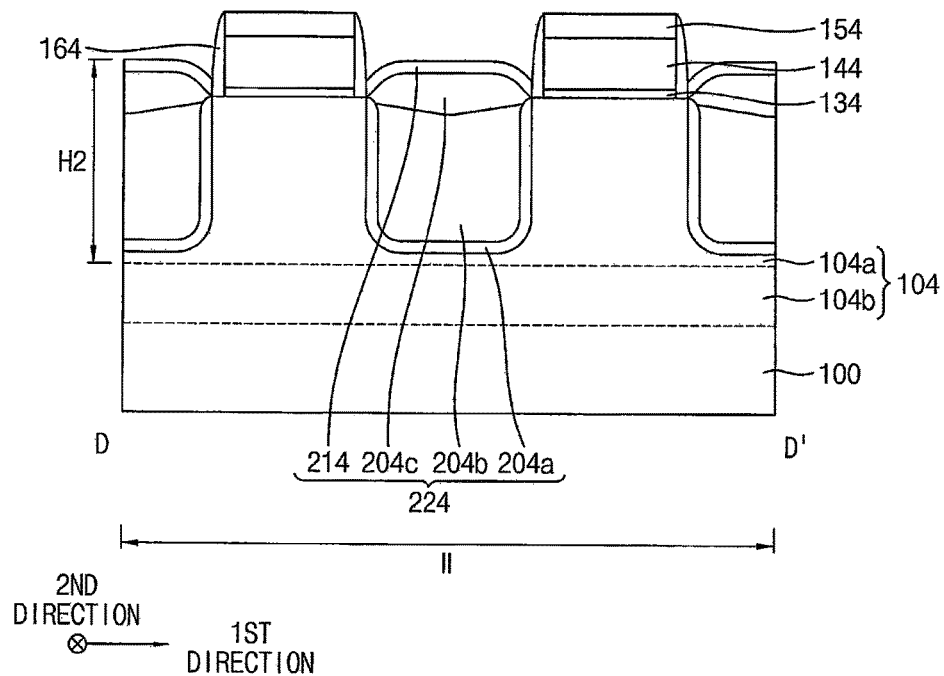

The second semiconductor layer 202b may also grow from portions of the first semiconductor layer 202a on opposite sidewalls of the third recess 182 in the first direction to have the {111} crystal plane, and thus may have a cross-section taken along the first direction whose upper portion may have a V-like shape, as illustrated in FIG. 19.

In some embodiments, the fifth semiconductor layer 204b may have a second shape similar to that of the first shape of the second semiconductor layer 202b on the second active fins 104. However, a cross-section of the fifth semiconductor layer 204b taken along the second direction may have a shape that may be formed by connecting the second shapes on the second active fins 104, respectively, adjacent to each other in the second direction.

As used herein, the cross-section of the fifth semiconductor layer 204b taken along the second direction may be referred to as being a shape that may be formed by connecting shapes that are similar to a pentagon even though a bottom side of the shapes that are similar to a pentagon may be partially or completely within other structures, the actual cross-sectional shape may have additional sides adjacent to the second upper active pattern 104a and the fourth semiconductor layer 204a, and one or more corners of the shapes that are similar to a pentagon may not be present where the shapes that are similar to a pentagon connect.

In other words, as illustrated in FIG. 18, the shape of the second semiconductor layer 204b may include a shape including a plurality of second shapes that are connected to each other in the second direction. The second shapes may include upper sidewall surfaces defining an angle with respect to the surface of the substrate and facing away from the substrate and lower sidewall surfaces defining an angle with respect to the surface of the substrate and facing towards the surface of the substrate. The second shapes may include outermost ones of the second shapes and at least one inner second shape that is between the outermost ones of the second shapes. The outermost ones of the second shapes may have inner upper sidewall surfaces that are adjacent to the at least one inner second shape and outer upper sidewall surfaces that are opposite from the at least one inner second shape.

Referring to FIGS. 21 to 24, a third SEG process may be performed to form third and sixth semiconductor layers 202c and 204c on the second and fifth semiconductor layers 202b and 204b, respectively. The third SEG process may be performed using a silicon source gas, a germanium source gas, an etching gas and a carrier gas like the first and second SEG processes. Thus, a respective single crystalline silicon-germanium layer may be formed as each of the third and sixth semiconductor layers 202c and 204c.

However, the third and sixth semiconductor layers 202c and 204c may be formed to have a germanium concentration greater than that of the second and fifth semiconductor layers 202b and 204b by controlling flow rates of the above gases. In some embodiments, the silicon source gas may be provided with a seventh flow rate less than the fourth flow rate, and the germanium source gas may be provided with an eighth flow rate greater than the fifth flow rate in the third SEG process.

Additionally, the third and sixth semiconductor layers 202c and 204c may be formed to have a p-type impurity concentration greater than that of the second and fifth semiconductor layers 202b and 204b by controlling flow rates of the p-type impurity source gas. In some embodiments, the p-type impurity source gas may be provided with a ninth flow rate greater than the sixth flow rate in the third SEG process.

However, unlike the first and second SEG processes, dichlorosilane ($SiH_2Cl_2$) gas may not be used as the silicon source gas but silane ($SiH_4$) gas and/or disilane ($Si_2H_6$) gas may be used in the third SEG process. When dichlorosilane ($SiH_2Cl_2$) gas is provided as the silicon source gas, it may be diffused upwardly from the first and second active fins 102 and 104 under the second and fifth semiconductor layers 202b and 204b, respectively, and the third and sixth semiconductor layers 202c and 204c may be also formed on lower side surfaces of the second and fifth semiconductor layers 202b and 204b, respectively. However, in some embodiments, silane ($SiH_4$) gas and/or disilane ($Si_2H_6$) gas may be provided as the silicon source gas, and it may be prevented from diffusing upwardly from the first and second active fins 102 and 104 so that the third and sixth semiconductor layers 202c and 204c may not be formed on the lower side surfaces of the second and fifth semiconductor layers 202b and 204b, respectively. This may be enhanced by properly controlling the flow rates of hydrogen chloride (HCl) gas serving as the etching gas and hydrogen ($H_2$) gas serving as the carrier gas. Therefore, in some embodiments, the third and sixth layers 202c and 204c may not be formed on the lower side surfaces of the second and fifth semiconductor layers 202b and 204b, respectively, but formed only on upper side surfaces of the second and fifth semiconductor layers 202b and 204b, respectively.

The third and sixth semiconductor layers 202c and 204c may also have a growth rate lowest in the <111> crystal direction, and thus a growth rate in a direction substantially perpendicular to the upper surface of the substrate 100 may be much greater than the growth rate in the <111> crystal direction on the already formed {111} crystal plane.

Accordingly, a thickness of the third semiconductor layer 202c on an upper side surface of the second semiconductor layer 202b having the {111} crystal plane or a thickness of the sixth semiconductor layer 204c on an upper outer side surface of an outermost one of the second shapes of the fifth semiconductor layer 204b may be much less than a thickness of the sixth semiconductor layer 204c on an upper inner side surface of the outermost one of the second shapes of the fifth semiconductor layer 204b or a thickness of the sixth semiconductor layer 204c on upper side surfaces of other ones of the second shapes of the fifth semiconductor layer 204b.

In some embodiments, the third SEG process may be performed until the third and sixth semiconductor layers 202c and 204c may fill the third and fourth recesses 182 and 184, respectively, and the sixth semiconductor layer 204c may further grow above the fourth recess 184 so that a top surface of the sixth semiconductor layer 204c may be higher than a bottom of the second gate spacer 164. The sixth semiconductor layer 204c may fill a space between the second shapes of pentagons of the fifth semiconductor layer 204b, and may have an upper surface whose central portion may be flat and higher that top surfaces of the second shapes. In some embodiments, the upper surface of the sixth semiconductor layer 204c may be higher than a top surface of the third semiconductor layer 202c.

A fourth SEG process may be performed to form a first capping layer 212 on the second and third semiconductor layers 202b and 202c and to form a second capping layer 214 on the fifth and sixth semiconductor layers 204b and 204c. In some embodiments, the fourth SEG process may be performed using a silicon source gas, an etching gas and a carrier gas, and thus a respective single crystalline silicon layer may be formed as the first and second capping layers 212 and 214. In some embodiments, dichlorosilane ($SiH_2Cl_2$) gas may be used as the silicon source gas, and thus the first capping layer 212 may be formed on an upper side surface of the third semiconductor layer 202c and on the lower side surface of the second semiconductor layer 202b as well, and the second capping layer 214 may be formed on an upper side surface of the sixth semiconductor layer 204c and on the lower side surface of the fifth semiconductor layer 204b as well. However, the silicon source gas may not be provided well onto an inner lower side surface of the outermost one of the second shapes of the fifth semiconductor layer 204b or onto lower side surfaces of other ones of the second shapes of the fifth semiconductor layer 204b, and thus the second capping layer 214 may not be formed thereon.

The first and second capping layers 212 and 214 may protect the first to third semiconductor layers 202a, 202b and 202c, and the fourth to sixth semiconductor layers 204a, 204b and 204c, respectively, from a heat treatment subsequently performed, and in some embodiments, may not be formed.

The first to third semiconductor layers 202a, 202b and 202c sequentially stacked on the first active fin 102 and the first capping layer 212 on the second and third semiconductor layers 202b and 202c may form a first source/drain layer structure 222. Additionally, the fourth semiconductor layers 204a on the respective second active fins 104, the fifth semiconductor layer 204b commonly contacting upper surfaces of the fourth semiconductor layers 204a, the sixth semiconductor layer 204c on the fifth semiconductor layer 204b, and the second capping layer 214 on the fifth and sixth semiconductor layers 204b and 204c may form a second source/drain layer structure 224. The first and second source/drain layer structures 222 and 224 may serve as a respective source/drain of a respective positive-channel metal oxide semiconductor (PMOS) transistor.

In some embodiments, a top surface of the first source/drain layer structure 222 may have a first height H1 from the upper surface of the isolation pattern 120, and an upper surface of the second source/drain layer structure 224 may have a second height H2 from the upper surface of the isolation pattern 120, which may be greater than the first height H1. The upper surface of the second source/drain layer structure 224 may be constant along the second direction. Thus, the second source/drain layer structure 224 may have a relatively large volume, and may apply a sufficiently high compressive stress on a channel that may be formed at a portion of the second active fin 104 under the second dummy gate structure, which may increase the mobility of holes.

The second source/drain layer structure 224 may include the sixth semiconductor layer 204c having a p-type impurity concentration greater than that of the fifth semiconductor layer 204b, which may have a large volume, and thus may have a low resistance. In the second source/drain layer structure 224, the sixth semiconductor layer 204c having a relatively high germanium concentration may be formed on the fifth semiconductor layer 204b having a relatively low germanium concentration, and thus the Schottky barrier of a second contact plug 354 (refer to FIGS. 43 to 47) that is subsequently formed may decrease, and thus the contact resistance between the second source/drain layer structure 224 and the second contact plug 354 may decrease.

The horizontal growth of the first source/drain layer structure 222 may be reduced or prevented when the third semiconductor layer 202c is formed on the second semiconductor layer 202b, and thus neighboring ones of the first source/drain layer structures 222 may not be merged with each other. Thus, the electrical short-circuit therebetween may be prevented.

Up to now, the first and second source/drain layer structures 222 and 224 serving as the source/drain of the PMOS transistor have been described, however, the inventive concepts may not be limited thereto, and the first and second source/drain layer structures 222 and 224 may also serve as a source/drain of a negative-channel metal oxide semiconductor (NMOS) transistor.

Particularly, the first to third SEG processes may be formed using a silicon source gas, a carbon source gas, an etching gas and a carrier gas, and thus respective a single crystalline silicon carbide layer may be formed as the first to sixth semiconductor layers 202a, 202b, 202c, 204a, 204b and 204c. In the first and second SEG processes, e.g., silane ($SiH_4$) gas, disilane ($Si_2H_6$) gas, dichlorosilane ($SiH_2Cl_2$) gas, etc. may be used as the silicon source gas, e.g., monomethylsilane ($SiH_3CH_3$) gas may be used as the carbon source gas, e.g., hydrogen chloride (HCl) gas may be sued as the etching gas, and e.g., hydrogen ($H_2$) gas may be used as the carrier gas. In the third SEG process, e.g., silane ($SiH_4$) gas and/or disilane ($Si_2H_6$) gas may be used as the silicon source gas. Additionally, an n-type impurity source gas, e.g., phosphine ($PH_3$) gas may be also used to form a single crystalline silicon carbide layer doped with n-type impurities.

In some embodiments, the first source/drain layer structure 222 may have a carbon concentration gradually increasing from the first semiconductor layer 202a through the second semiconductor layer 202b toward the third semiconductor layer 202c therein, and also have an n-type impurity concentration gradually increasing from the first semiconductor layer 202a through the second semiconductor layer 202b toward the third semiconductor layer 202c therein. Additionally, the second source/drain layer structure 224 may have a carbon concentration gradually increasing from the fourth semiconductor layer 204a through the fifth semiconductor layer 204b toward the sixth semiconductor layer 204c therein, and also have an n-type impurity concentration gradually increasing from the fourth semiconductor layer 204a through the fifth semiconductor layer 204b toward the sixth semiconductor layer 204c therein. Thus, the second source/drain layer structure 224 may apply a sufficiently high tensile stress on a channel that may be formed at a portion of the second active fin 104 under the second dummy gate structure, which may increase the mobility of electrons and the resistance.

Figure 25:
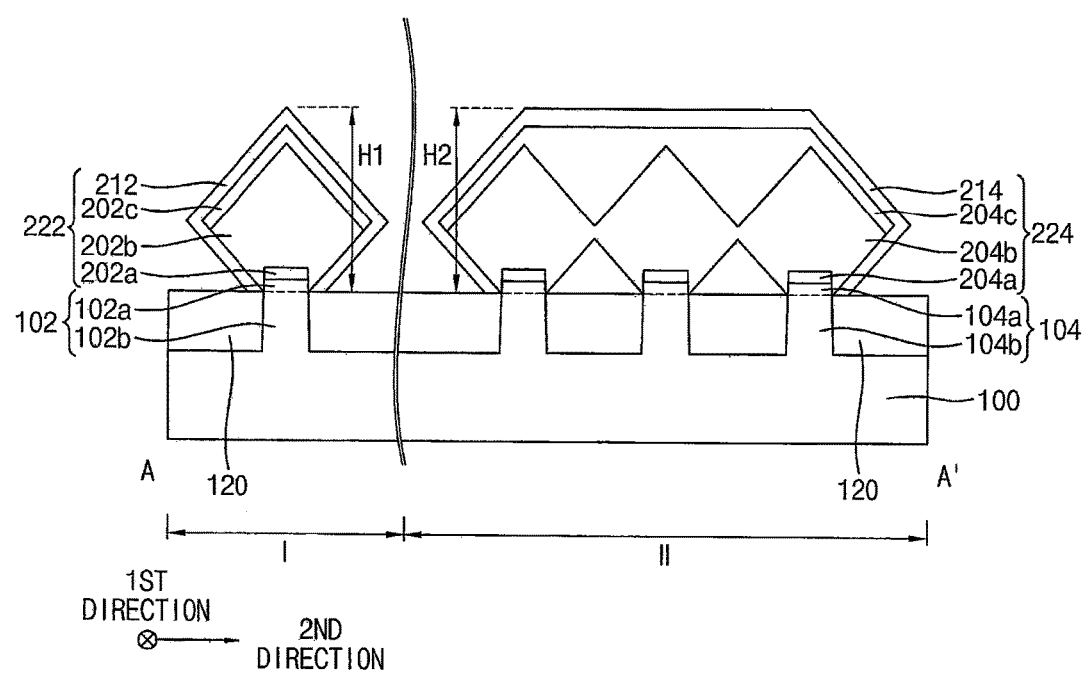
Figure 26:
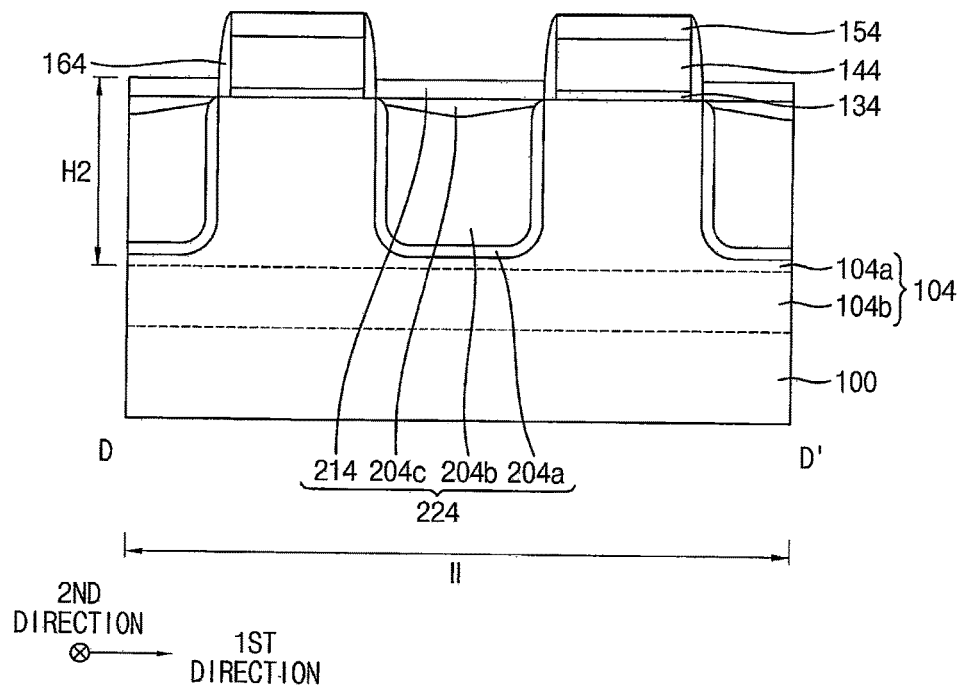

Referring to FIGS. 25 and 26, in some embodiments, the upper surface of the sixth semiconductor layer 204c that may be formed by the third SEG process may be substantially coplanar with the top surface of the third semiconductor layer 202c. The upper surface of the sixth semiconductor layer 204c may be constant along the second direction.

That is, the third SEG process may be performed only until the sixth semiconductor layer 204c may fill the space between the second shapes of the fifth semiconductor layer 204b, and thus the upper surface of the sixth semiconductor layer 204c may be substantially coplanar with a bottom of the second gate spacer 164. As a result, the second height H2 of the second source/drain layer structure 224 may be constant, and may be equal to the first height H1 of the first source/drain layer structure 222. As used herein, a structure that is referred to as having a height that is constant may have a surface that is substantially flat and substantially parallel to the surface of the substrate.

The second source/drain layer structure 224 that is described with reference to FIGS. 21 to 24 may include the sixth semiconductor layer 204c having a sufficiently large volume to apply sufficiently high stress on the channel, while a contact level between the second source/drain layer structure 224 and the second contact plug 354 that is subsequently formed may be relatively high so that a vertical length of the second contact plug 354 may be relatively short. Accordingly, a current path of current that is applied to the transistor may increase in the second source/drain layer structure 224 rather than in the second contact plug 354, which may deteriorate the performance of the transistor.

However, in the second source/drain layer structure 224 shown in FIGS. 25 and 26, the upper surface of the sixth semiconductor layer 204c may be less high so that the second contact plug 354 that is subsequently formed on the sixth semiconductor layer 204c may have a proper vertical length, even if the sixth semiconductor layer 204c may fill the spaces between the second shapes of the fifth semiconductor layer 204b. Thus, the performance of the transistor may not be deteriorated as compared to the transistor of FIGS. 21 to 24.

Figure 27:
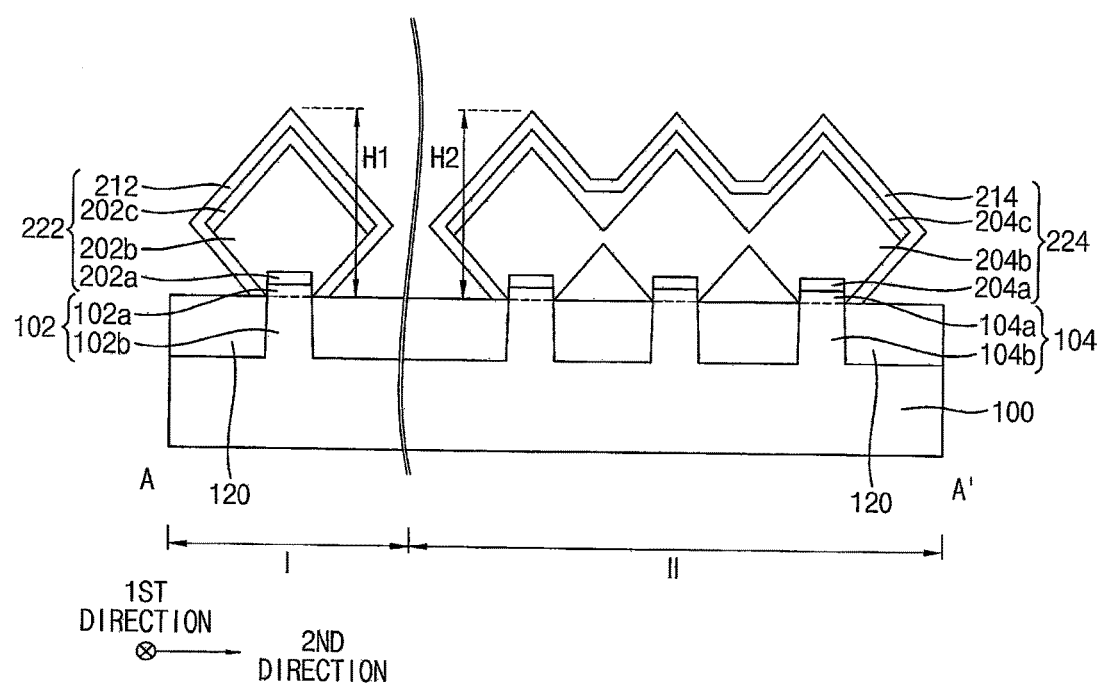
Figure 28:
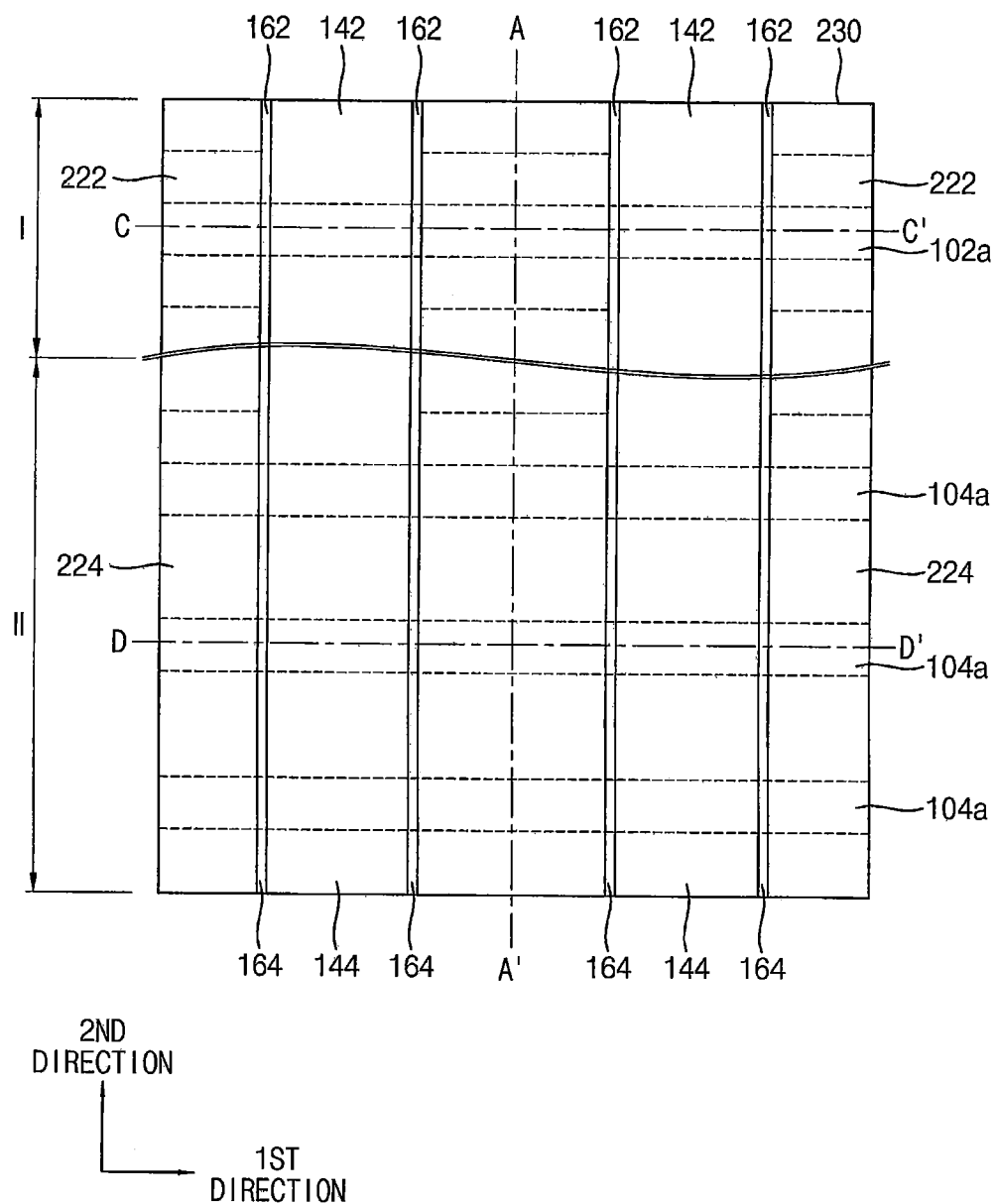
Figure 29:
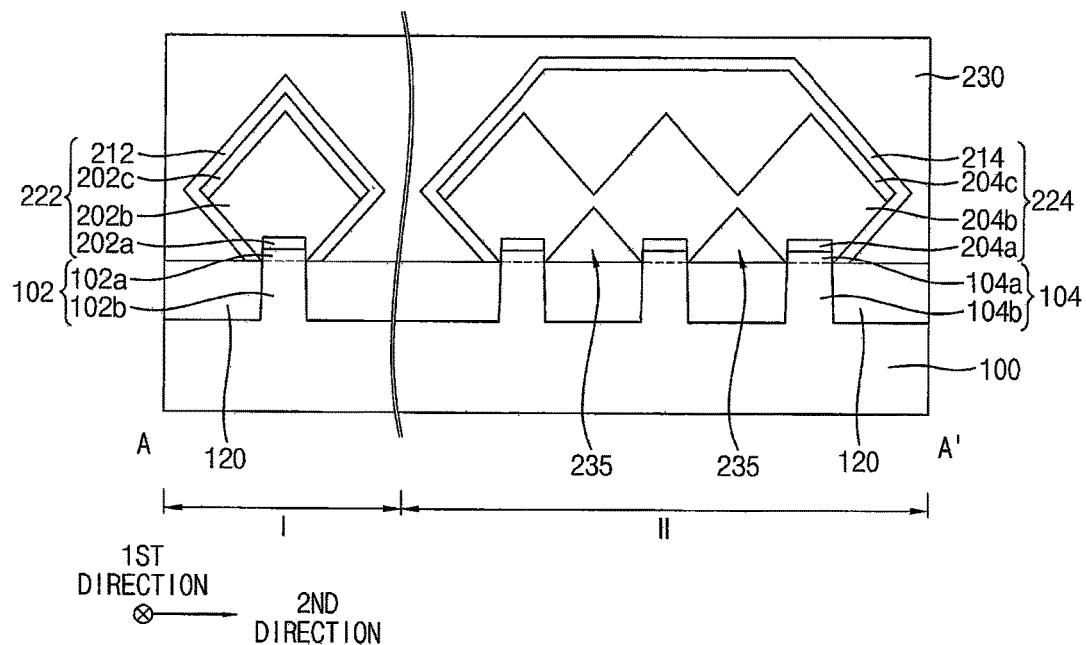
Figure 30:
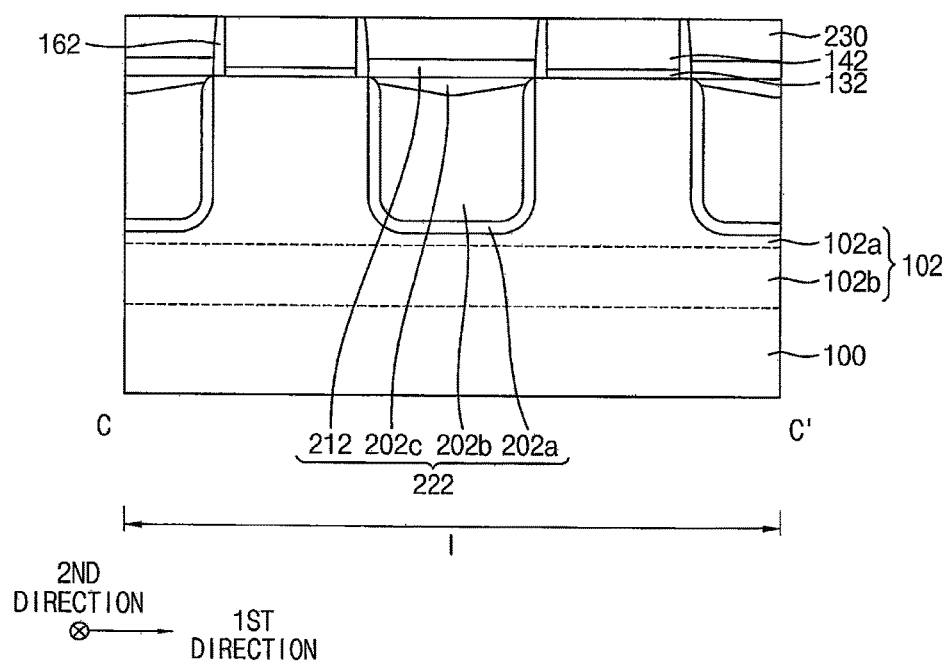
Figure 31:
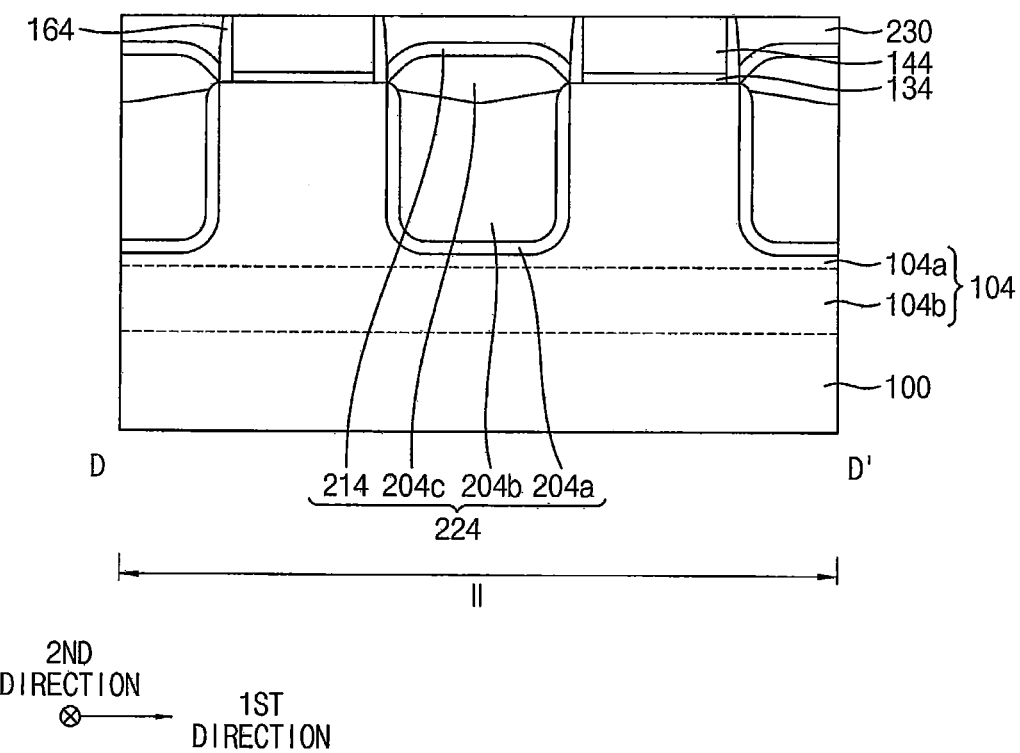
Figure 32:
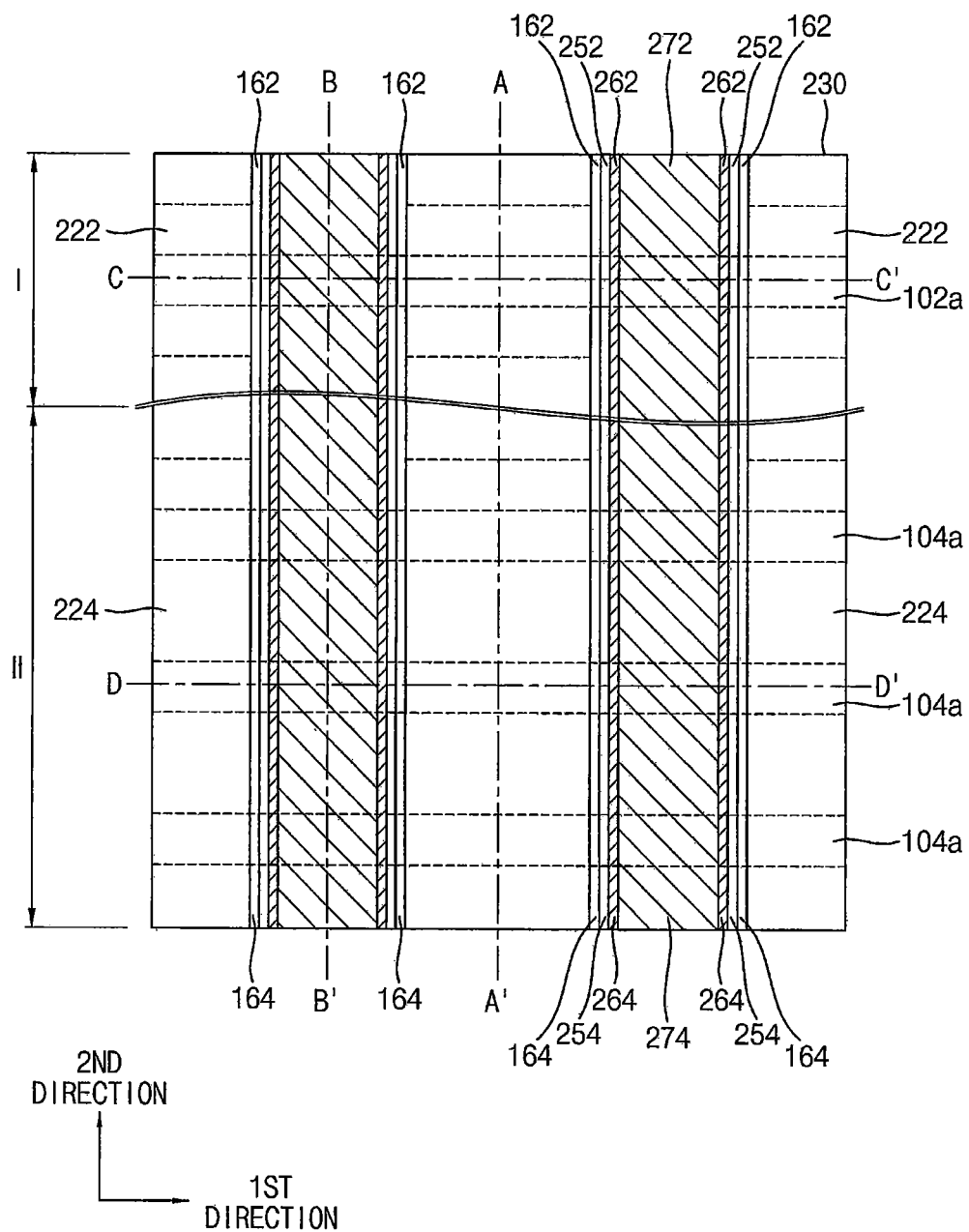

Further, referring to FIG. 27, an upper surface of the sixth semiconductor layer 204c that may be formed by the third SEG process may have a varying height. That is, the sixth semiconductor layer 204c may be conformally formed on the upper surface of the fifth semiconductor layer 204b, except for an area on the upper surface of the fifth semiconductor layer 204b in which the second shapes of the fifth semiconductor layer 204b meet each other. The sixth semiconductor layer 204c having the varying thickness may be formed by performing the third SEG process for a short time period only. Thus, the second height 142 of the top surface of the second source/drain layer structure 224 may be substantially equal to the first height H1 of the top surface of the first source/drain layer structure 222, and the upper surface of the second source/drain layer structure 224 may be bent according to the shape of the upper surface of the fifth semiconductor layer 204b.

The second source/drain layer structure 224 shown in FIG. 27 may be formed to increase a contact area between the second source/drain layer structure 224 and the second contact plug 354 that is subsequently formed so that the contact resistance may be reduced, instead of applying the stress on the channel.

For example, the first to third SEG processes may be performed using a silicon source gas, an etching gas and a carrier gas, and thus a respective single crystalline silicon layer may be formed as the first to sixth semiconductor layers 202a, 202b, 202c, 204a, 204b and 204c. In the first and second SEG processes, e.g., silane ($SiH_4$) gas, disilane ($Si_2H_6$) gas, dichlorosilane ($SiH_2Cl_2$) gas, etc. may be used as the silicon source gas, and in the third SEG process, e.g., silane ($SiH_t$) gas and/or disilane ($Si_2H_6$) gas may be used as the silicon source gas. Additionally, an n-type impurity source gas, e.g., phosphine ($PH_3$) gas may be also used to form a single crystalline silicon layer doped with n-type impurities.

The single crystalline silicon layer may have a lattice constant substantially equal to that of the substrate 100, and thus may not apply a tensile stress on the NMOS transistor. Thus, the second source/drain layer structure 224, i.e., the sixth semiconductor layer 204c may not have a large volume, and thus may be conformally formed on the fifth semiconductor layer 204b having a surface profile similar to that of the fifth semiconductor layer 204b. Accordingly, the upper surface of the second source/drain layer structure 224 may be bent, and a contact area with the second contact plug 354 may increase to reduce the contact resistance.

Hereinafter, for the convenience of explanation, only the first and second source/drain layer structures 222 and 224 serving as the source/drain of the PMOS transistor will be described.

Referring to FIGS. 28 to 31, an insulation layer 230 may be formed on the first and second active fins 102 and 104 and the isolation pattern 120 to cover the first and second dummy gate structures, the first and second gate spacers 162 and 164, and the first and second source/drain layer structures 222 and 224 to a sufficient height, and may be planarized until upper surfaces of the first and second dummy gate electrodes 142 and 144 of the respective first and second dummy gate structures may be exposed. In the planarization process, the first and second dummy gate masks 152 and 154 may be removed, and upper portions of the first and second gate spacers 162 and 164 may be partially removed. A space between the second source/drain layer structure 224 and the isolation pattern 120 may not be filled with the insulation layer 230, and thus an air gap 235 may be formed. The insulation layer 230 may be formed of silicon oxide, e.g., tonen silazene (TOSZ). The planarization process may be performed by a chemical mechanical polishing (CMP) process and/or an etch back process.

Referring to FIGS. 32 to 35, the exposed first and second dummy gate electrodes 142 and 144 and the first and second dummy gate insulation patterns 132 and 134 thereunder may be removed to form first and second openings that expose inner sidewalls of the respective first and second gate spacers 162 and 164 and upper surfaces of the respective first and second active fins 102 and 104. First and second gate structures 282 and 284 may be formed to fill the first and second openings, respectively.

Particularly, after performing a thermal oxidation process on the upper surfaces of the first and second active fins 102 and 104 that are exposed by the respective first and second openings to form first and second interface patterns 242 and 244, respectively, a gate insulation layer and a work function control layer may be sequentially formed on the first and second interface patterns 242 and 244, the isolation pattern 120, the first and second gate spacers 162 and 164, and the insulation layer 230, and a gate electrode layer may be formed on the work function control layer to sufficiently fill remaining portions of the first and second openings.

The gate insulation layer may be formed of a metal oxide having a high dielectric constant, e.g., hafnium oxide, tantalum oxide, zirconium oxide, or the like, by a CVD process or an ALD process. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low electrical resistance, e.g., a metal such as aluminum, copper, tantalum, etc., or a metal nitride thereof. The work function control layer and the gate electrode layer may be formed by an ALD process, a physical vapor deposition (PVD) process, or the like. In some embodiments, a heat treatment process, e.g., a rapid thermal annealing (RTA) process, a spike rapid thermal annealing (spike RTA) process, a flash rapid thermal annealing (flash RTA) process or a laser annealing process may be further performed.

In some embodiments, the first and second interface patterns 242 and 244 may be formed, instead of the thermal oxidation process, by a CVD process, an ALD process, or the like, similarly to the gate insulation layer or the gate electrode layer. In such embodiments, the first and second interface patterns 242 and 244 may be formed not only on the upper surfaces of the respective first and second active fins 102 and 104 but also on the upper surface of the isolation pattern 120 and the inner sidewalls of the respective first and second gate spacers 162 and 164.

The gate electrode layer, the work function control layer, and the gate insulation layer may be planarized until an upper surface of the insulation layer 230 may be exposed to form a first gate insulation pattern 252 and a first work function control pattern 262 sequentially stacked on the first interface pattern 242, the isolation pattern 120, and the inner sidewall of the first gate spacer 162, and a first gate electrode 272 filling a remaining portion of the first opening on the first work function control pattern 262. Additionally, a second gate insulation pattern 254 and a second work function control pattern 264 may be sequentially stacked on the second interface pattern 244, the isolation pattern 120, and the inner sidewall of the second gate spacer 164, and a second gate electrode 274 may be formed to fill a remaining portion of the second opening on the second work function control pattern 264.

Accordingly, bottoms and sidewalls of the first and second gate electrodes 272 and 274 may be covered by the first and second work function control patterns 262 and 264, respectively. In some embodiments, the planarization process may be performed by a CMP process and/or an etch back process.

The first interface pattern 242, the first gate insulation pattern 252, the first work function control pattern 262 and the first gate electrode 272 sequentially stacked may form the first gate structure 282, and the first gate structure 282 together with the first source/drain layer structure 222 may form a first transistor. Additionally, the second interface pattern 244, the second gate insulation pattern 254, the second work function control pattern 264 and the second gate electrode 274 sequentially stacked may form the second gate structure 284, and the second gate structure 284 together with the second source/drain layer structure 224 may form a second transistor. Each of the first and second transistors may be a PMOS transistor or an NMOS transistor according to the conductivity type of each of the first and second source/drain layer structures 222 and 224.

Referring to FIGS. 36 to 39, a third capping layer 290 and an insulating interlayer 300 may be sequentially formed on the insulation layer 230, the first and second gate structures 282 and 284, and the first and second gate spacers 162 and 164. First and second contact holes 312 and 314 may be formed through the insulation layer 230, the third capping layer 290 and the insulating interlayer 300 to expose upper surfaces of the first and second source/drain layer structures 222 and 224, respectively. The third capping layer 290 may be formed of a nitride, e.g., silicon nitride, silicon oxynitride, silicon carbonitride, silicon oxycarbonitride, etc., and the insulating interlayer 300 may be formed of silicon oxide, e.g., tetra ethyl ortho silicate (TEOS).

When the first and second contact holes 312 and 314 are formed, upper surfaces of the first and second source/drain layer structures 222 and 224 may be exposed, and further partially etched. Thus, the first contact hole 312 may extend through the first capping layer 212 and the third semiconductor layer 202c of the first source/drain layer structure 222, and in some cases, may also extend through an upper portion of the second semiconductor layer 202b.

In some embodiments, a semiconductor layer may be described as having a cross-sectional shape that is similar to a hexagon where an upper portion of the shape that was referred to as being similar to a pentagon is removed. Thus the shape that is similar to a hexagon may have five sides, as described with respect to the shape that is similar to a pentagon, and an additional top surface that is adjacent a respective contact hole. As discussed above with respect to the shape that is similar to a pentagon, a bottom side of a shape that is similar to a hexagon may be partially or completely within other structures and the perimeter of the actual cross-sectional shape may contain additional sides of structures that protrude into the shape that is similar to a hexagon.

The second contact hole 314 may extend through the second capping layer 214 and the sixth semiconductor layer 204c of the second source/drain layer structure 224, and in some cases, may also extend through an upper portion of the fifth semiconductor layer 204b. Alternatively, the second contact hole 314 may extend through only the second capping layer 214 and the sixth semiconductor layer 204c of the second source/drain layer structure 224.

In some embodiments, ones of the first and second contact holes 312 and 314 may have a flat bottom, and thus the bottom of ones of the first and second contact holes 312 and 314 may have a constant height. In some embodiments, the first and second contact holes 312 and 314 may have first and second depths D1 and D2, respectively, and the first depth D1 may be greater than the second depth D2. An upper surface of the second source/drain layer structure 224 may be higher than that of the first source/drain layer structure 222, and thus the first contact hole 312 may be formed to the first depth D1 greater than the second depth D2 of the second contact hole 314 due to an etching selectivity between the insulating interlayer 300 and the source/drain layer structures 222 and 224.

FIGS. 36 to 39 show that each of the first and second contact holes 312 and 314 expose a central upper surface of each of the first and second source/drain layer structures 222 and 224 in the first direction, however, the inventive concepts may not be limited thereto. In some embodiments, the first and second contact holes 312 and 314 may be formed to be self-aligned with the first and second gate spacers 162 and 164, respectively, and thus the first and second contact holes 312 and 314 may expose an entire central upper surface of the respective first and second source/drain layer structures 222 and 224.

Figure 40:
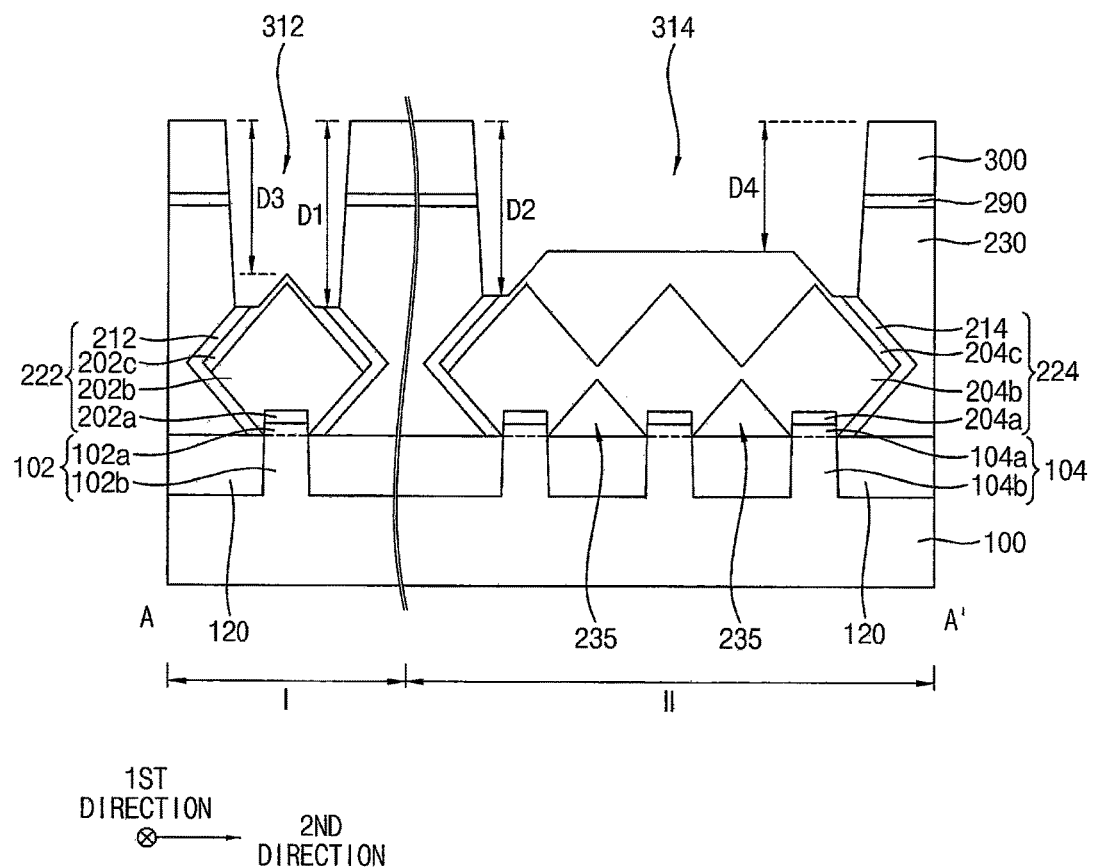
Figure 41:
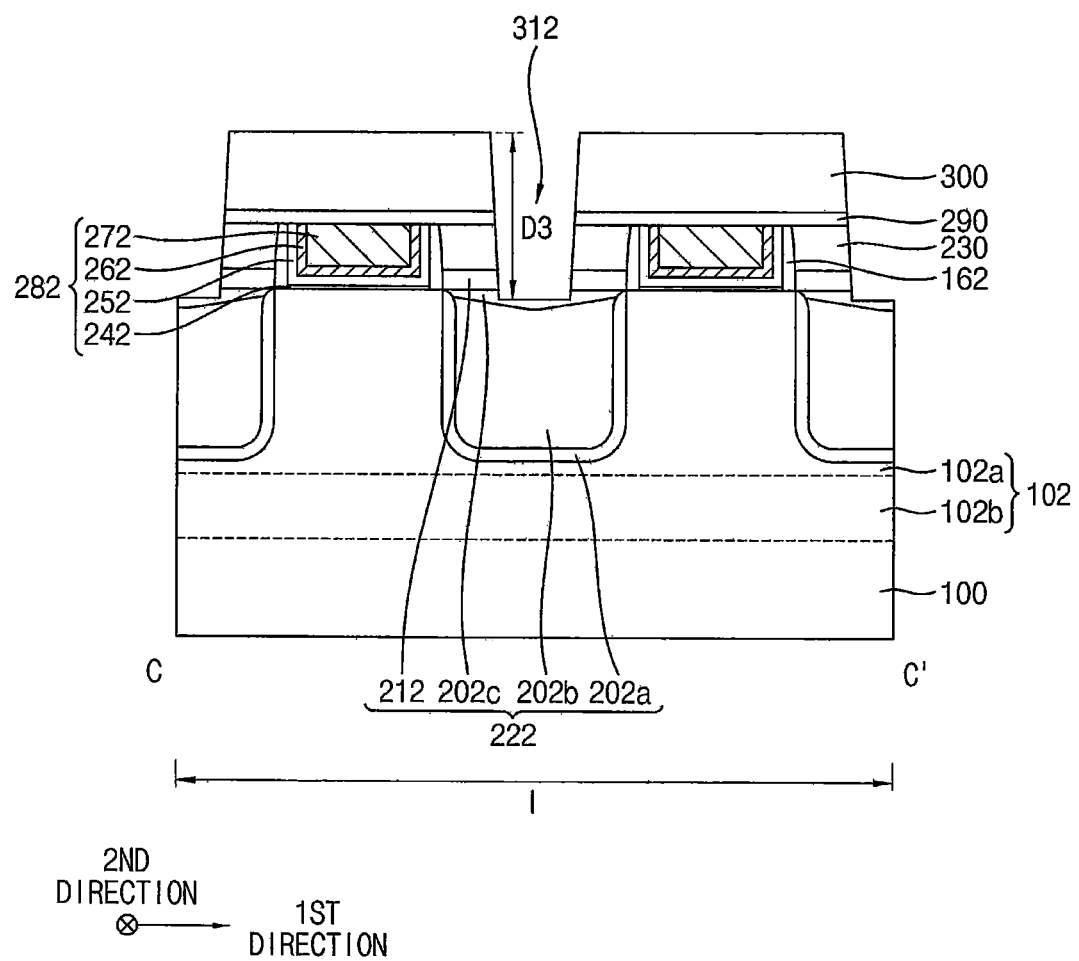
Figure 42:
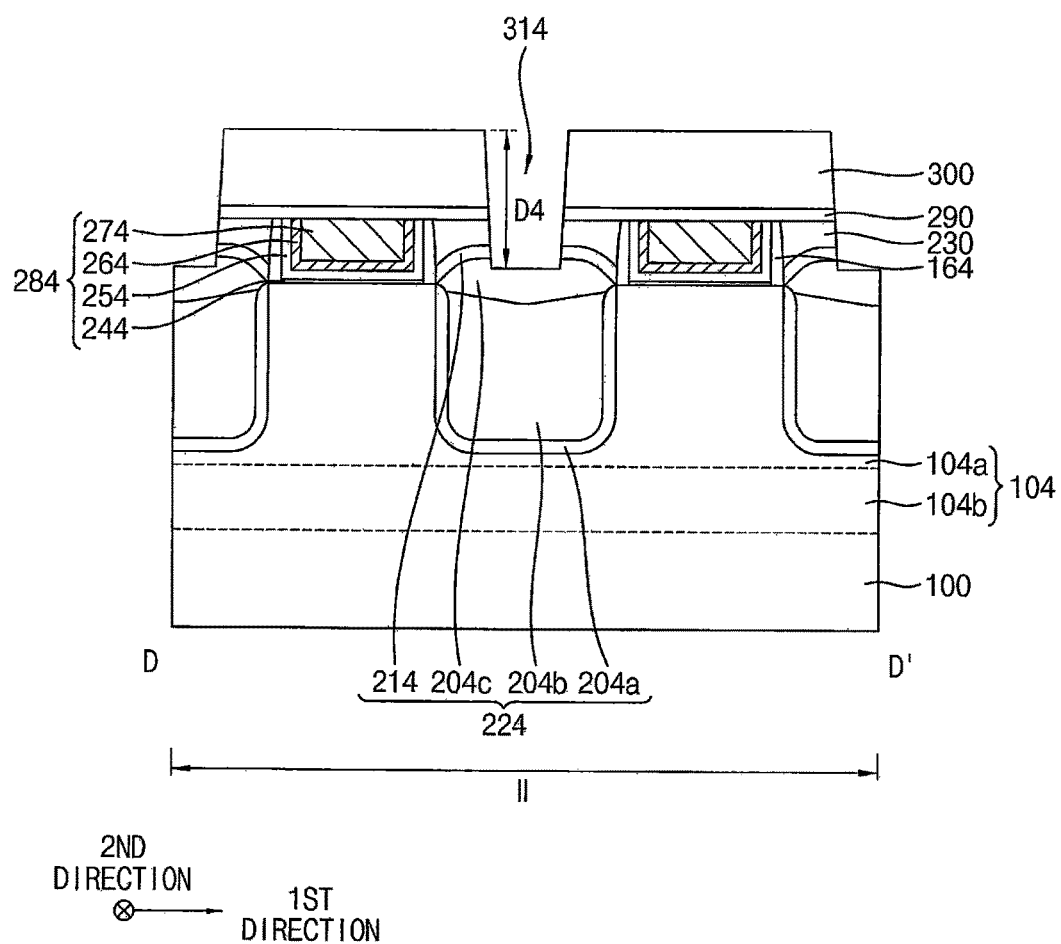
Figure 43:
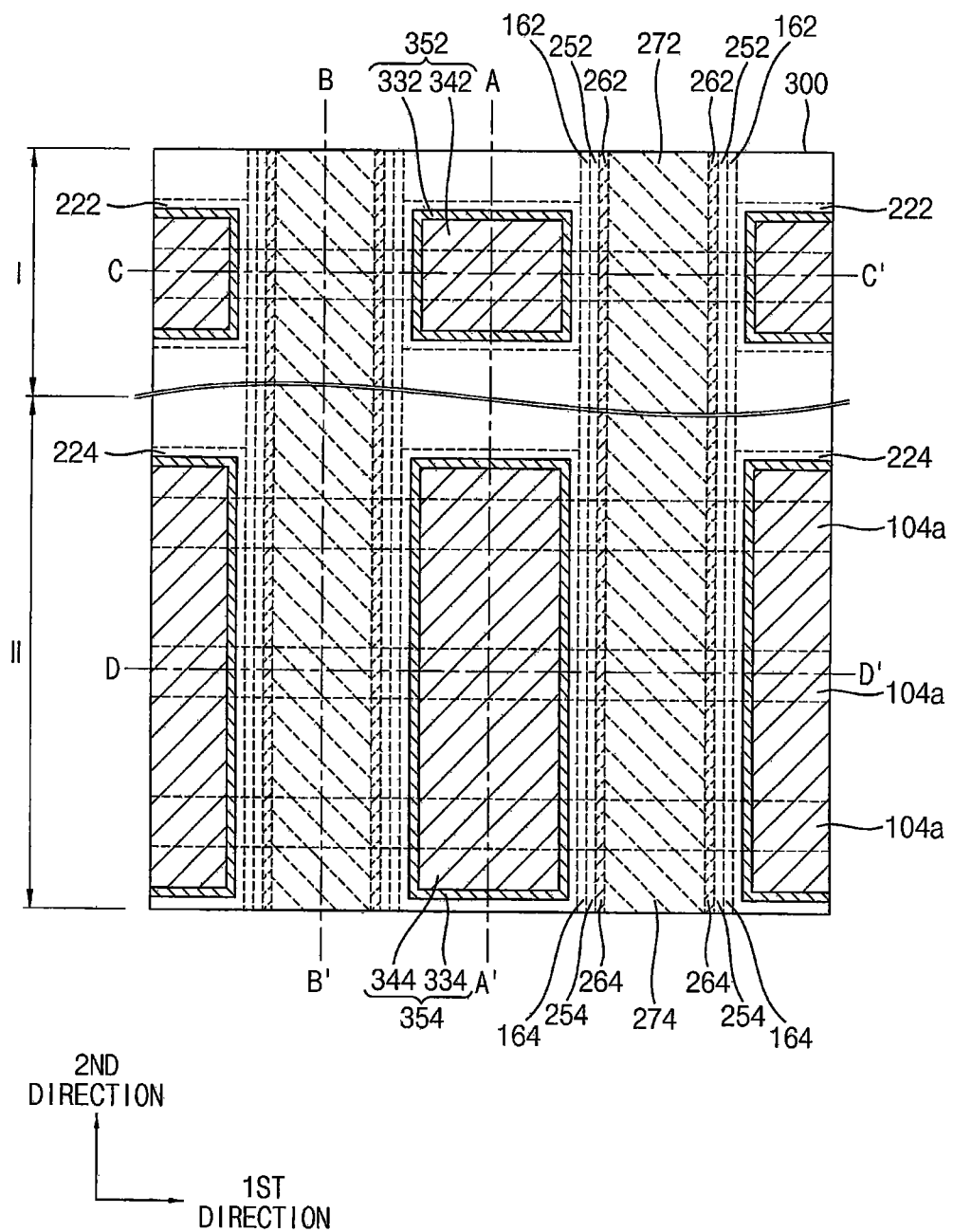
Figure 44:
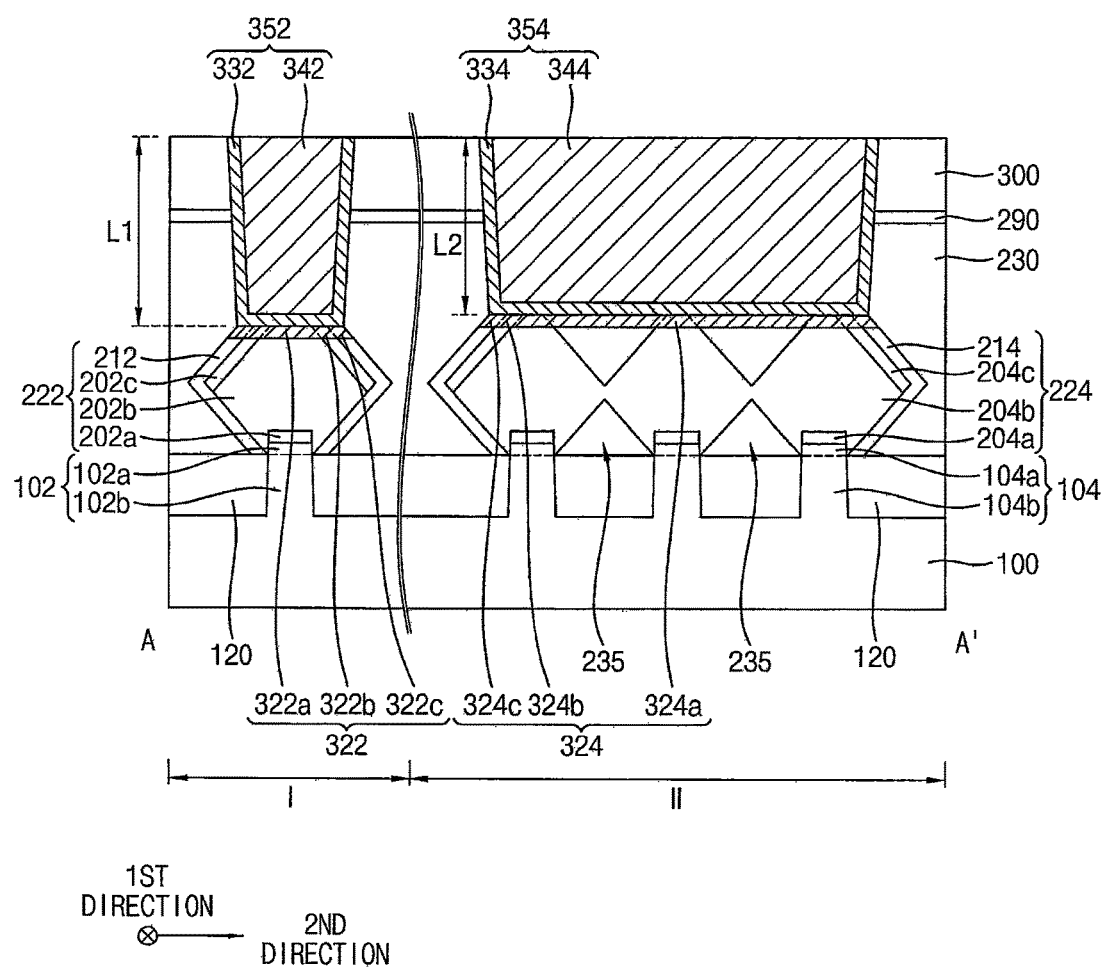

Alternatively, referring to FIGS. 40 to 42, ones of the first and second contact holes 312 and 314 may have a bent bottom, and thus the bottom of ones of the first and second contact holes 312 and 314 may have a varying height. That is, due to an etching selectivity between the insulating interlayer 300 and the source/drain layer structures 222 and 224, the first and second contact holes 312 and 314 may have bottom shapes similar to those of the upper surfaces of the first and second source/drain layer structures 222 and 224, respectively. Thus, in a cross-section taken along the second direction, the bottom of the first contact hole 312 may be bent and a central portion may be higher than edge portions thereof. Additionally, in a cross-section taken along the second direction, a central portion of the bottom of the second contact hole 314 may be higher than edge portions of the bottom of the second contact hole 314, and the central portion may be substantially flat.

The first contact hole 312 may extend through the first capping layer 212 and an upper portion of the third semiconductor layer 202c of the first source/drain layer structure 222, and the second contact hole may extend through the second capping layer 214 and an upper portion of the sixth semiconductor layer 204c of the second source/drain layer structure 224. Alternatively, the first contact hole 312 may extend only through a portion of the first capping layer 212 of the first source/drain layer structure 222, and the second contact hole may extend only through a portion of the second capping layer 214.

In some embodiments, the first depth D1 of the first contact hole 312, which may be a maximum depth of the first contact hole 312, may be greater than the second depth D2 of the second contact hole 314, which may be a maximum depth of the second contact hole 314, and a third depth D3 of the first contact hole 312, which may be a depth from an upper surface of the insulating interlayer 300 to the central top surface of the first source/drain layer structure 222, may be greater than a fourth depth D4 of the second contact hole 314, which may be a depth from the upper surface of the insulating interlayer 300 to the central upper surface of the second source/drain layer structure 224.

Referring to FIGS. 43 to 47, after forming a first metal layer on the exposed upper surfaces of the first and second source/drain layer structures 222 and 224, sidewalls of the first and second contact holes 312 and 314, and the upper surface of the insulating interlayer 300, a heat treatment process may be performed thereon to form first and second metal silicide patterns 322 and 324 on the first and second source/drain layer structures 222 and 224, respectively. An unreacted portion of the first metal layer may be removed. The first metal layer may be formed of a metal, e.g., titanium, cobalt, nickel, etc. The first metal silicide pattern 322 may include first, second and third portions 322a, 322b and 322c, and the second metal silicide pattern 324 may include fourth, fifth and sixth portions 324a, 324b and 324c. Each of the germanium concentration and the p-type impurity concentration in the first metal silicide pattern 322 may gradually increase from the first portion through the second portion to the third portion, and also each of the germanium concentration and the p-type impurity concentration in the second metal silicide pattern 324 may gradually increase from the fourth portion through the fifth portion to the sixth portion.

A barrier layer may be formed on the first and second metal silicide patterns 322 and 324, the sidewalls of the first and second contact holes 312 and 314 and the upper surface of the insulating interlayer 300, a second metal layer may be formed on the barrier layer to fill the first and second contact holes 312 and 314, and the second metal layer and the barrier layer may be planarized until the upper surface of the insulating interlayer 300 may be exposed. Thus, first and second contact plugs 352 and 354 may be formed on the first and second metal silicide patterns 322 and 324 to fill the first and second contact holes 312 and 314, respectively. The barrier layer may be formed of a metal nitride, e.g., titanium nitride, tantalum nitride, tungsten nitride, etc., and the second metal layer may be formed of a metal, e.g., tungsten, copper, etc. The first contact plug 352 may include a first metal pattern 342 and a first barrier pattern 332 covering a bottom and a sidewall thereof, and the second contact plug 354 may include a second metal pattern 344 and a second barrier pattern 334 covering a bottom and a sidewall thereof.

In some embodiments, ones of the first and second contact plugs 352 and 354 may have a flat bottom, and thus the bottom of ones of the first and second contact plugs 352 and 354 may have a constant height. In some embodiments, the first and second contact plugs 352 and 354 may have first and second lengths L1 and L2, respectively, along a direction substantially perpendicular to the upper surface of the substrate 100, and the first length L1 may be greater than the second length L2. A wiring and a via may be further formed to be electrically connected to the first and second contact plugs 352 and 354 to complete the semiconductor device.

Figure 48:
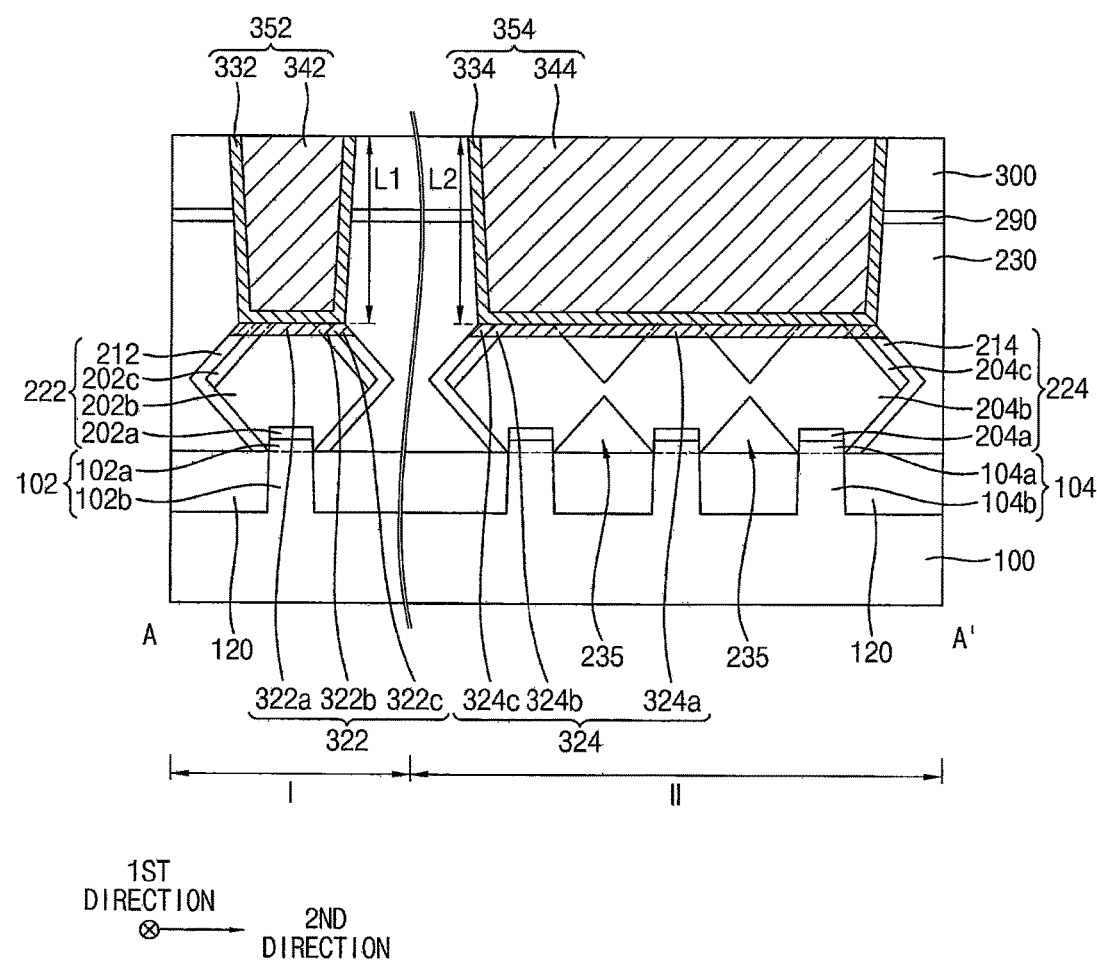
Figure 49:
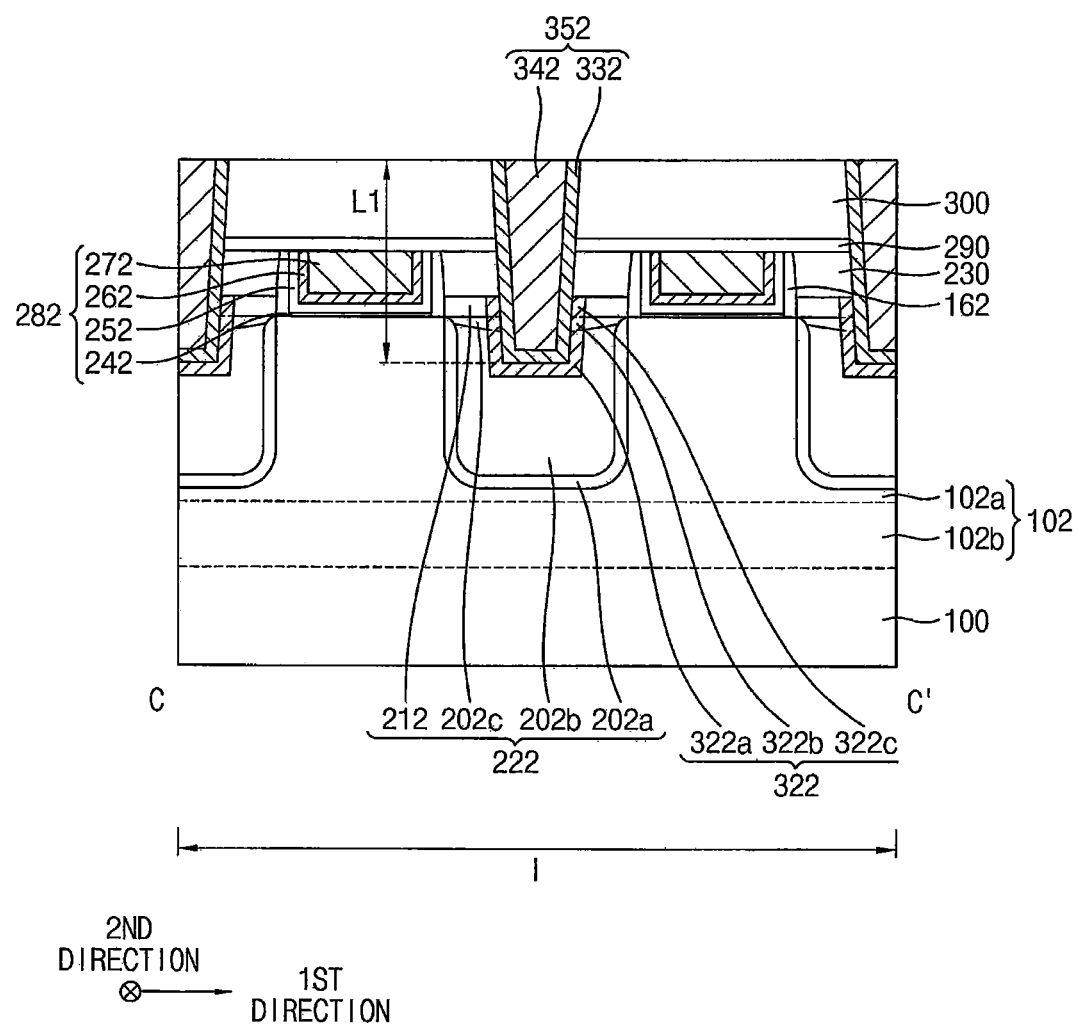
Figure 50:
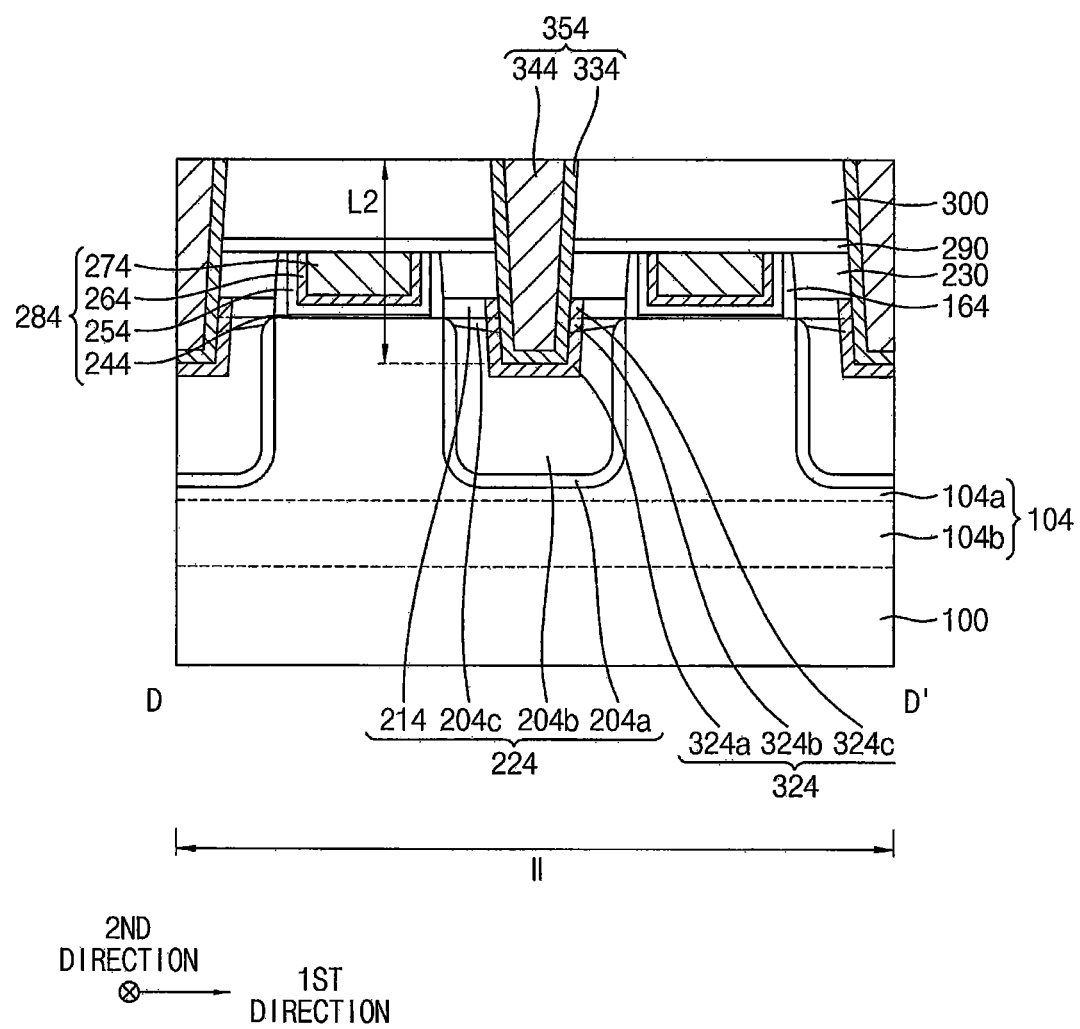

FIGS. 48 to 50 show that the first and second contact plugs 352 and 354 may be formed on the first and second source/drain layer structures 222 and 224, respectively, that are described with reference to FIGS. 25 and 26. For example, the top surface of the first source/drain layer structure 222 may be substantially coplanar with the upper surface of the second source/drain layer structure 224, and thus the first and second lengths L1 and L2 of the respective first and second contact plugs 352 and 354 contacting the first and second source/drain layer structures 222 and 224, respectively, may be substantially equal to each other.

Figure 51:
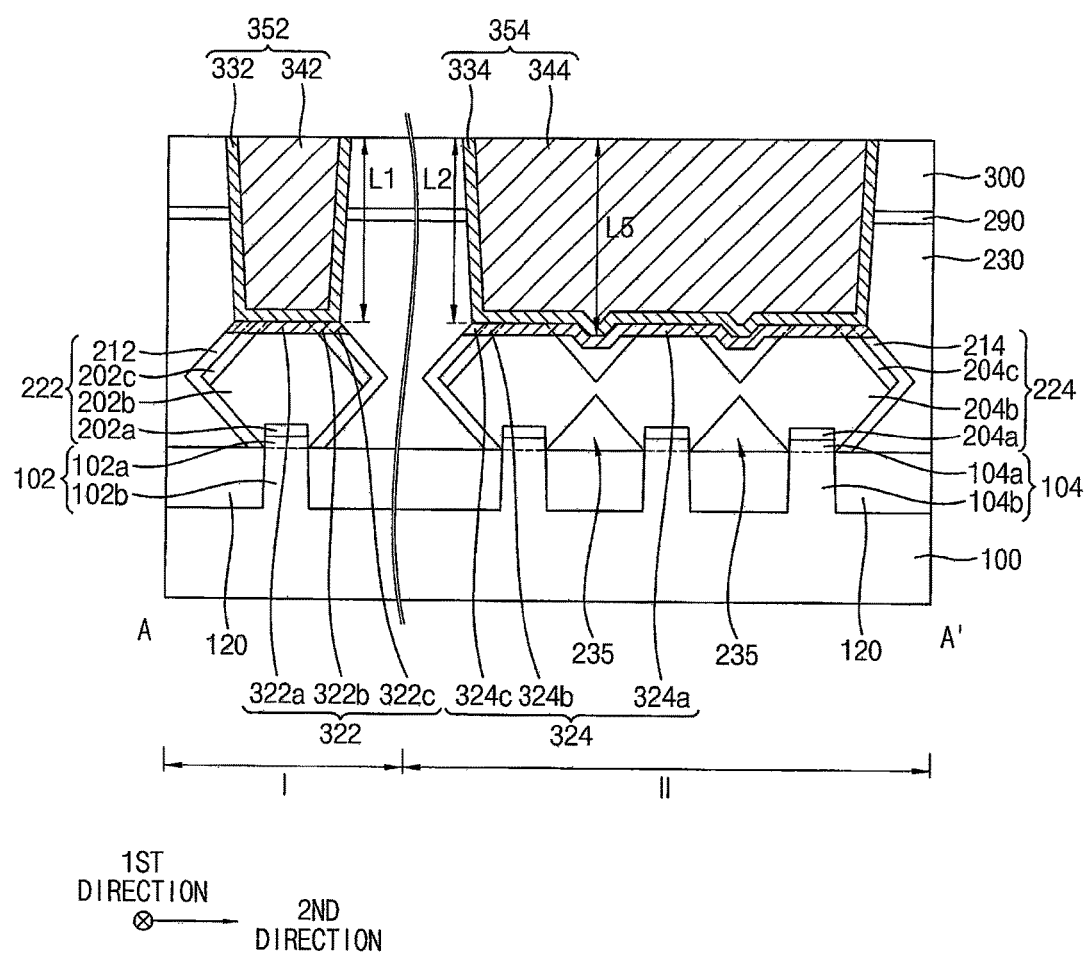
Figure 52:
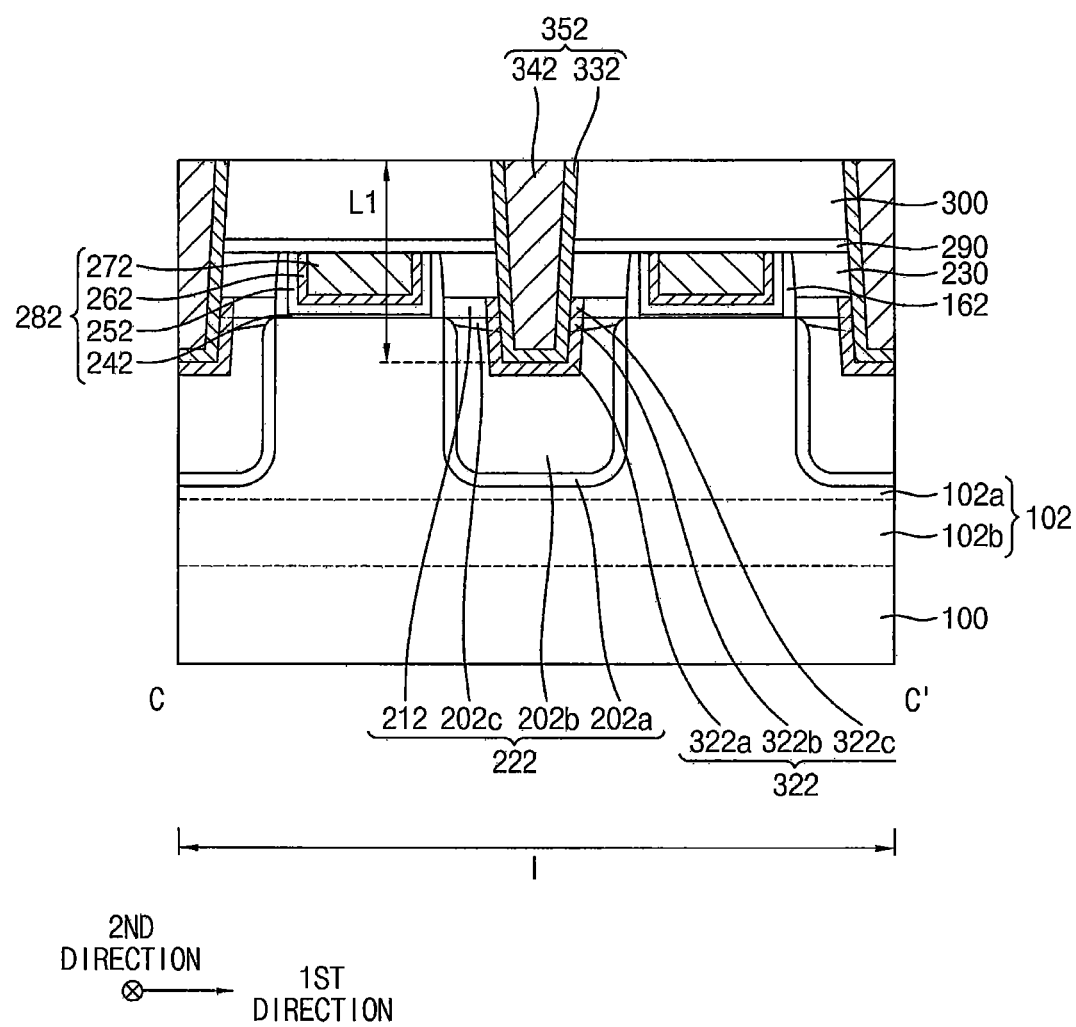
Figure 53:
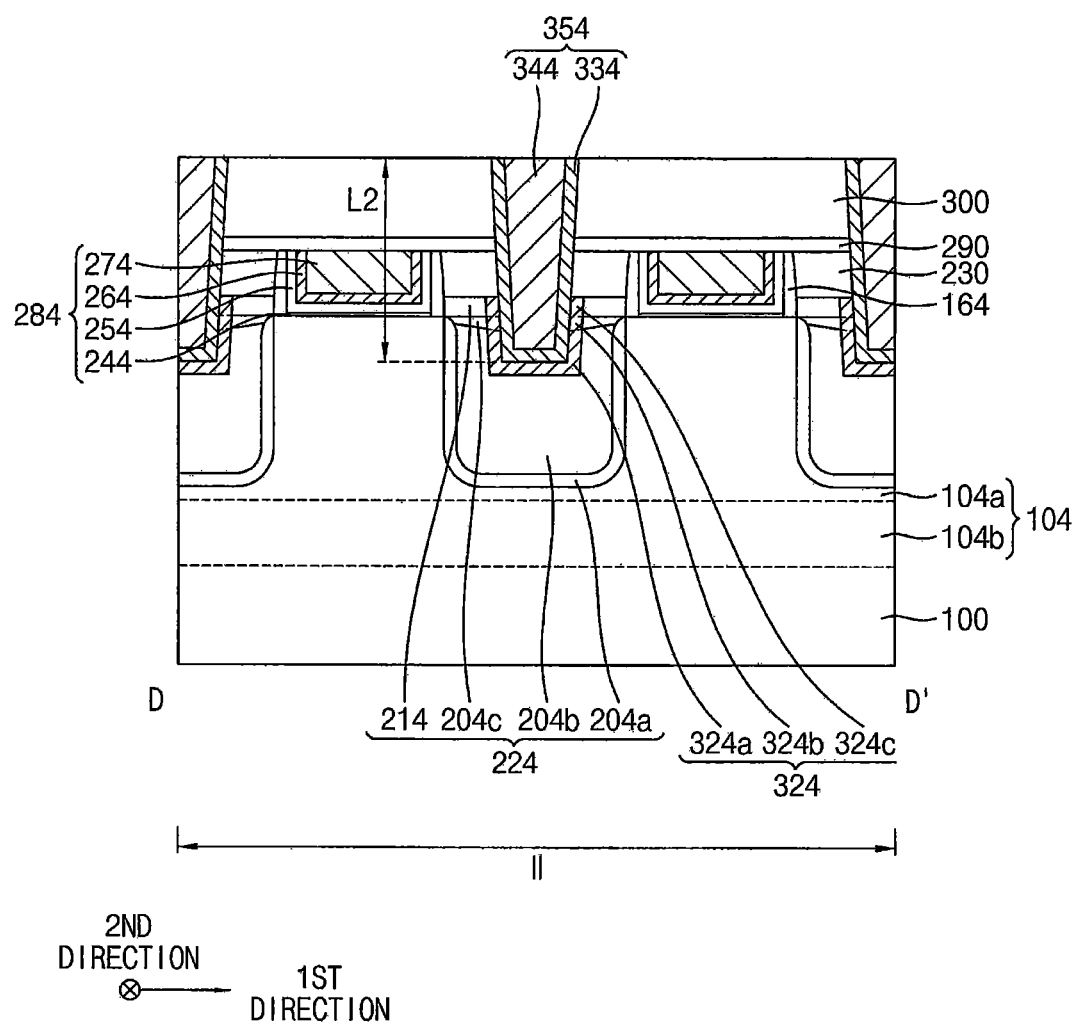

FIGS. 51 to 53 show that the first and second contact plugs 352 and 354 may be formed on the first and second source/drain layer structures 222 and 224, respectively, that are described with reference to FIG. 27. For example, the top surface of the second source/drain layer structure 224 may be substantially coplanar with the top surface of the first source/drain layer structure 222. However, the upper surface of the second source/drain layer structure 224 may have a varying height. Thus, the second length L2 of the second contact plug 354 contacting the second source/drain layer structure 224 may be similar to the first length L1 of the first contact plug 352 contacting the first source/drain layer structure 222, however, the second contact plug 354 may have a fifth length L5 greater than the first length L1 at a portion thereof. The upper surface of the second source/drain layer structure 224 and the bottom of the second contact plug 354 may be bent, and thus the contact area between the second source/drain layer structure 224 and the second contact plug 354 may increase to reduce the contact resistance.

Figure 54:
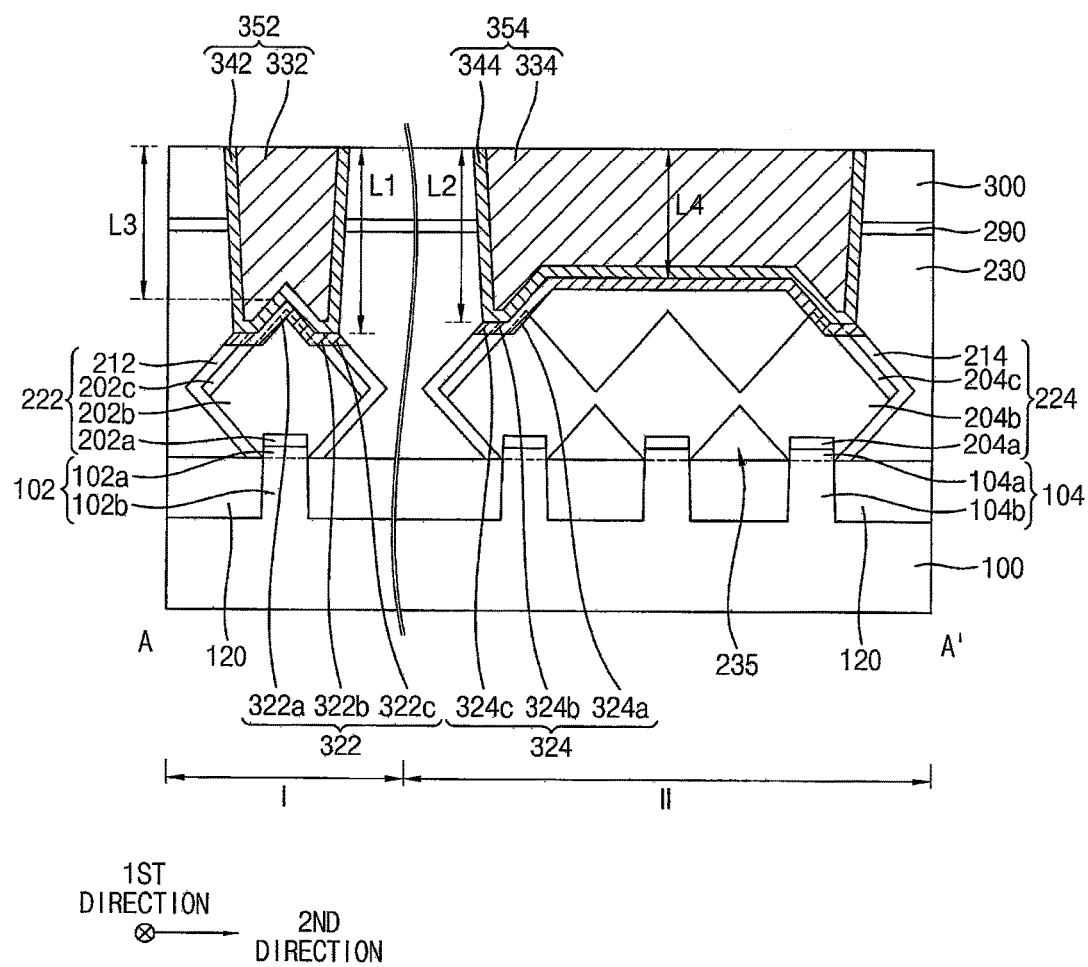
Figure 55:
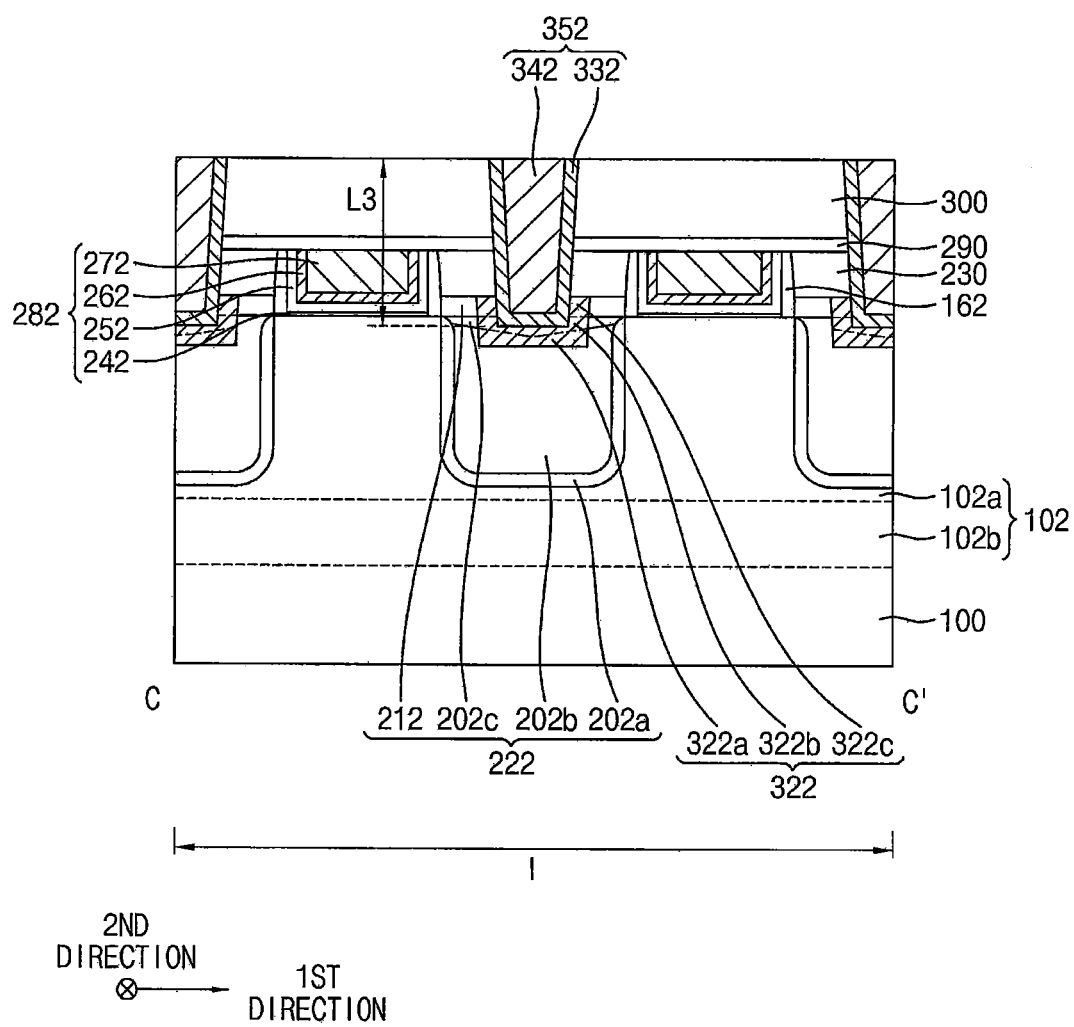
Figure 56:
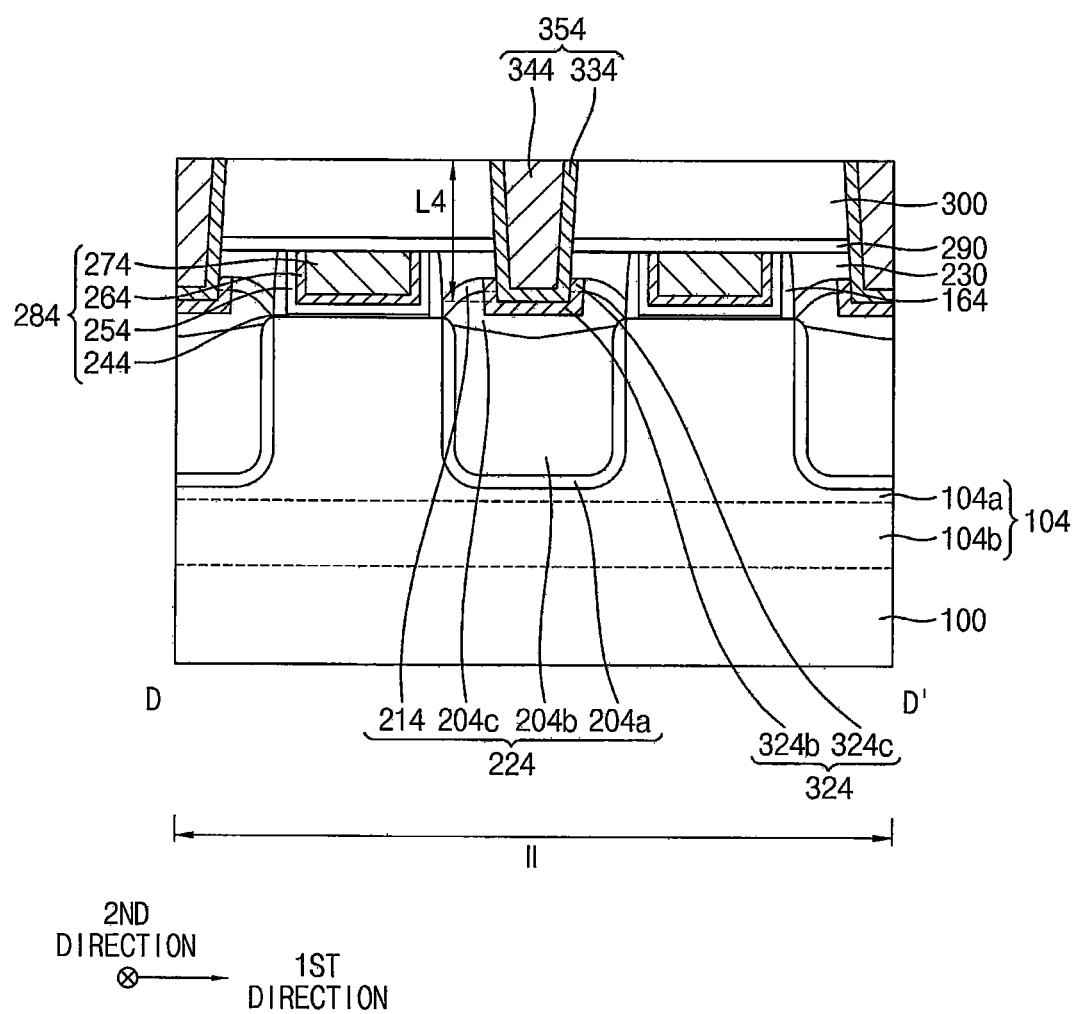

FIGS. 54 to 56 show the first and second contact plugs 352 and 354 filling the first and second contact holes 312 and 314, respectively. Thus, ones of the first and second contact plugs 352 and 354 may have a bent bottom, and the bottom of ones of the first and second contact plugs 352 and 354 may have a varying height. In some embodiments, in a cross-section taken along the second direction, the bottom of the first contact plug 352 may be bent and have a central portion higher than edge portions thereof, and in a cross-section taken along the second direction, the bottom of the second contact plug 354 may have a flat central portion higher than edge portions thereof.

In some embodiments, the first length L1 of the first contact plug 352, which may be the maximum length of the first contact plug 352, may be greater than the second length L2, which may be the maximum length of the second contact plug 354, and a third length L3 of the first contact plug 352, which may be a length of the first contact plug 352 from an upper surface thereof to the central upper surface of the first source/drain layer structure 222, may be greater than a fourth length L4 of the second contact plug 354, which may be a length of the second contact plug 354 from an upper surface thereof to the central upper surface of the second source/drain layer structure 224.

Figure 57:
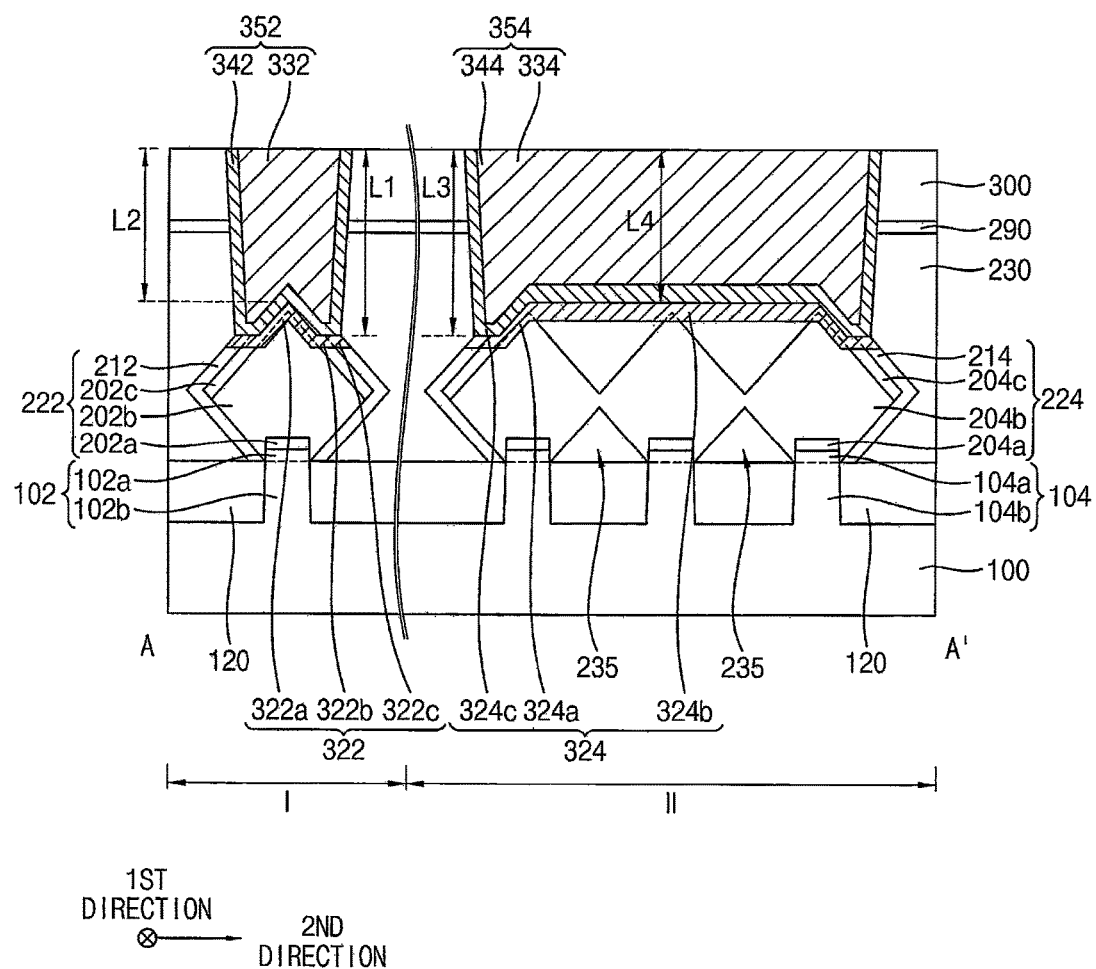

FIGS. 57 and 58 show the first and second contact plugs 352 and 354 filling the first and second contact holes 312 and 314, respectively, that are described with reference to FIGS. 40 to 42 that may expose the upper surfaces of the first and second source/drain layer structures 222 and 224 that are described with reference to FIGS. 25 and 26. In some embodiments, the first length L1 of the first contact plug 352, which may be the maximum length of the first contact plug 352, may be substantially equal to the second length L2, which may be the maximum length of the second contact plug 354, and the third length L3 of the first contact plug 352, which may be the length of the first contact plug 352 from the upper surface thereof to the central upper surface of the first source/drain layer structure 222, may be substantially equal to the fourth length L4 of the second contact plug 354, which may be the length of the second contact plug 354 from the upper surface thereof to the central upper surface of the second source/drain layer structure 224.

FIG. 59 shows a semiconductor device including the isolation pattern 120 that is described with reference to FIG. 16.

As described above, in the method of manufacturing the semiconductor device, when the first and second source/drain layer structures 222 and 224 are formed in the first and second regions I and II, respectively, of the substrate 100, the SEG process may be performed using silane ($SiH_4$) gas and/or disilane ($Si_2H_6$) gas as a silicon source gas under proper process conditions so that the third and sixth semiconductor layers 202c and 204c may be formed on the second and fifth semiconductor layers 202b and 204b, respectively. Thus, the horizontal growth of the third and sixth semiconductor layers 202c and 204c may be prevented. Accordingly, the first source/drain layer structures 222 that may be formed on neighboring ones of the first active fins 102 may not be merged with each other, and the second source/drain layer structure 224 commonly contacting the upper surfaces of neighboring ones of the second active fins 104 may have a desired volume. Thus, the electrical failure of the first transistors, e.g., pull-up transistors of an SRAM device may be prevented in the first region I, while a proper stress may be applied to a channel of the second transistor and the second transistor may have good performance.

FIGS. 60 to 100 are plan views and cross-sectional views schematically illustrating intermediate operations of methods of manufacturing semiconductor devices according to some embodiments. Particularly, FIGS. 60, 62, 65, 69, 73, 78, 84, 89 and 94 are plan views, and FIGS. 61, 63-64, 66-68, 70-72, 74-77, 79-83, 85-88, 90-93 and 95-100 are cross-sectional views.

Figure 63:
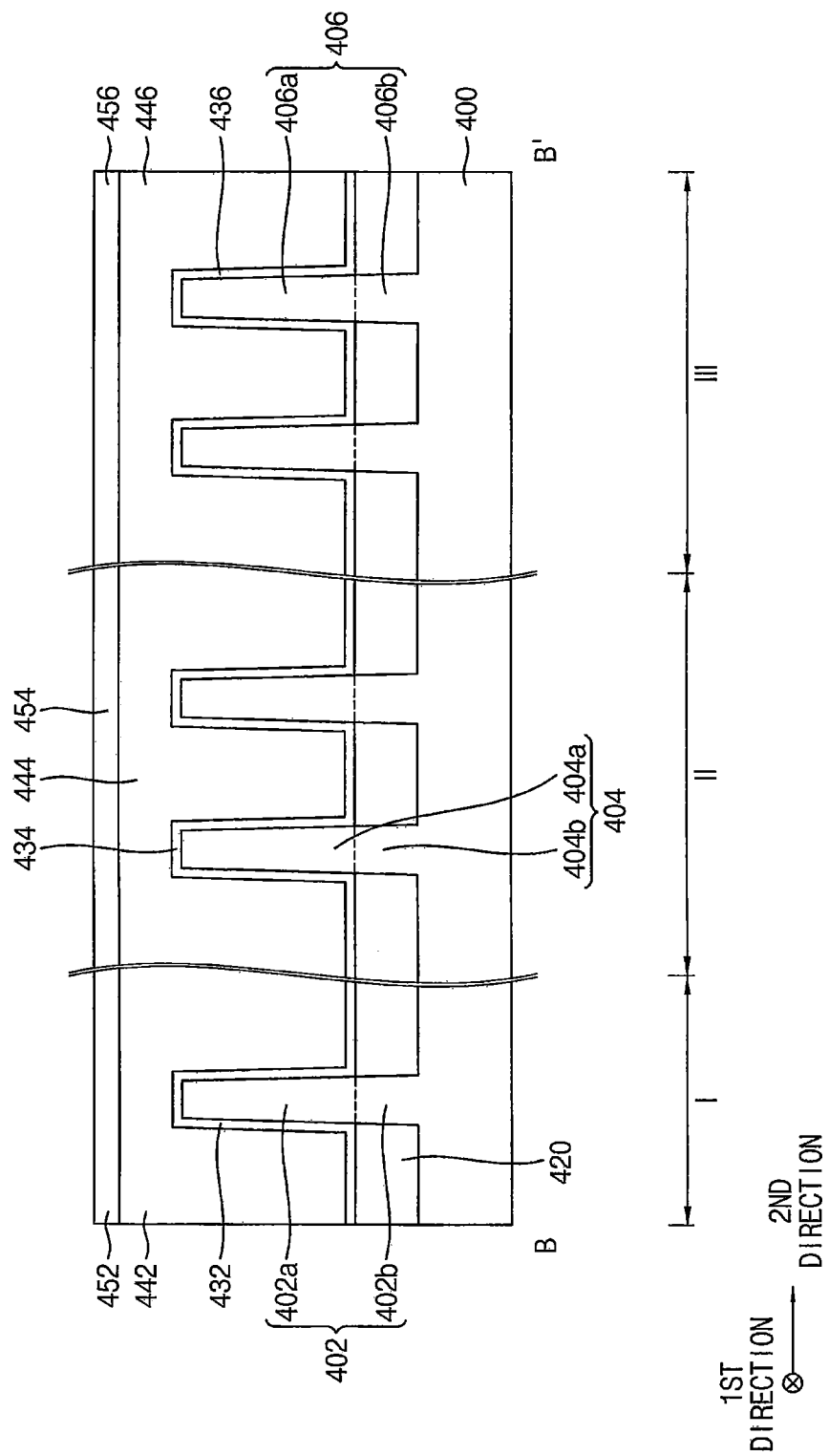
Figure 85:
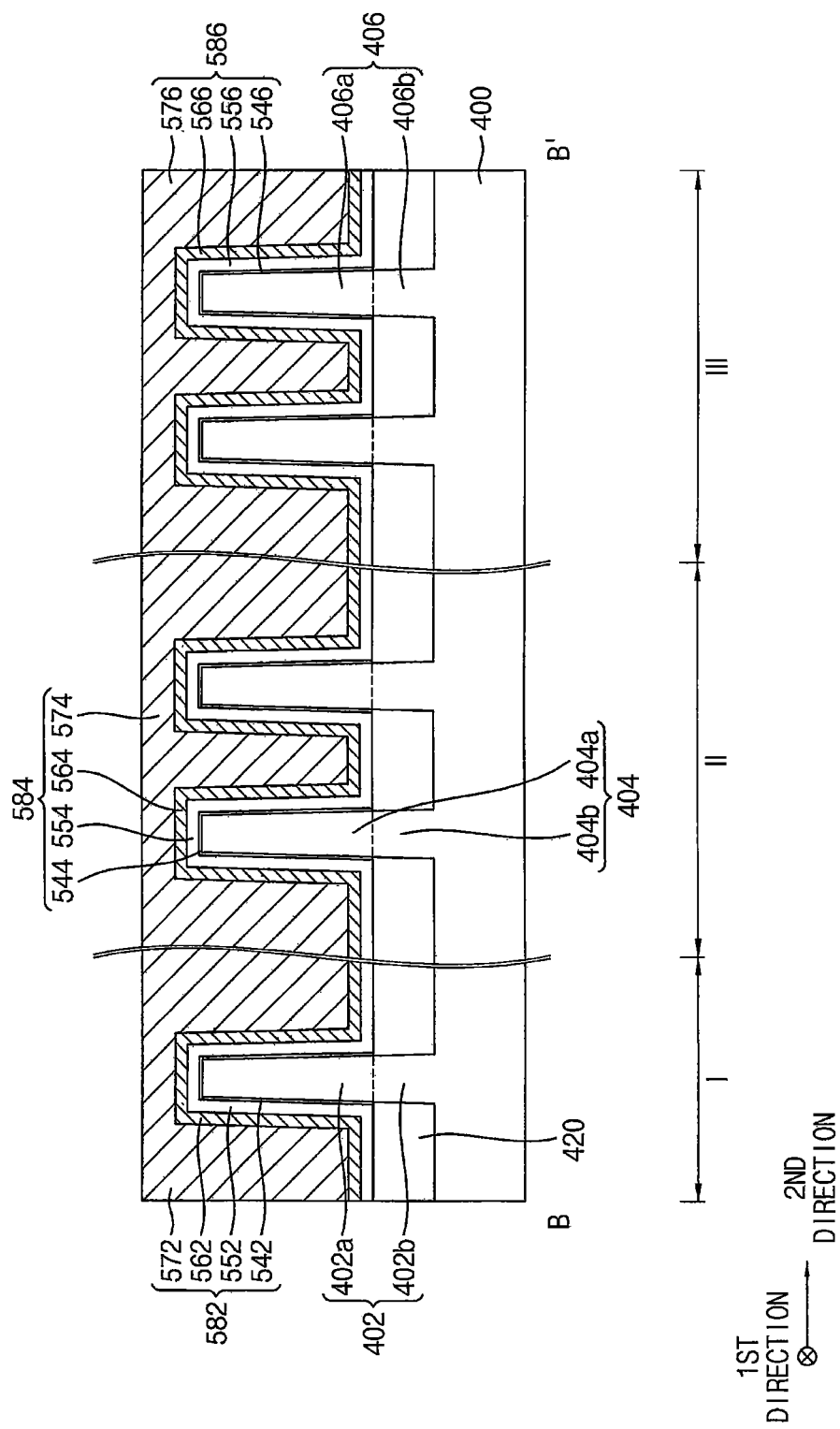
Figure 86:
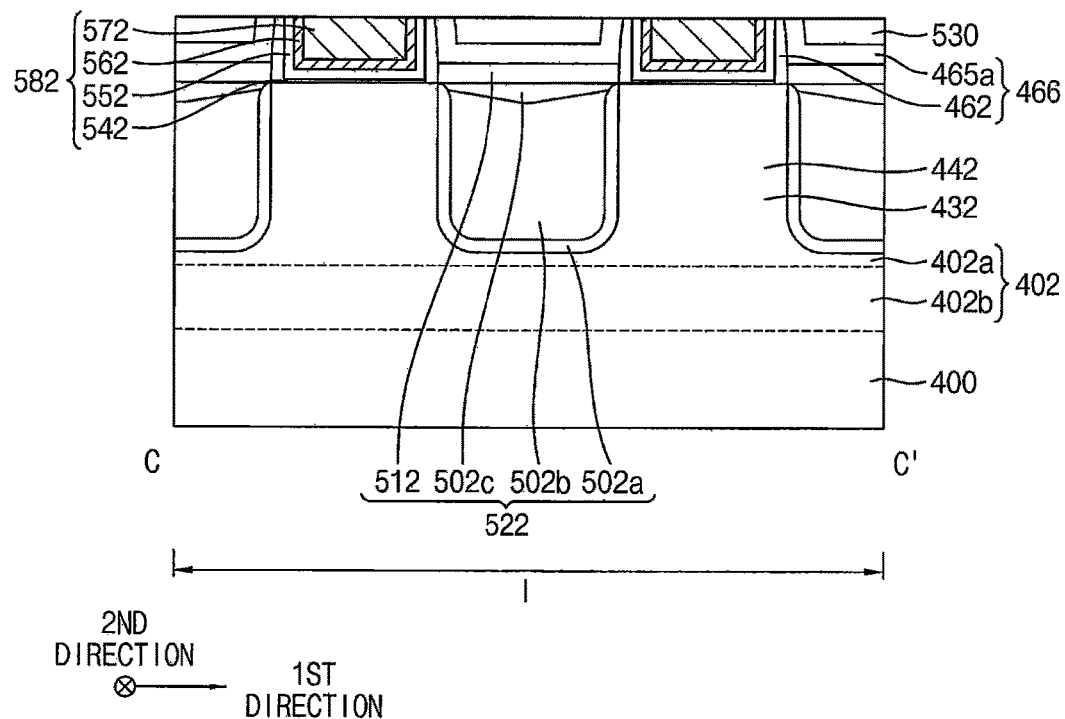
Figure 87:
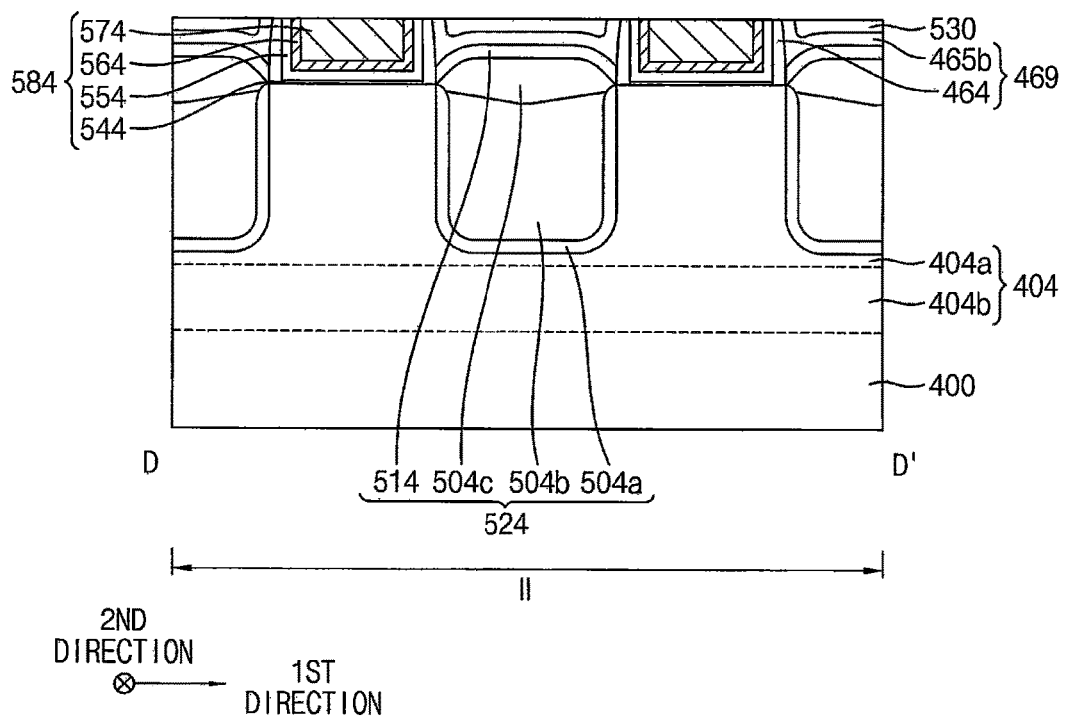
Figure 88:
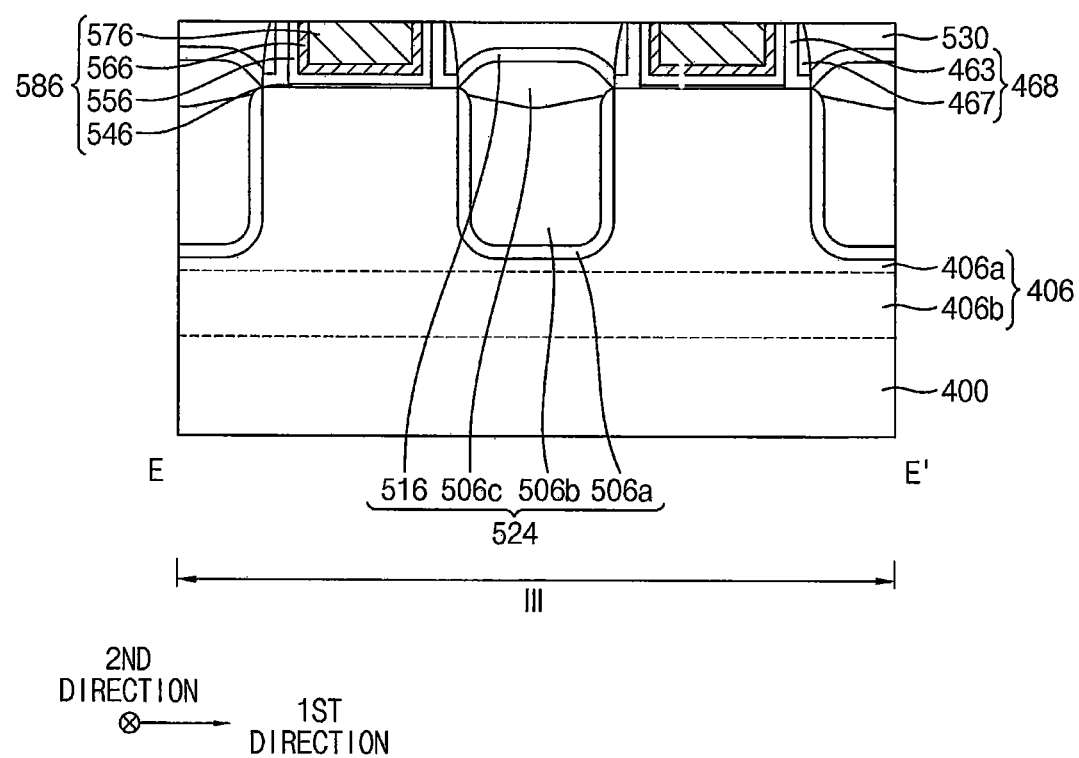
Figure 89:
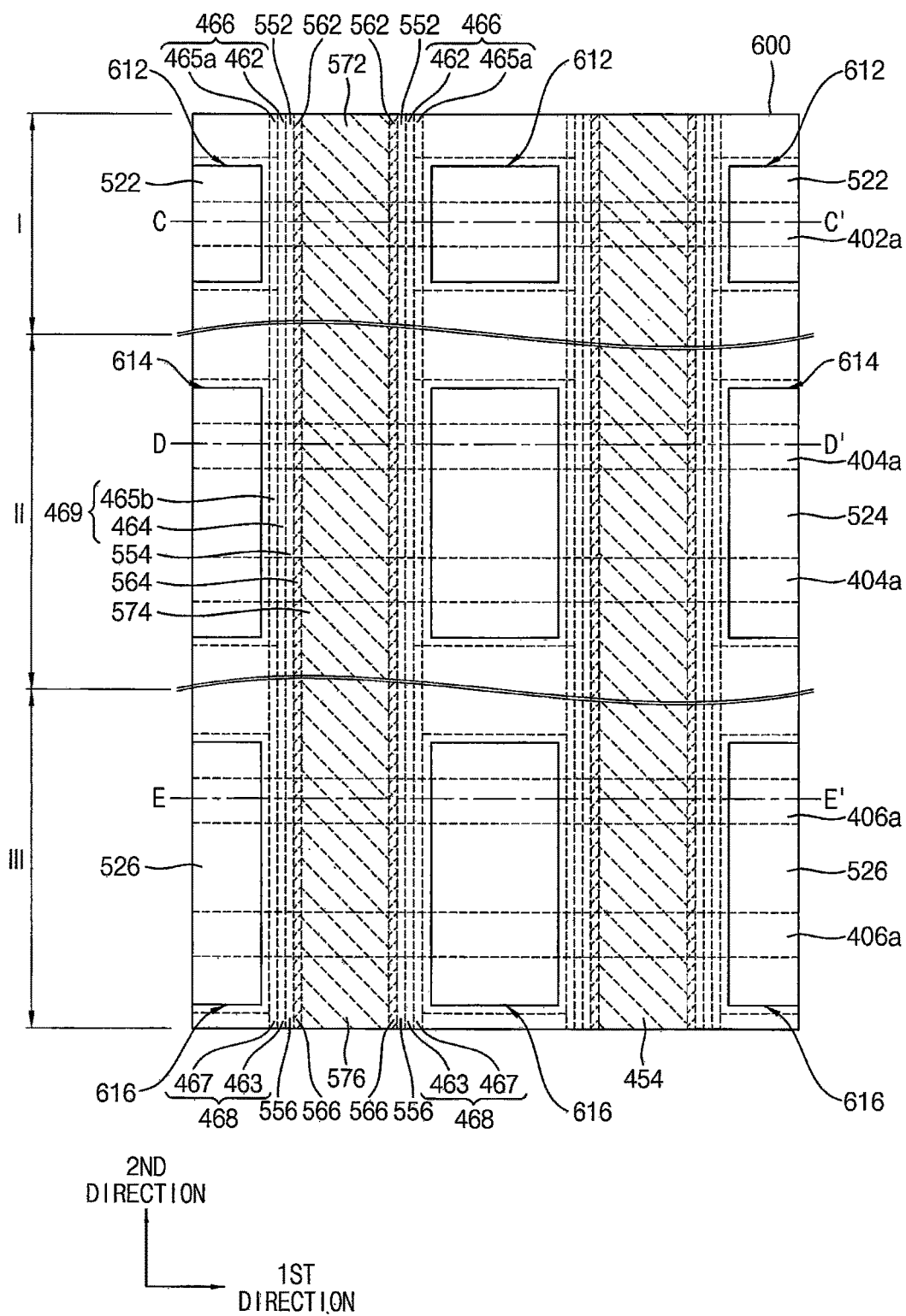
Figure 90:
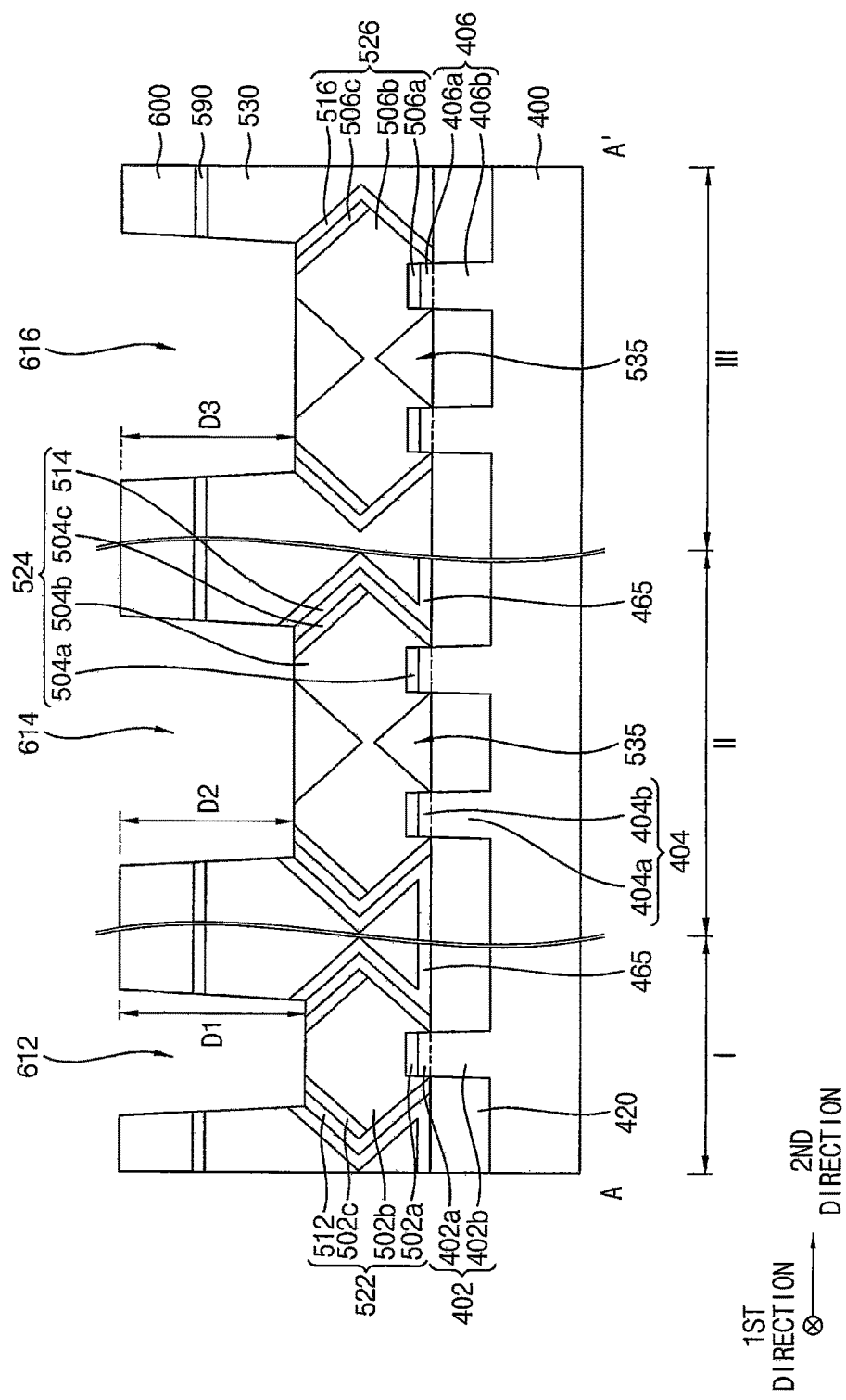
Figure 91:
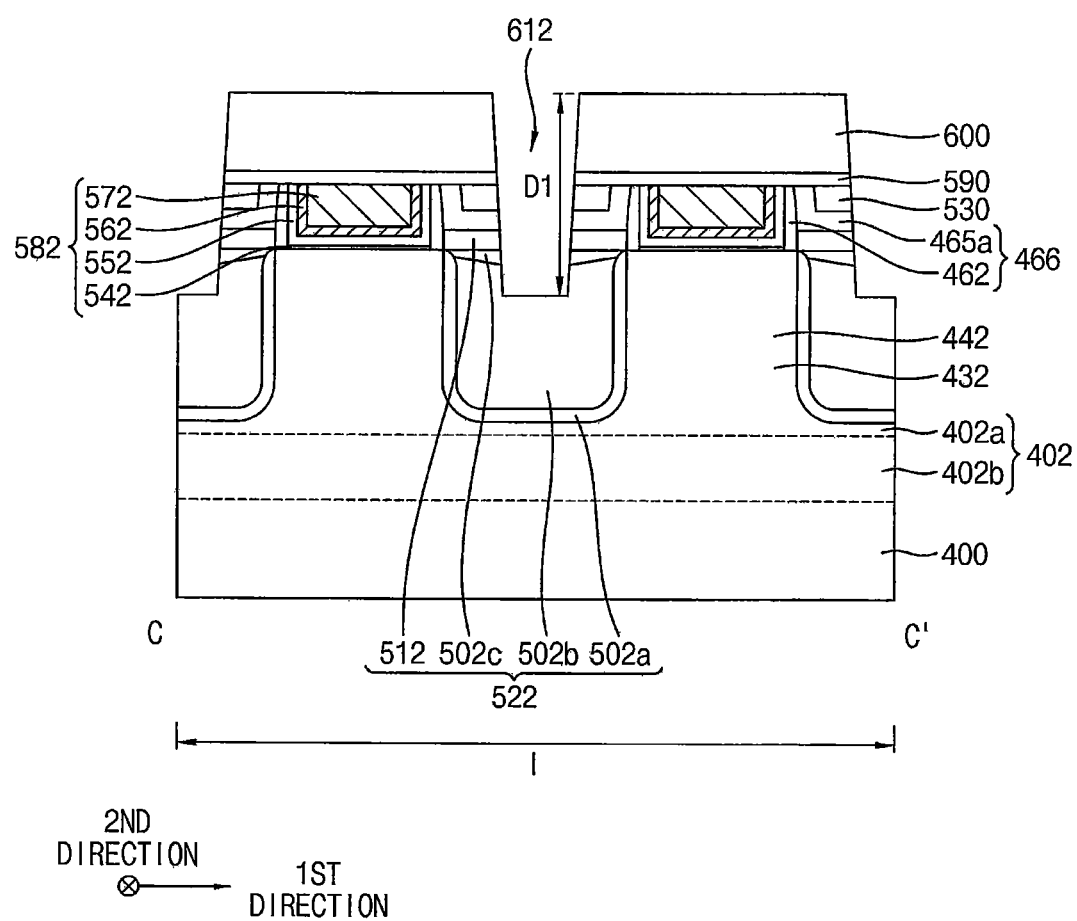
Figure 92:
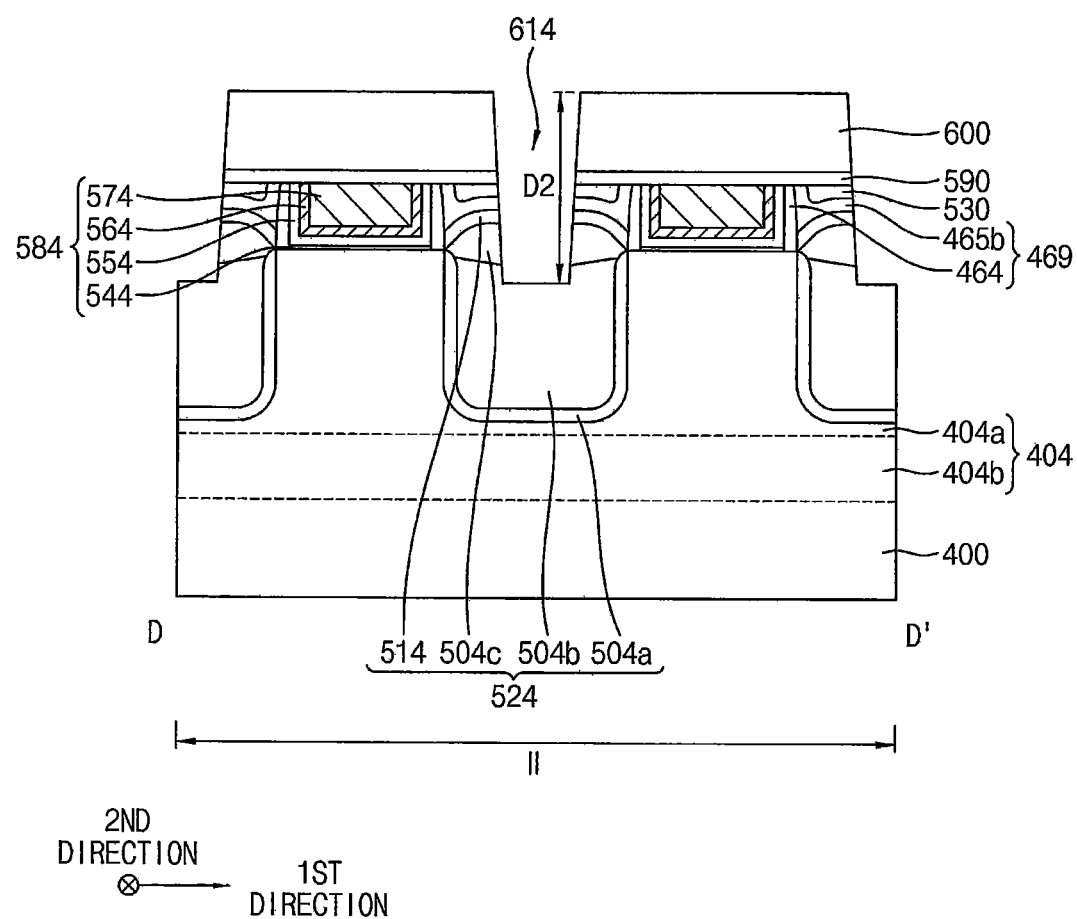
Figure 93:
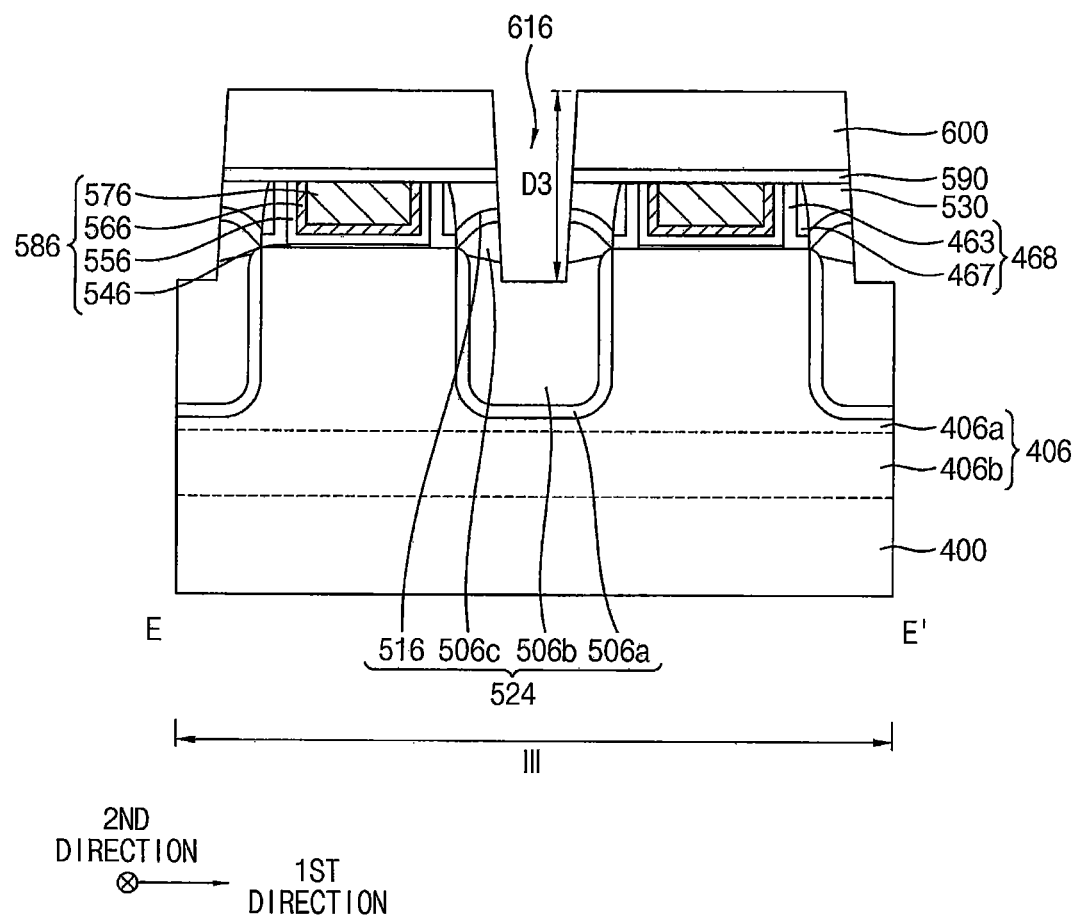
Figure 94:
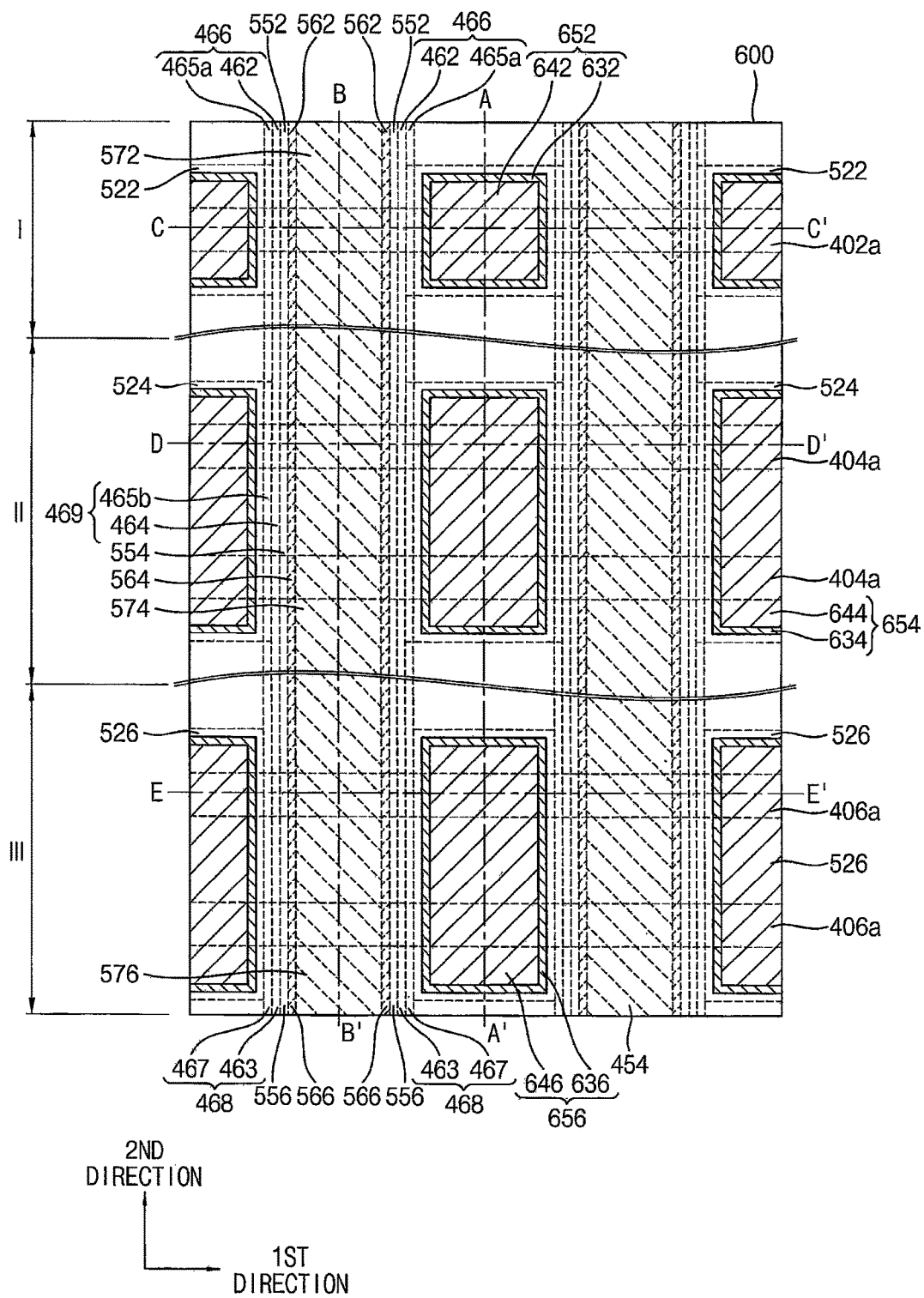
Figure 95:
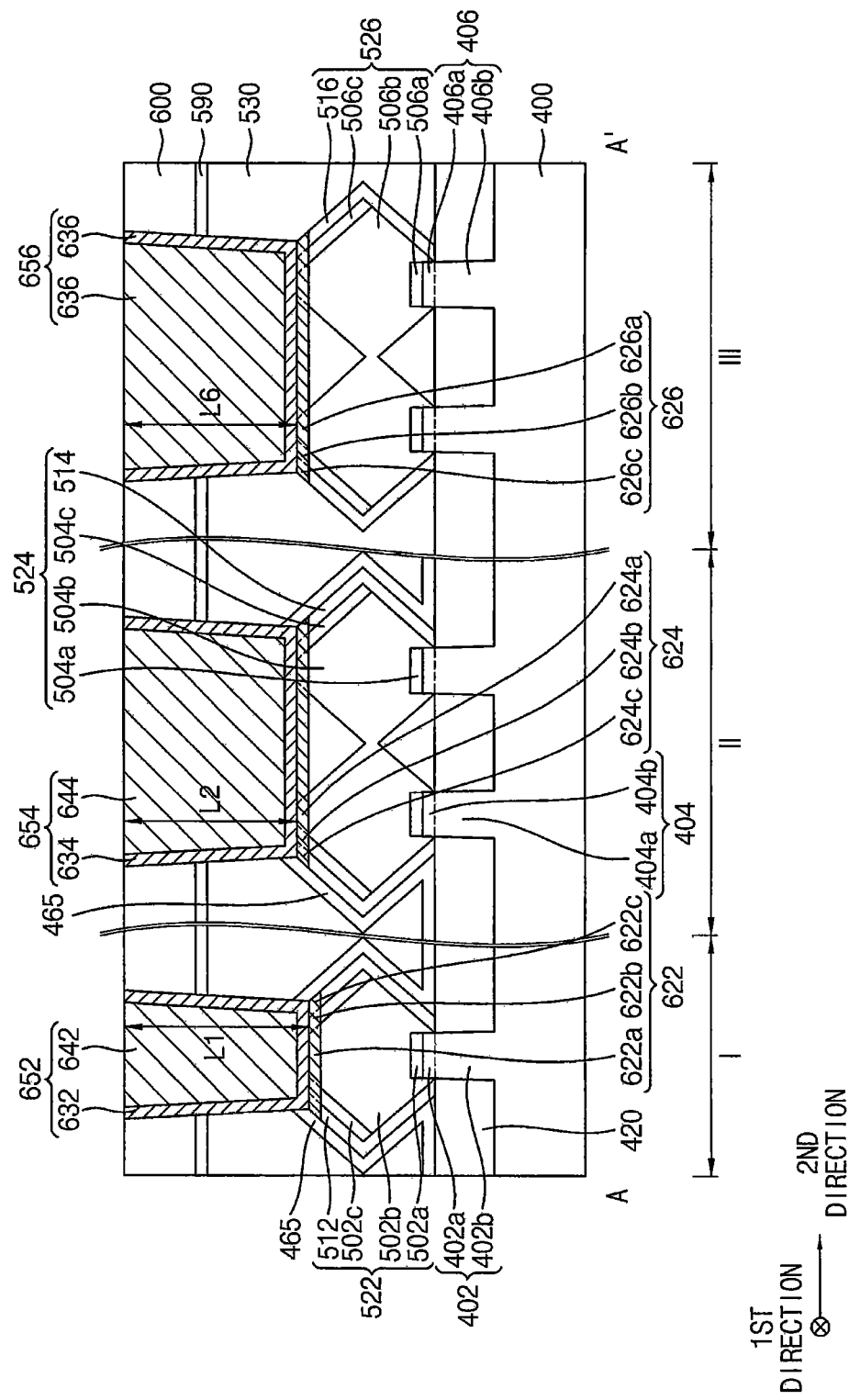
Figure 96:
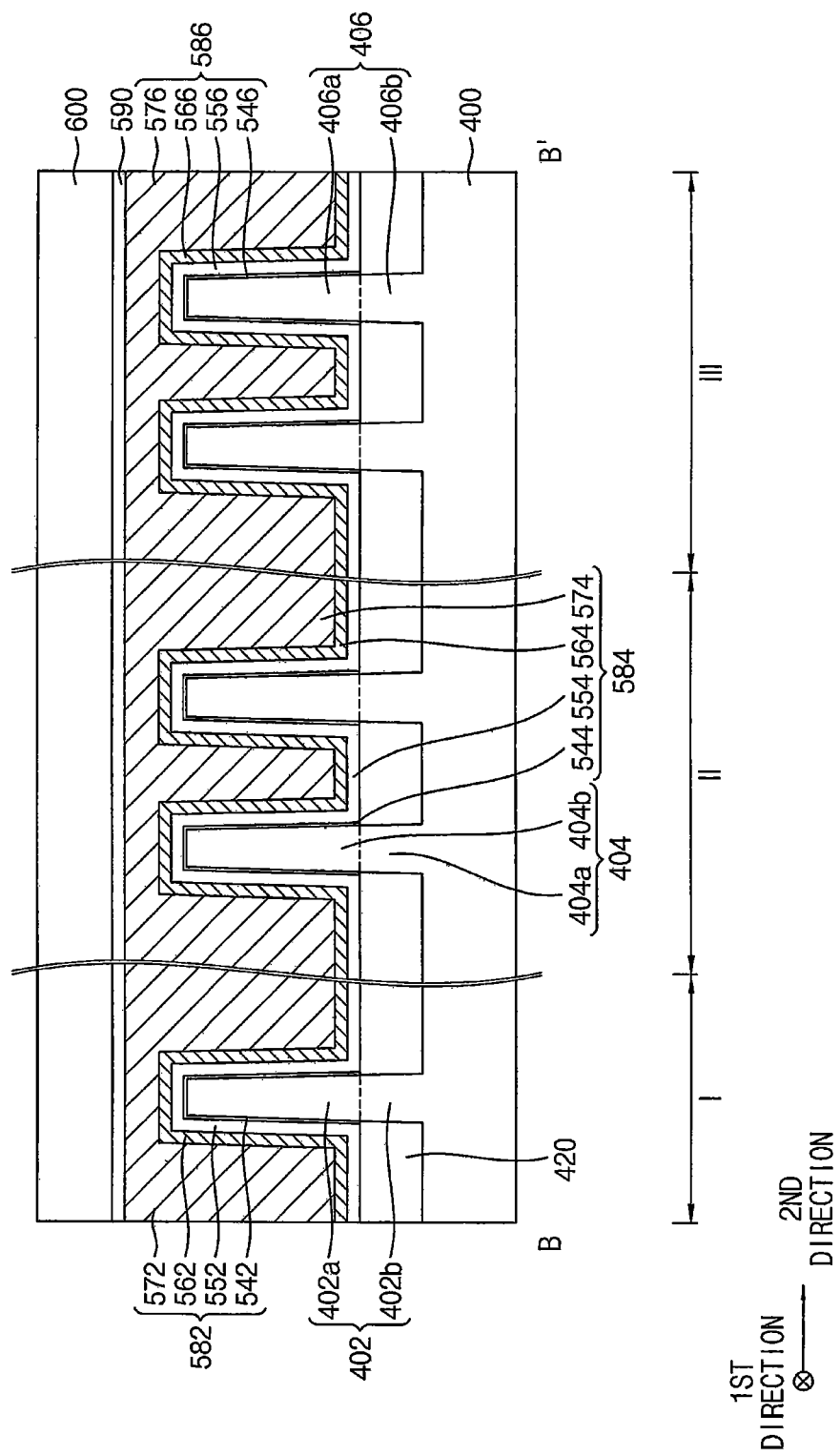
Figure 97:
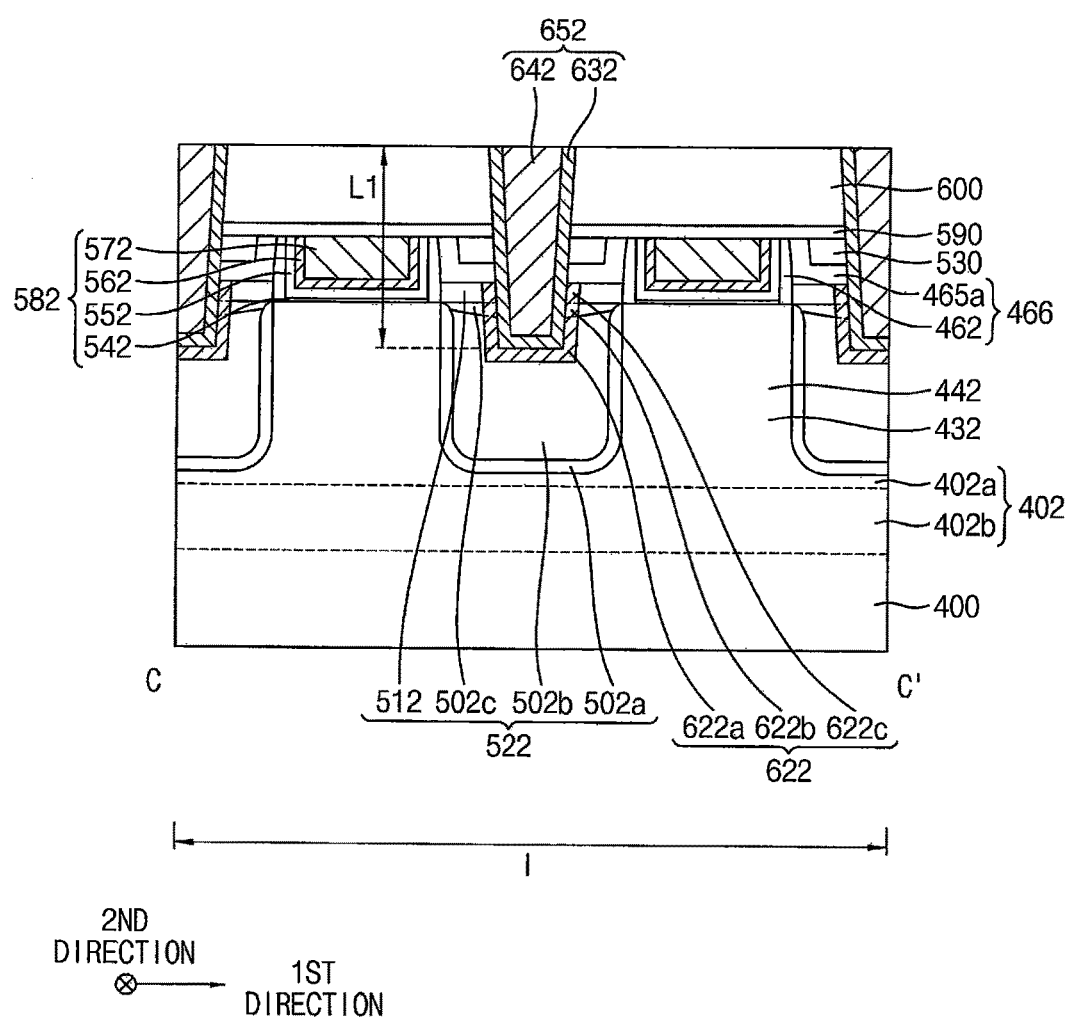
Figure 98:
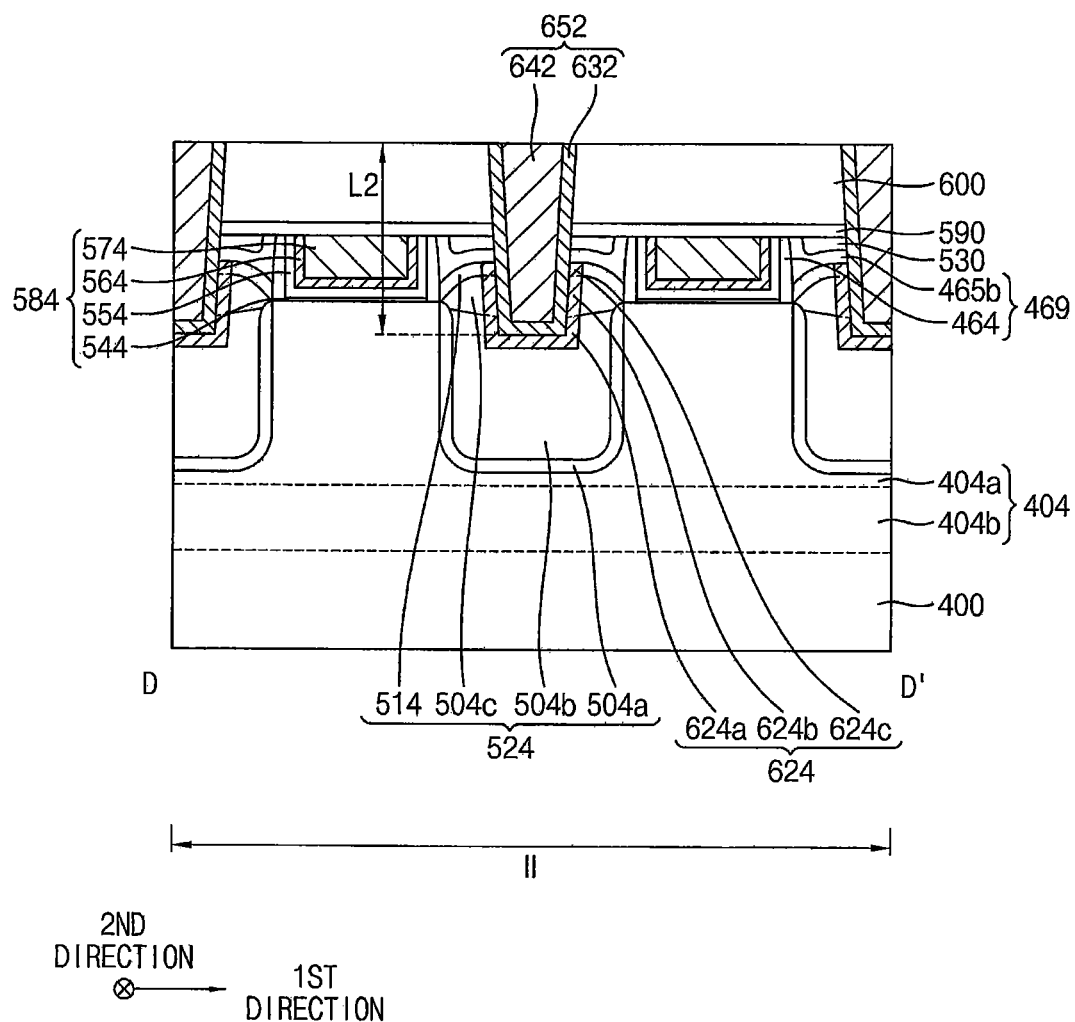
Figure 99:
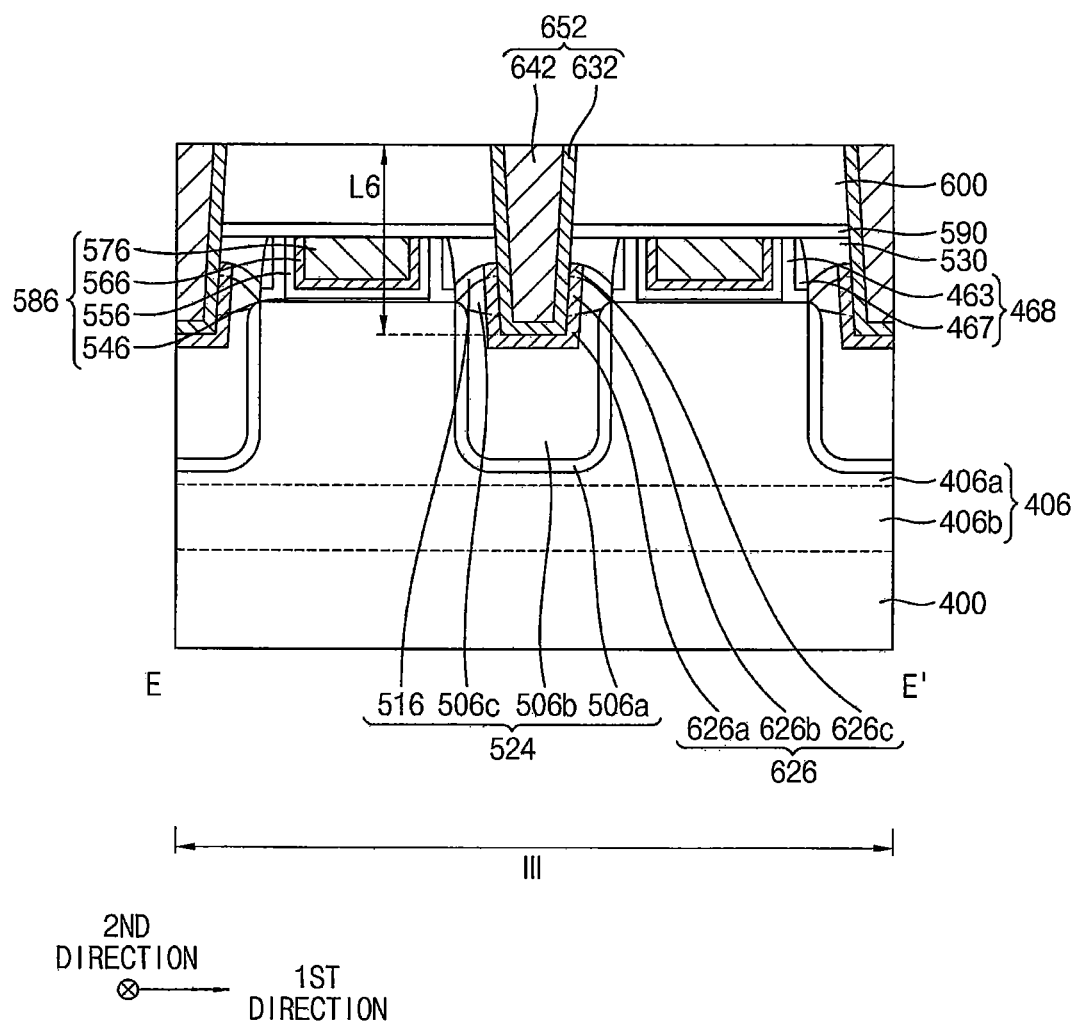

FIGS. 61, 66, 70, 74, 79, 81, 83, 90, 95 and 100 are cross-sectional views taken along lines A-A' of corresponding plan views, respectively. FIGS. 63, 85 and 96 are cross-sectional views taken along lines B-B' of corresponding plan views, respectively. FIGS. 64, 67, 71, 75, 86, 91 and 97 are cross-sectional views taken along lines C-C' of corresponding plan views, respectively. FIGS. 72, 76, 87, 92 and 98 are cross-sectional views taken along lines D-D' of corresponding plan views, respectively. and FIGS. 68, 77, 80, 82, 88, 93 and 99 are cross-sectional views taken along lines E-E' of corresponding plan views, respectively.

The methods of manufacturing semiconductor devices that are illustrated in FIGS. 60-100 may include processes that are substantially the same as or similar to those that are described with reference to FIGS. 1 to 59. Thus, like reference numerals refer to like elements, and detailed descriptions thereon may be omitted herein for brevity.

Figure 60:
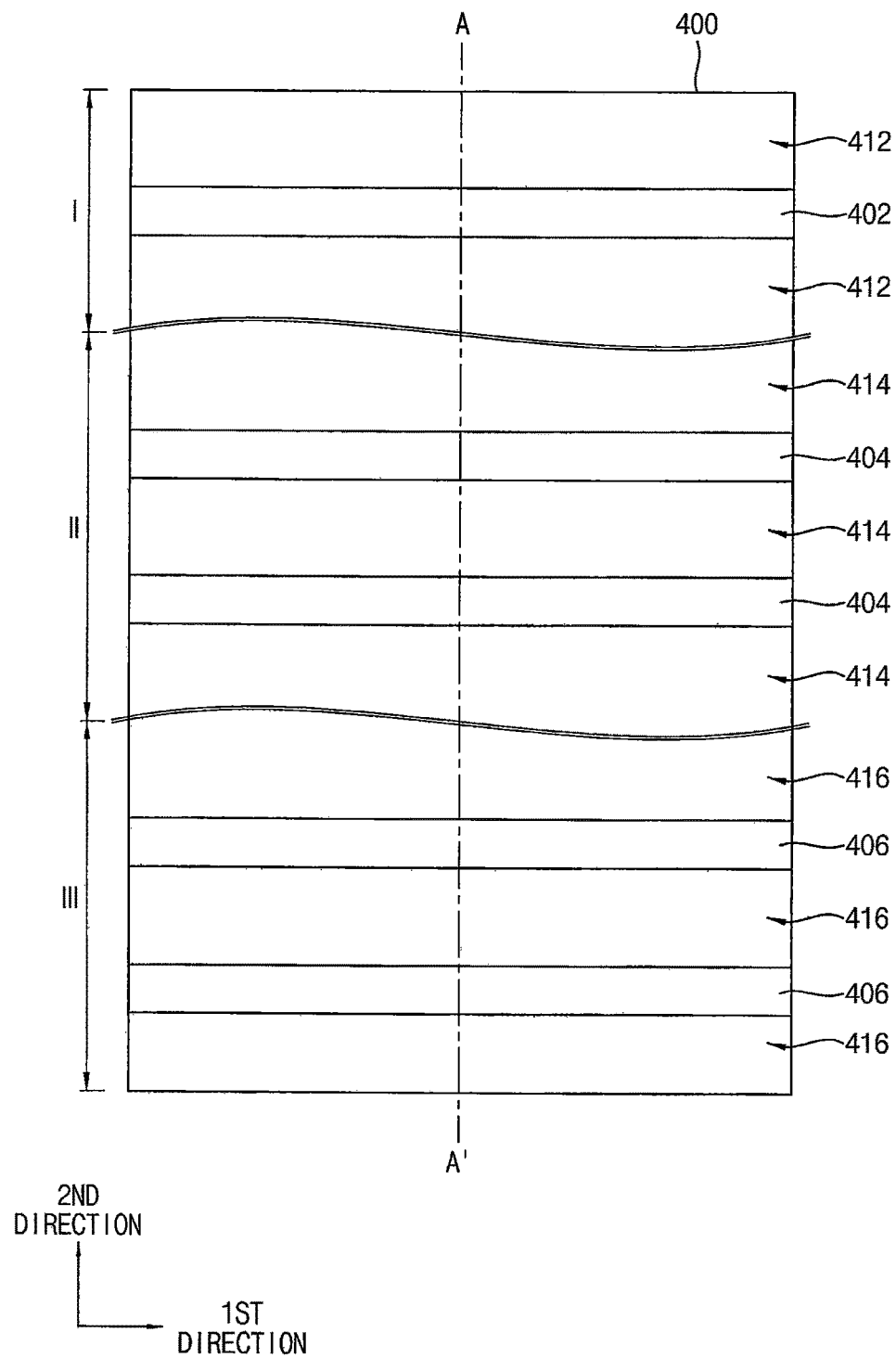
FIGS. 60 to 100 are plan views and cross-sectional views schematically illustrating intermediate process operations of methods of manufacturing semiconductor devices according to some embodiments of the inventive concepts.
Figure 61:
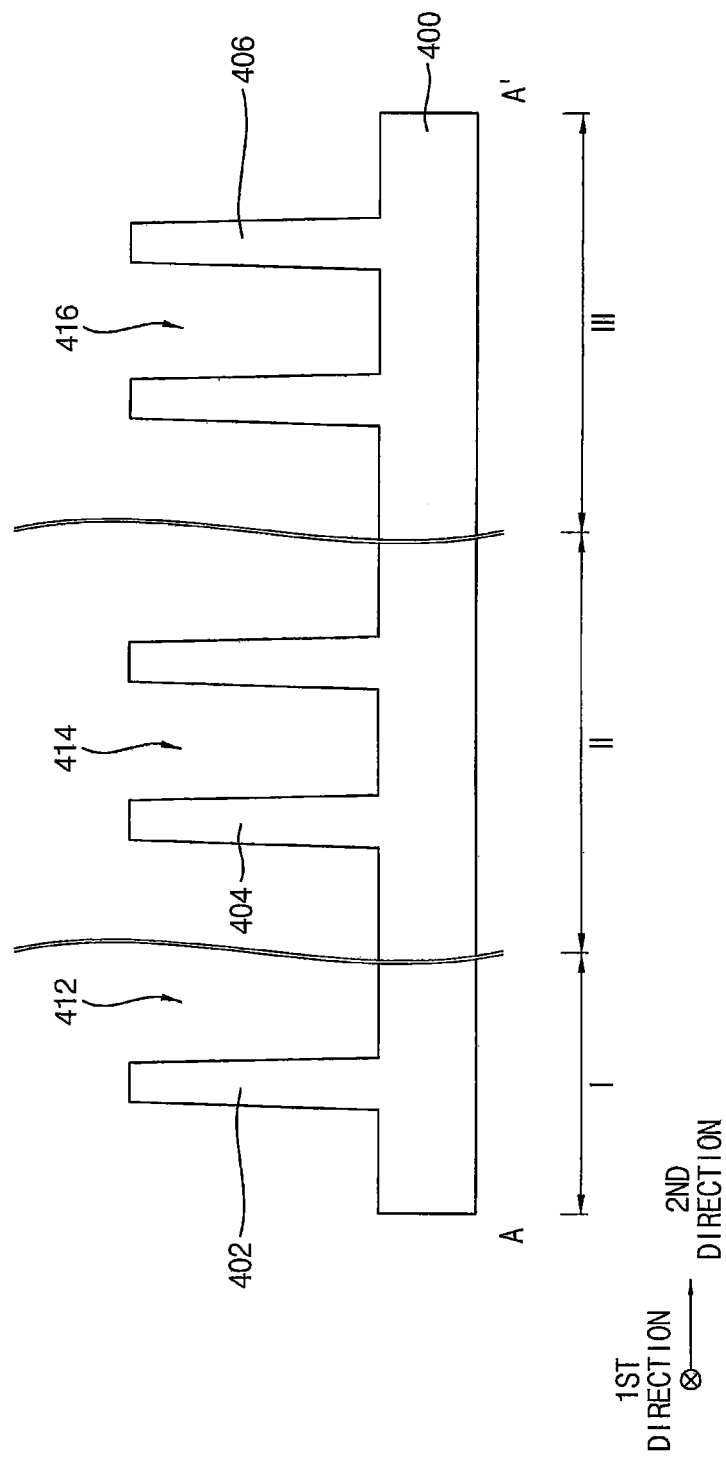

Referring to FIGS. 60 and 61, processes that are substantially the same as or similar to those that are described with reference to FIGS. 1 and 2 may be performed. Thus, an upper portion of a substrate 100 may be partially etched to form first, second and third recesses 412, 414 and 416. The substrate 100 may include first, second and third regions I, II and III. In some embodiments, the first region I may serve as an SRAM region in which SRAM devices may be formed, and the second and third regions II and III may serve as logic regions in which logic devices may be formed. The second and third regions II and III may be PMOS and NMOS regions, respectively. The first region I may be a PMOS region or an NMOS region, however, for the convenience of explanation, the first region I serving as the PMOS region will be described hereinafter.

Alternatively, any of the first to third regions I, II and III may be a logic region or a peripheral circuit region, however, a width of a first recess 412 in the first region I may be greater than widths of second and third recesses 414 and 416 in the second and third region II and III, respectively.

As the first to third recesses 412, 414 and 416 are formed on the substrate 400, first, second and third active regions 402, 404 and 406 may be defined in the first, second and third regions I, II and III, respectively, of the substrate 400.

In some embodiments, the first to third active regions 402, 404 and 406 may extend in a first direction substantially parallel to an upper surface of the substrate 400, and a plurality of first active fins 402, a plurality of second active fins 404 and a plurality of third active fins 406 may be formed in a second direction, which may be substantially parallel to the upper surface of the substrate 100 and cross the first direction. In some embodiments, the first and second directions may cross each other at a right angle, and thus may be substantially perpendicular to each other.

In some embodiments, a distance between the first active fins 402 in the second direction may be greater than a distance between the second active fins 404 in the second direction and greater than a distance between the third active fins 406 in the second direction.

Figure 62:
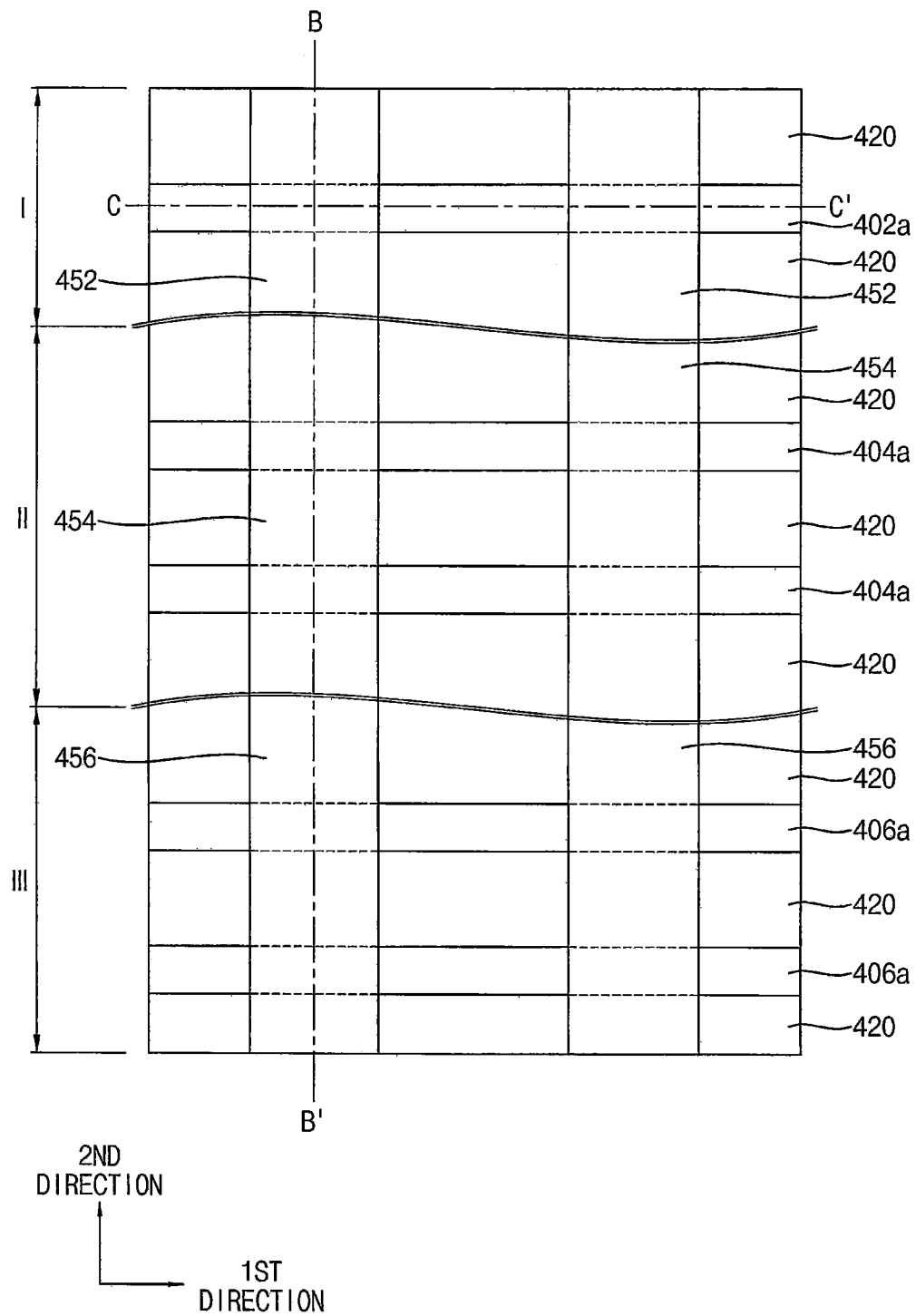
Figure 64:
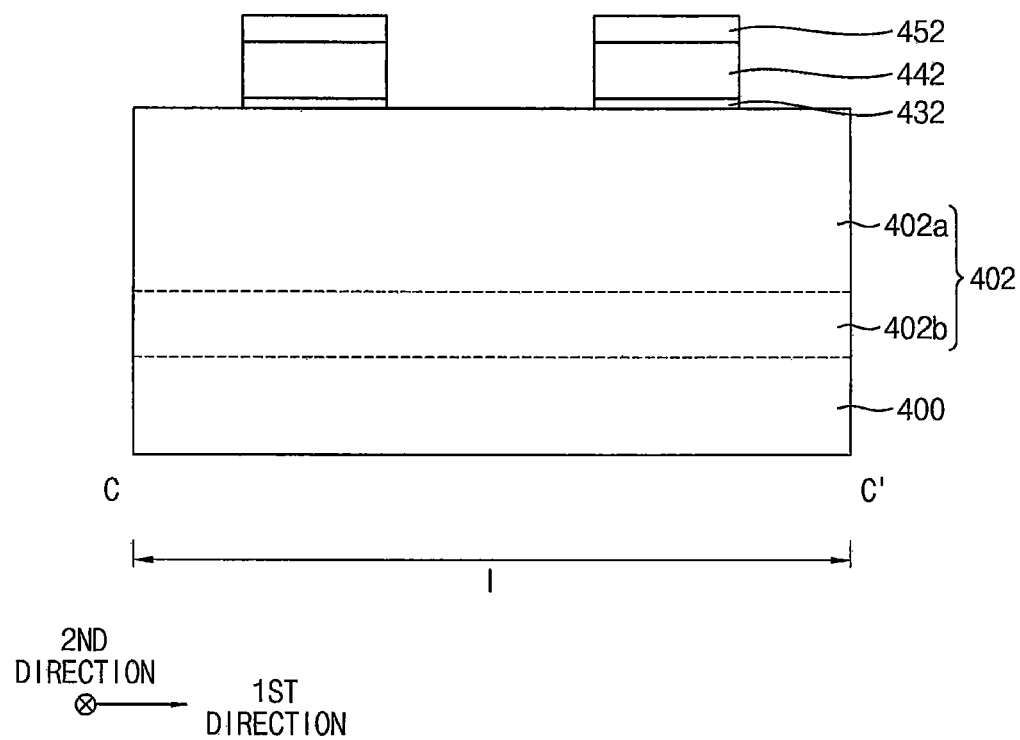
Figure 65:
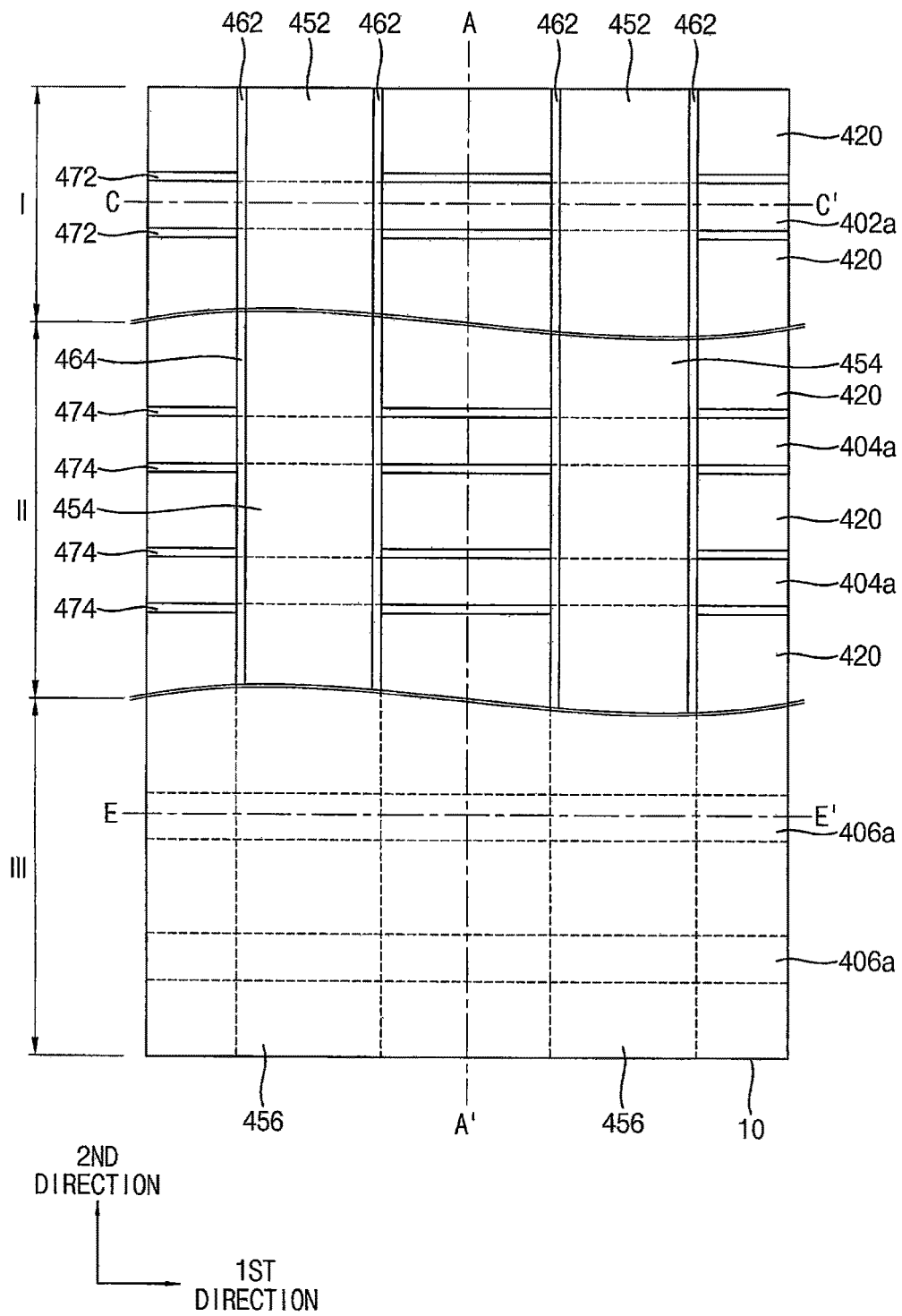
Figure 66:
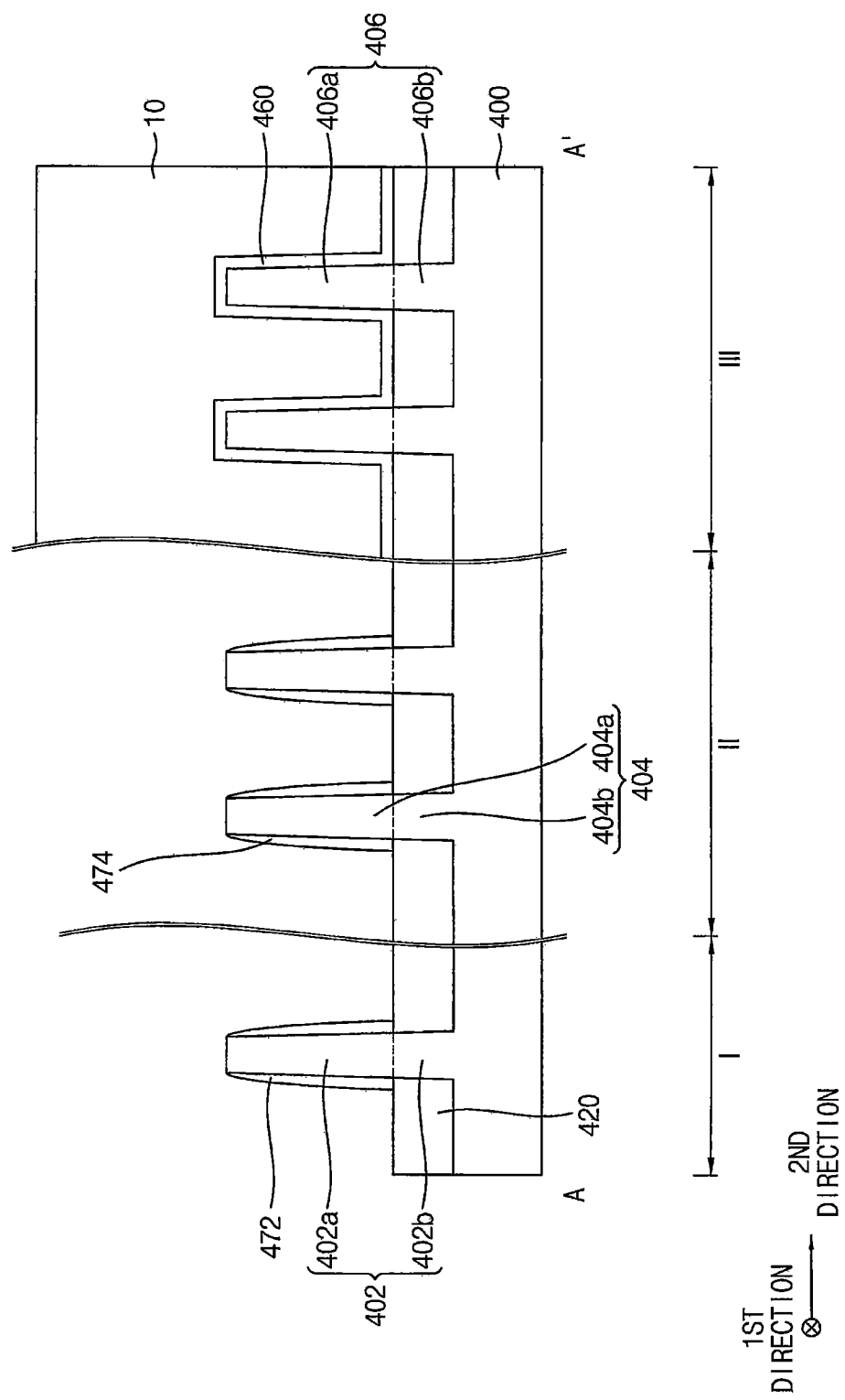
Figure 67:
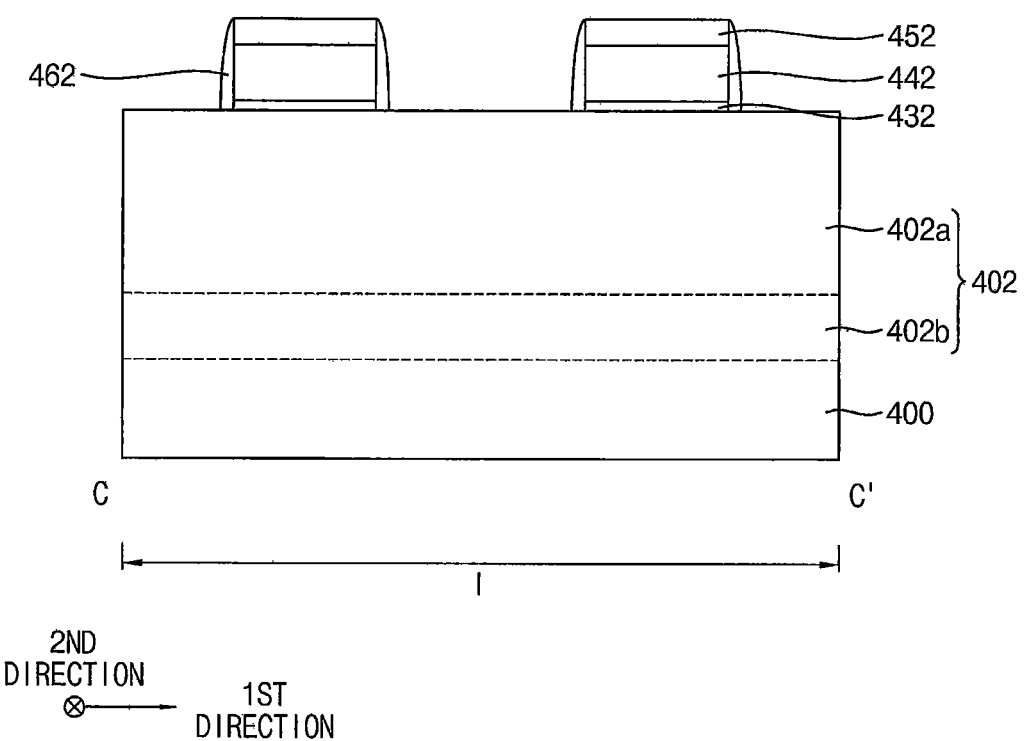
Figure 68:
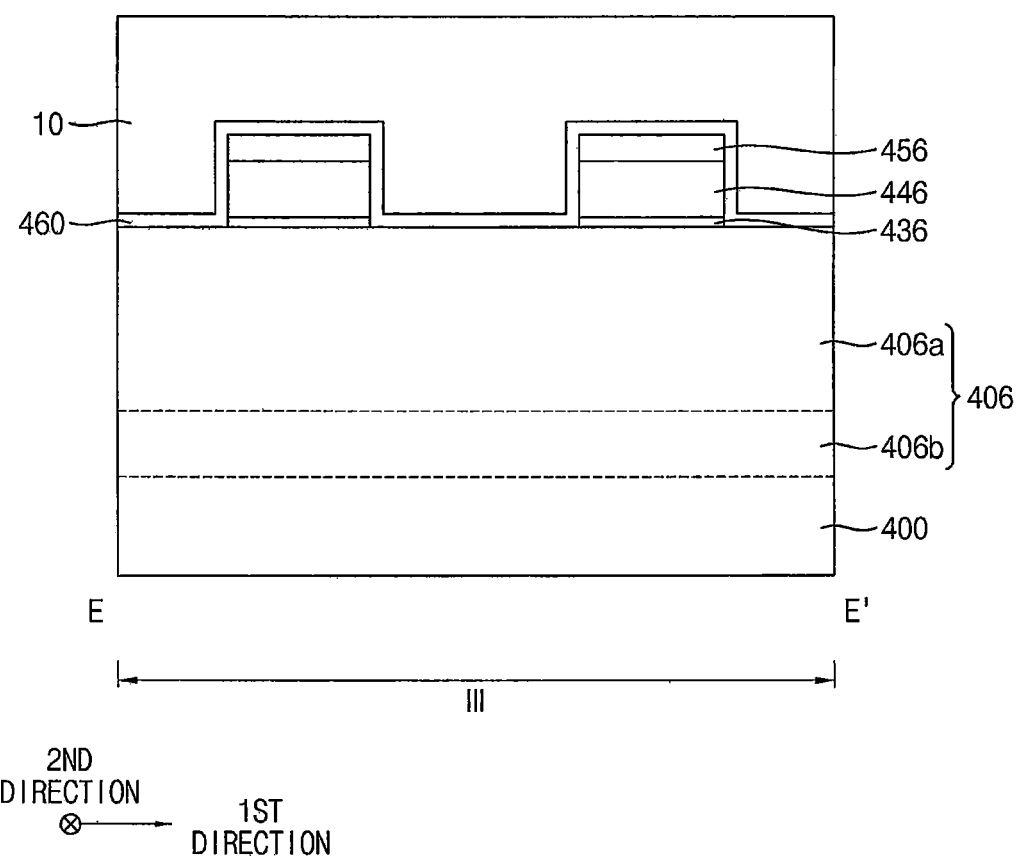
Figure 69:
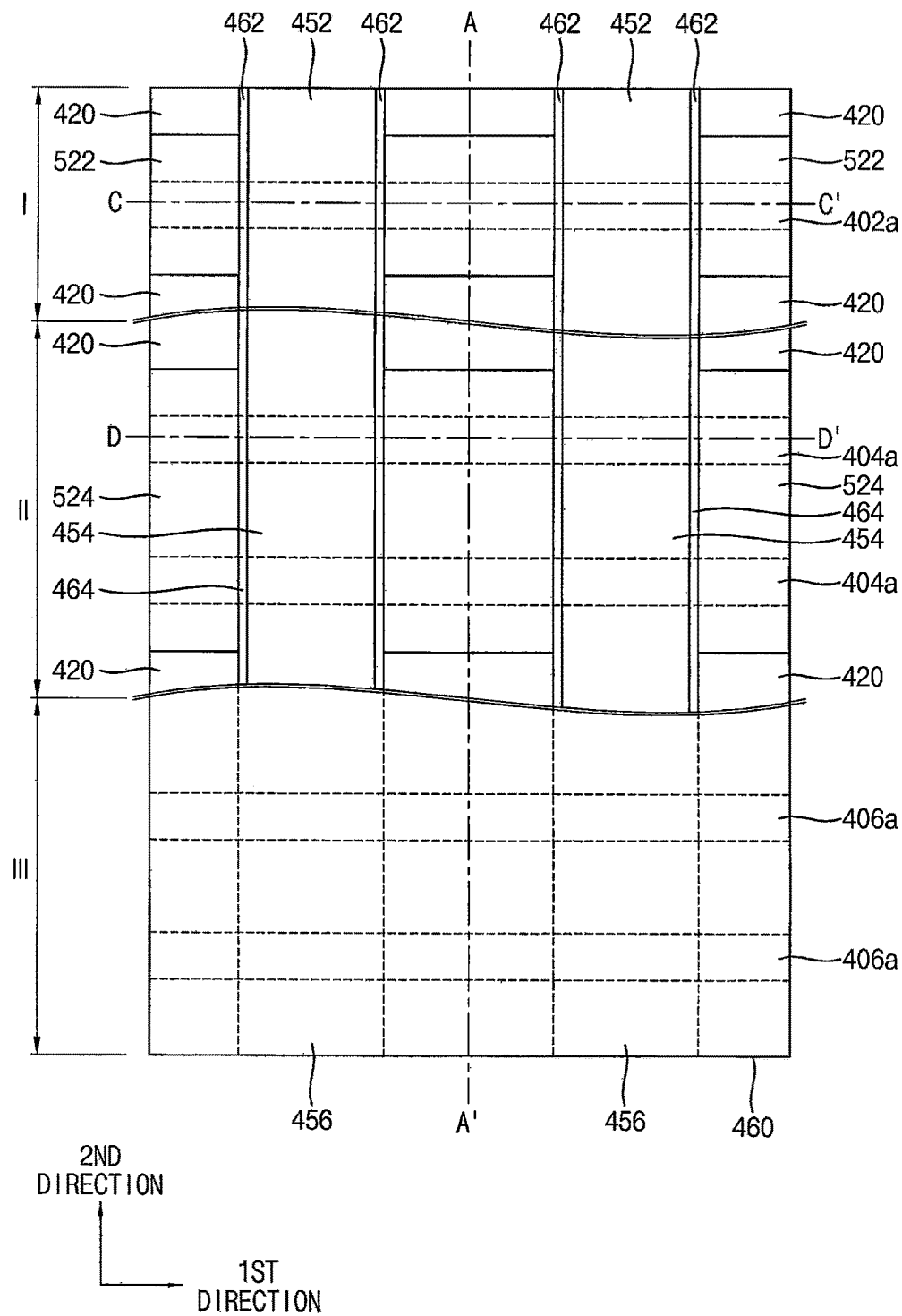
Figure 70:
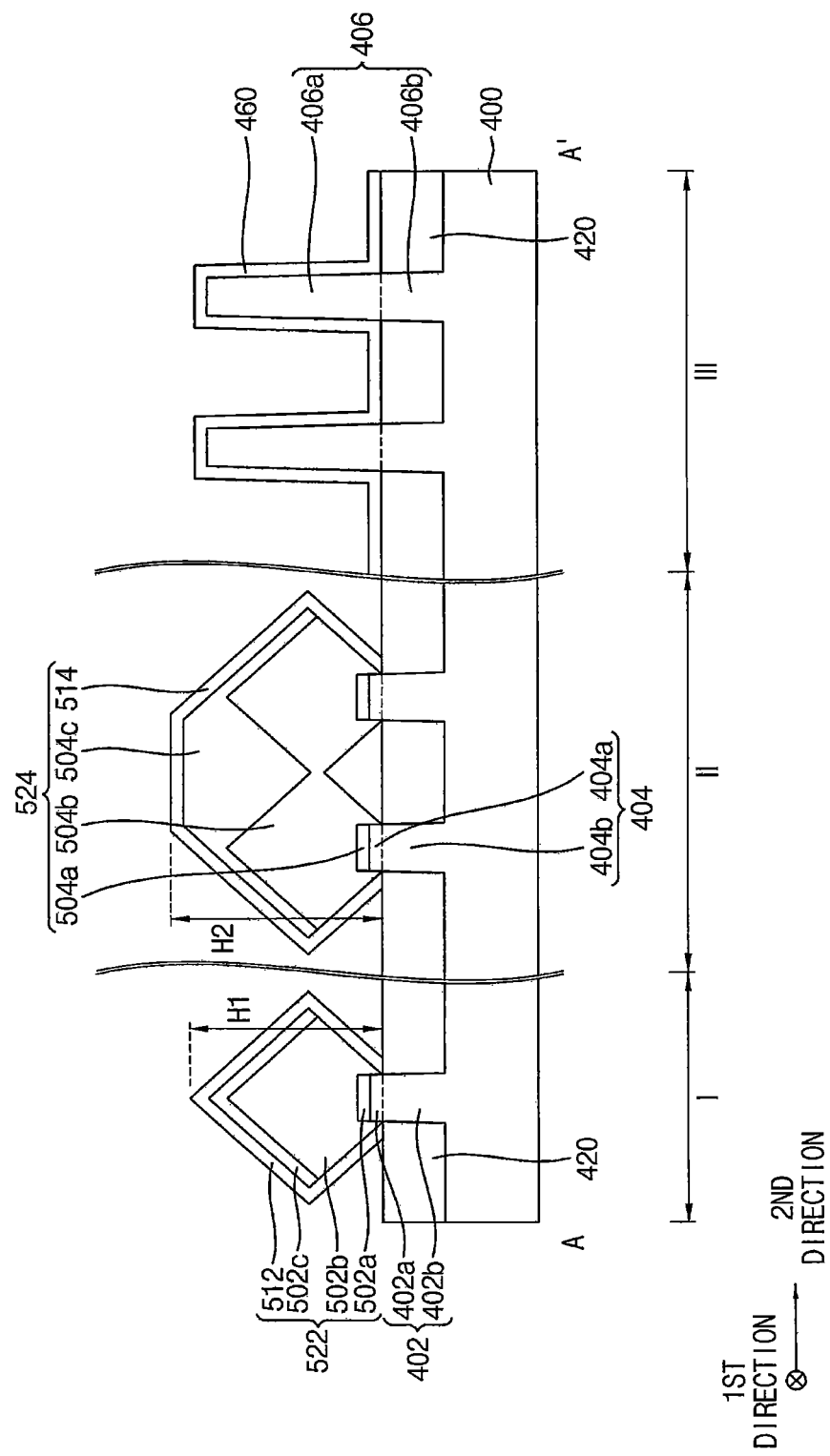
Figure 71:
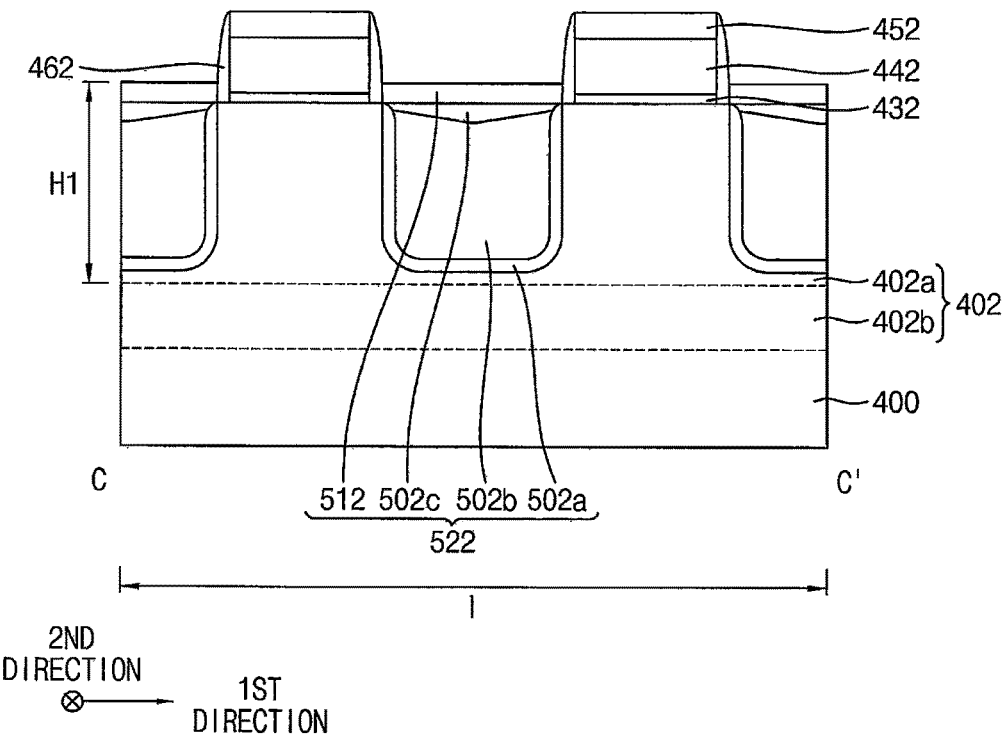
Figure 72:
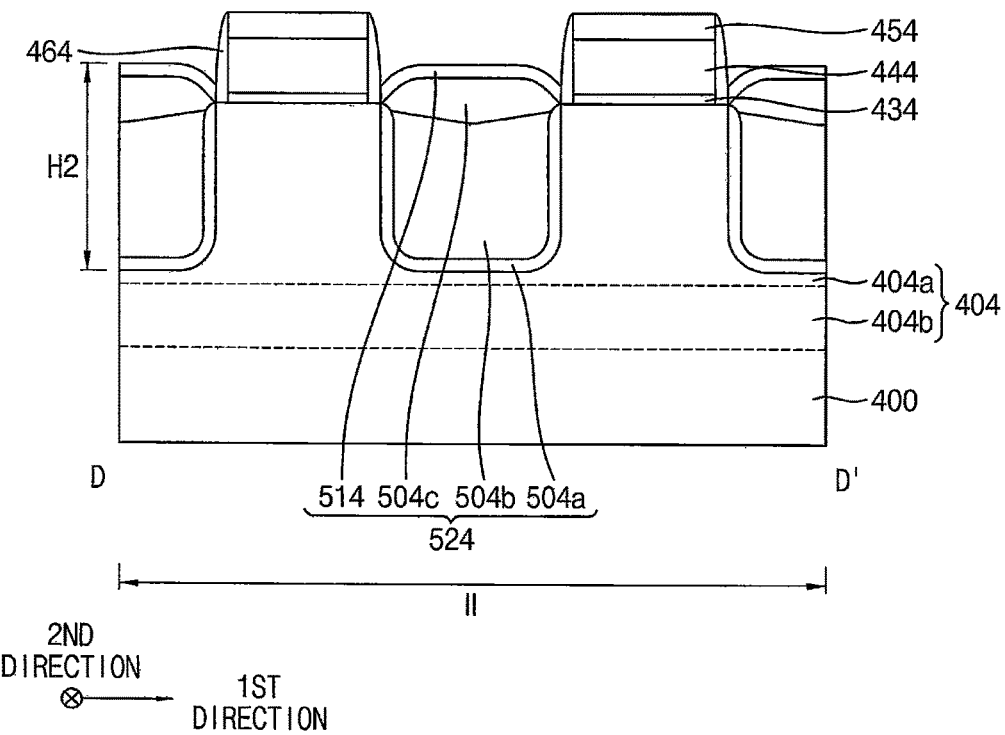
Figure 73:
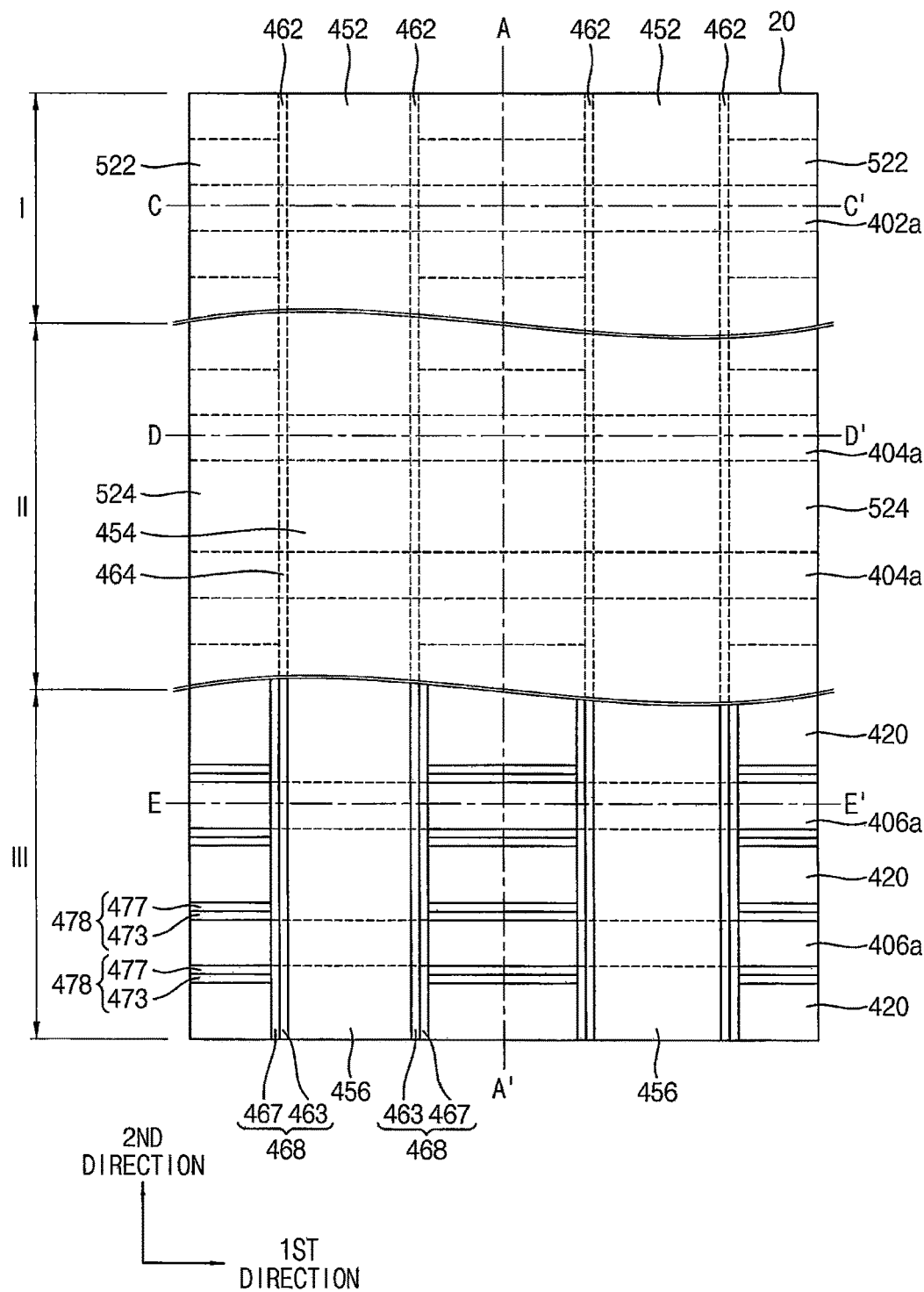
Figure 74:
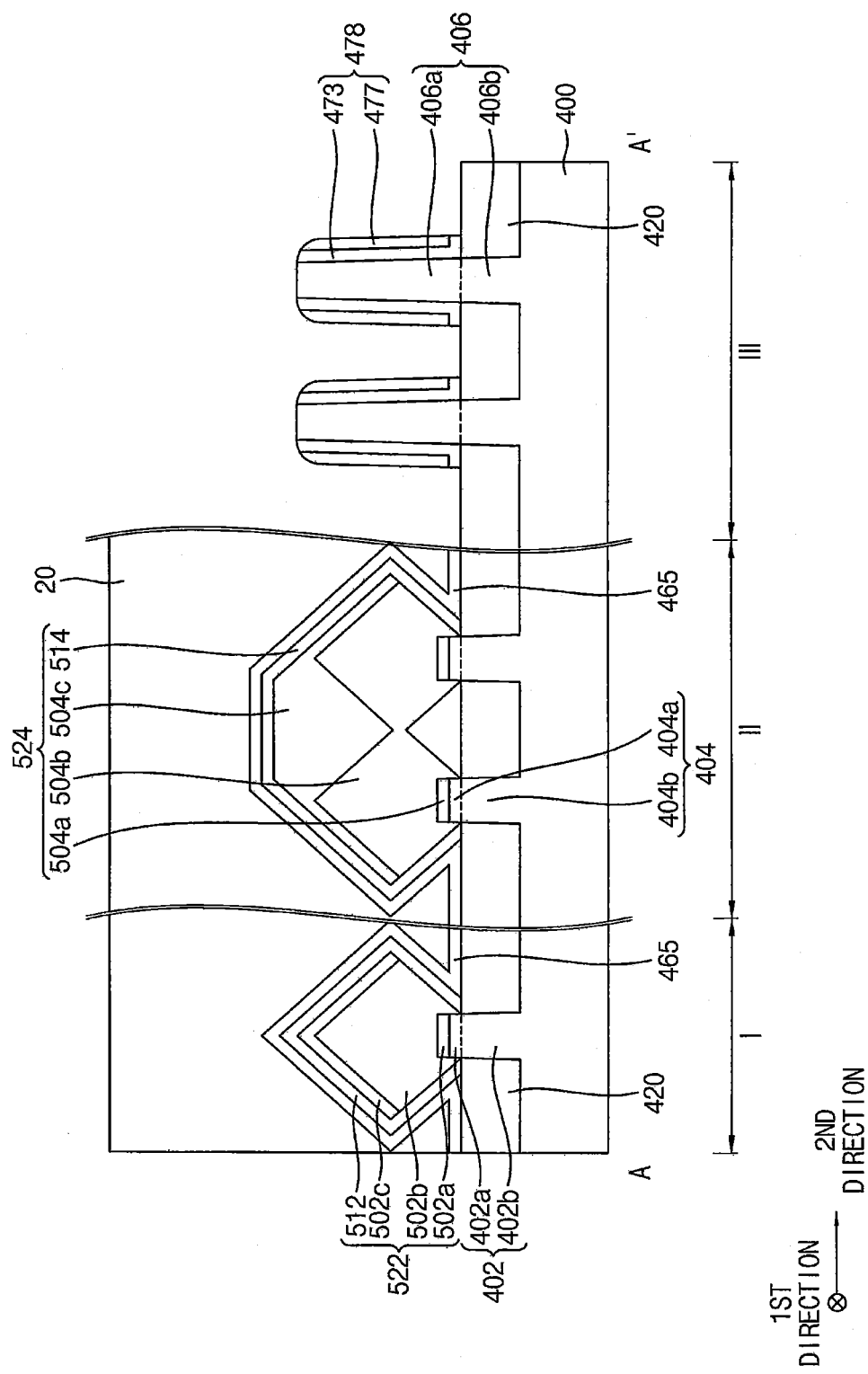
Figure 75:
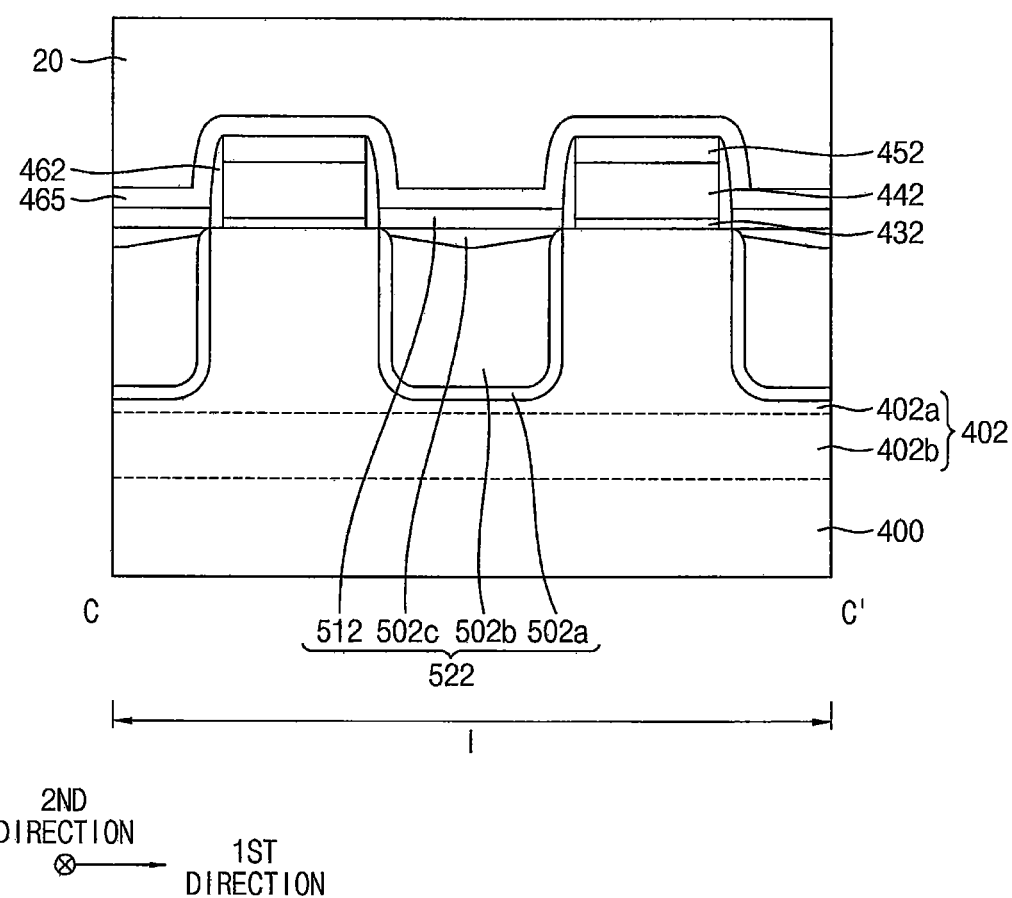
Figure 76:
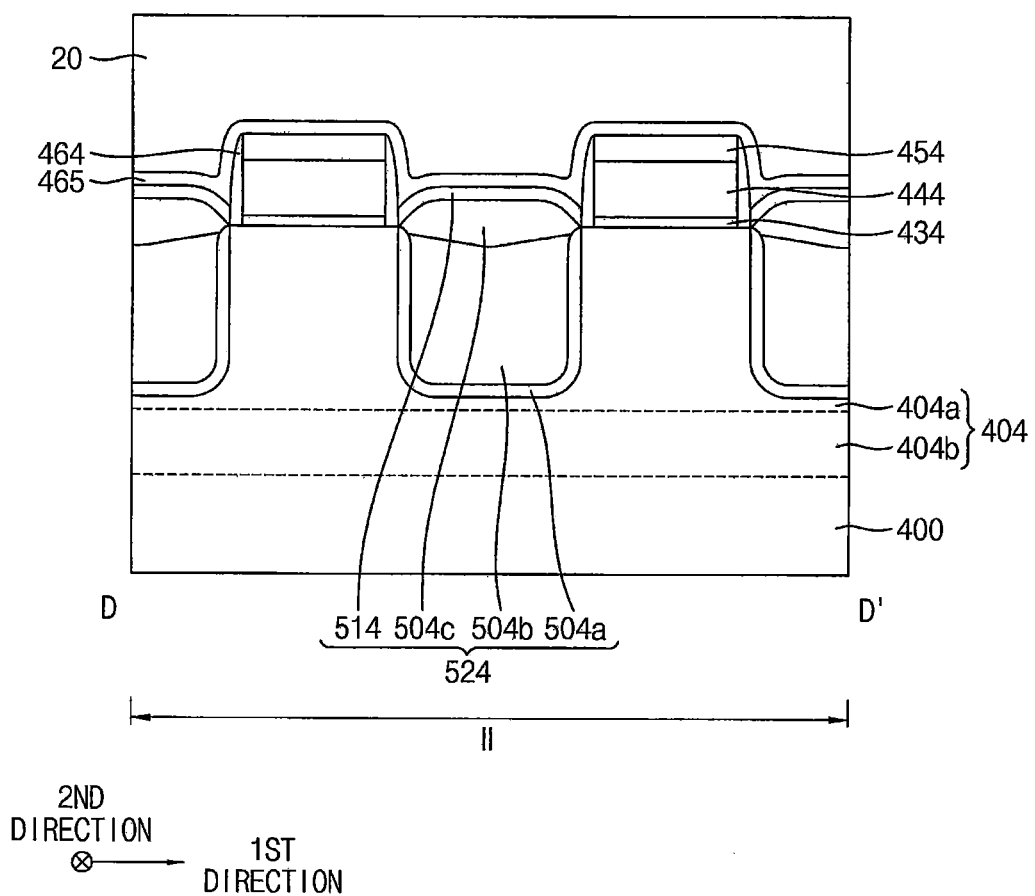
Figure 77:
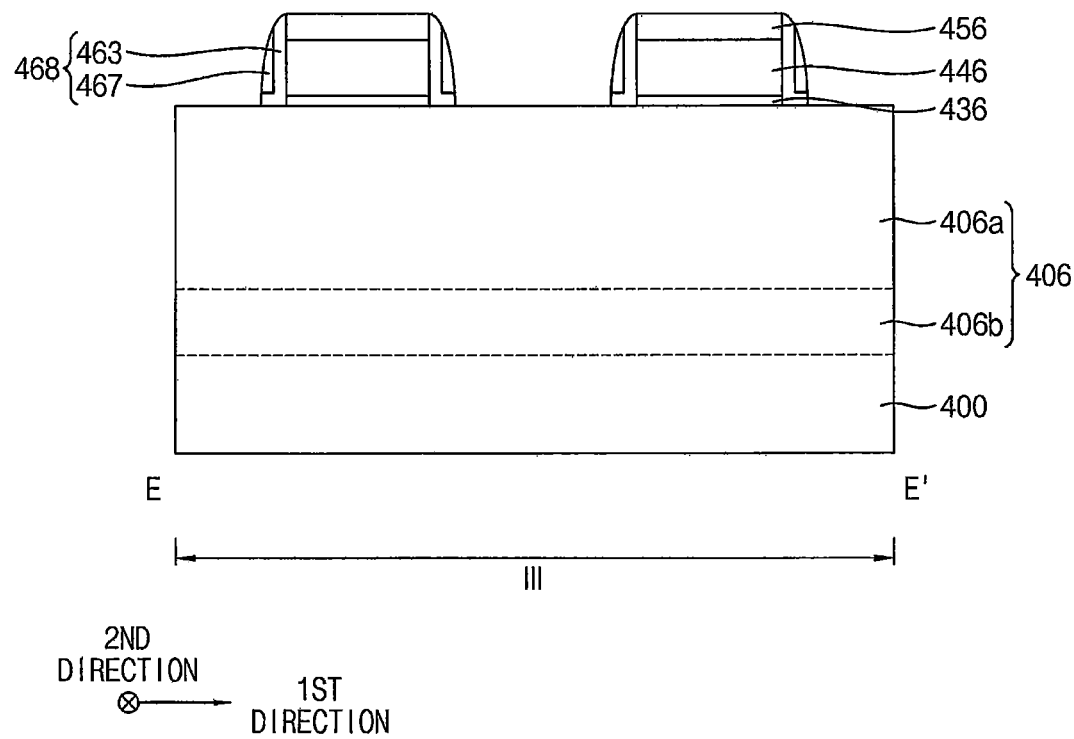

Referring to FIGS. 62 and 64, processes that are substantially the same as or similar to those that are described with reference to FIGS. 4 to 8 may be performed. Thus, an isolation pattern 420 may be formed on the substrate 400 to fill lower portions of the first to third recesses 412, 414 and 416. The first active fin 402 may include a first lower active pattern 402b whose sidewall may be covered by the isolation pattern 420, and a first upper active pattern 402a that is not covered by the isolation pattern 420 but protruding therefrom, the second active fin 404 may include a second lower active pattern 404b whose sidewall may be covered by the isolation pattern 420, and a second upper active pattern 404a that is not covered by the isolation pattern 420 but protruding therefrom, and the third active fin 406 may include a third lower active pattern 406b whose sidewall may be covered by the isolation pattern 420, and a third upper active pattern 406a that is not covered by the isolation pattern 420 but protruding therefrom.

Additionally, first to third dummy gate structures may be formed on the first to third regions I, II and III, respectively, of the substrate 400. The first dummy gate structure may include a first dummy gate insulation pattern 432, a first dummy gate electrode 442 and the first dummy gate mask 452 sequentially stacked on the first region I of the substrate 400, the second dummy gate structure may include a second dummy gate insulation pattern 434, a second dummy gate electrode 444 and the second dummy gate mask 454 sequentially stacked on the second region II of the substrate 400, and the third dummy gate structure may include a third dummy gate insulation pattern 436, a third dummy gate electrode 446 and the third dummy gate mask 456 sequentially stacked on the third region III of the substrate 400.

In some embodiments, the first to third dummy gate structures may be formed to extend in the second direction, and a plurality of first dummy gate structures, a plurality of second dummy gate structures, and a plurality of third dummy gate structures may be formed in the first direction.

Referring to FIGS. 65 to 68, processes similar to those that are described with reference to FIGS. 9 to 11 may be performed. That is, a first spacer layer 460 may be formed on the first to third regions I, II and III of the substrate 400 having the first and second dummy gate structures thereon, a first photoresist pattern 10 may be formed to cover the third region III of the substrate 400, and an anisotropic etching process may be performed using the first photoresist pattern 10 as an etching mask.

Thus, in the first region I of the substrate 400, a first gate spacer 462 may be formed on opposite sidewalls of the first dummy gate structure in the first direction, and a first fin spacer 472 may be also formed on opposite sidewalls of the first active fin 402 in the second direction. Additionally, in the second region II of the substrate 400, a second gate spacer 464 may be formed on opposite sidewalls of the second dummy gate structure in the first direction, and a second fin spacer 474 may be also formed on opposite sidewalls of the second active fin 404 in the second direction.

Referring to FIGS. 69 to 72, processes similar to those that are described with reference to FIGS. 12 to 24 may be performed.

That is, after removing the first photoresist pattern 10, an upper portion of the first active fin 402 adjacent the first dummy gate structure may be etched to form a fourth recess, and an upper portion of the second active fin 404 adjacent the second dummy gate structure may be etched to form a fifth recess. Particularly, the upper portions of the first and second active fins 402 and 404 may be removed using the first and second dummy gate structures and the first and second gate spacers 462 and 464 on sidewalls thereof in the first and second regions I and II, respectively, as an etching mask to form the fourth and fifth recesses. The first and second fin spacers 472 and 474 may be also removed, and the third active fin 406 may not be etched because the first spacer layer 460 may remain in the third region III of the substrate 400.

First to fourth SEG processes may be performed to form first and second source/drain layer structures 522 and 524 on the first and second active fins 402 and 404 to fill the fourth and fifth recesses, respectively. The first source/drain layer structure 522 may include first to third semiconductor layers 502a, 502b and 502c that are sequentially stacked on the first active fin 402, and a first capping layer 512 on the second and third semiconductor layers 502b and 502c. Additionally, the second source/drain layer structure 524 may include fourth semiconductor layers 504a on the respective second active fins 404, a fifth semiconductor layer 504b commonly contacting upper surfaces of the fourth semiconductor layers 504a, a sixth semiconductor layer 504c on the fifth semiconductor layer 504b, and a second capping layer 514 on the fifth and sixth semiconductor layers 504b and 504c.

Each of the first to fourth SEG processes may be performed using a silicon source gas, a germanium source gas, an etching gas, a carrier gas and a p-type impurity source gas, so that a single crystalline silicon-germanium layer doped with p-type impurities may be formed to serve as a source/drain of a PMOS transistor.

In some embodiments, a top surface of the first source/drain layer structure 522 may have a first height H1 from an upper surface of the isolation pattern 420, and an upper surface of the second source/drain layer structure 524 may have a second height H2 from the upper surface of the isolation pattern 420, which may be greater than the first height H1. The upper surface of the second source/drain layer structure 524 may be constant along the second direction. Thus, the second source/drain layer structure 524 may have a relatively large volume, and may apply a sufficiently high compressive stress on a channel that may be formed at a portion of the second active fin 404 under the second dummy gate structure, which may increase the mobility of holes.

The second source/drain layer structure 524 may include the sixth semiconductor layer 504c having a p-type impurity concentration greater than that of the fifth semiconductor layer 504b, which may have a large volume, and thus may have a low resistance. Additionally, in the second source/drain layer structure 524, the sixth semiconductor layer 504c having a relatively high germanium concentration may be formed on the fifth semiconductor layer 504b having a relatively low germanium concentration, and thus the contact resistance between the second source/drain layer structure 524 and a second contact plug 654 (refer to FIGS. 94 to 99) subsequently formed may decrease.

The horizontal growth of the first source/drain layer structure 522 may be reduced or prevented when the third semiconductor layer 502c is formed on the second semiconductor layer 502b, and thus neighboring ones of the first source/drain layer structures 522 may not be merged with each other. Thus, the electrical short-circuit therebetween may be prevented.

Alternatively, the second source/drain layer structure 524 may be formed to have shapes that are described with reference to FIGS. 25 to 27.

Referring to FIGS. 73 to 77, processes similar to those that are described with reference to FIGS. 9 to 11 may be performed again. That is, a second spacer layer 465 may be formed on the first to third regions I, II and III of the substrate 400 having the first and second dummy gate structures, the first and second gate spacers 462 and 464, the first and second source/drain layer structures 522 and 524 and the first spacer layer 460 thereon, a second photoresist pattern 20 may be formed on the first and second dummy gate structures, the first and second gate spacers 462 and 464, and the first and second source/drain layer structures 522 and 524 to cover the first and second regions I and II of the substrate 400, and an anisotropic etching process may be performed using the second photoresist pattern 20 as an etching mask.

Thus, in the third region III of the substrate 400, a third gate spacer structure 468 may be formed on opposite sidewalls of the first dummy gate structure in the first direction, and a third fin spacer structure 478 may be also formed on opposite sidewalls of the third active fin 406 in the second direction. The third gate spacer structure 468 may include third and fourth spacers 463 and 467 sequentially stacked on the sidewalls of the third dummy gate structure, and the third fin spacer structure 478 may include third and fourth fin spacers 473 and 477 sequentially stacked on the sidewalls of the third active fin 406.

In some embodiments, the second spacer layer 465 may be formed of a material that is substantially the same as that of the first spacer layer 460, and thus the second spacer layer 465 may be merged with the first and second gate spacers 462 and 464 in the first and second regions I and II of the substrate 400, and may be merged with the first spacer layer 460 in the third region III of the substrate 400.

Figure 78:
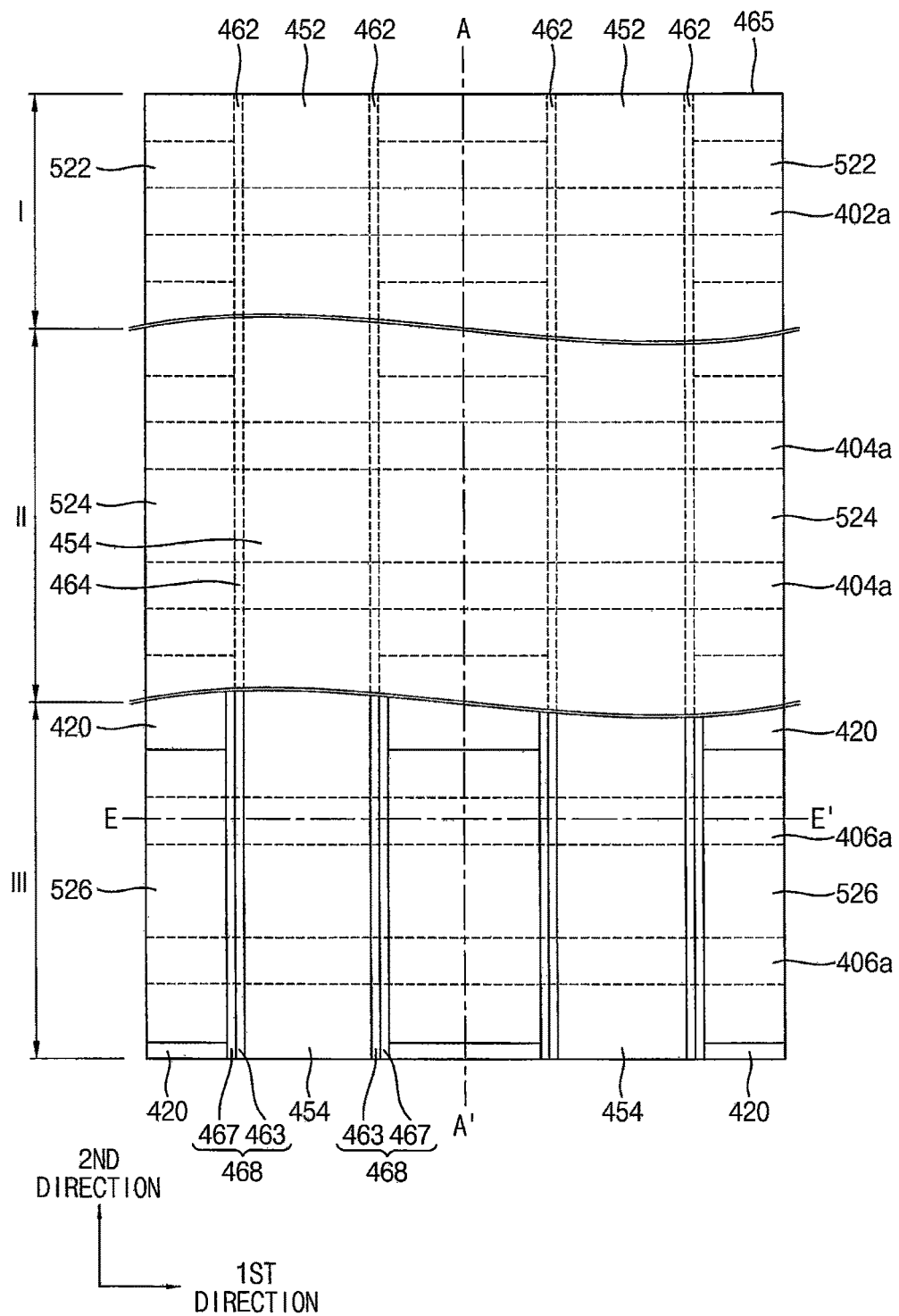
Figure 79:
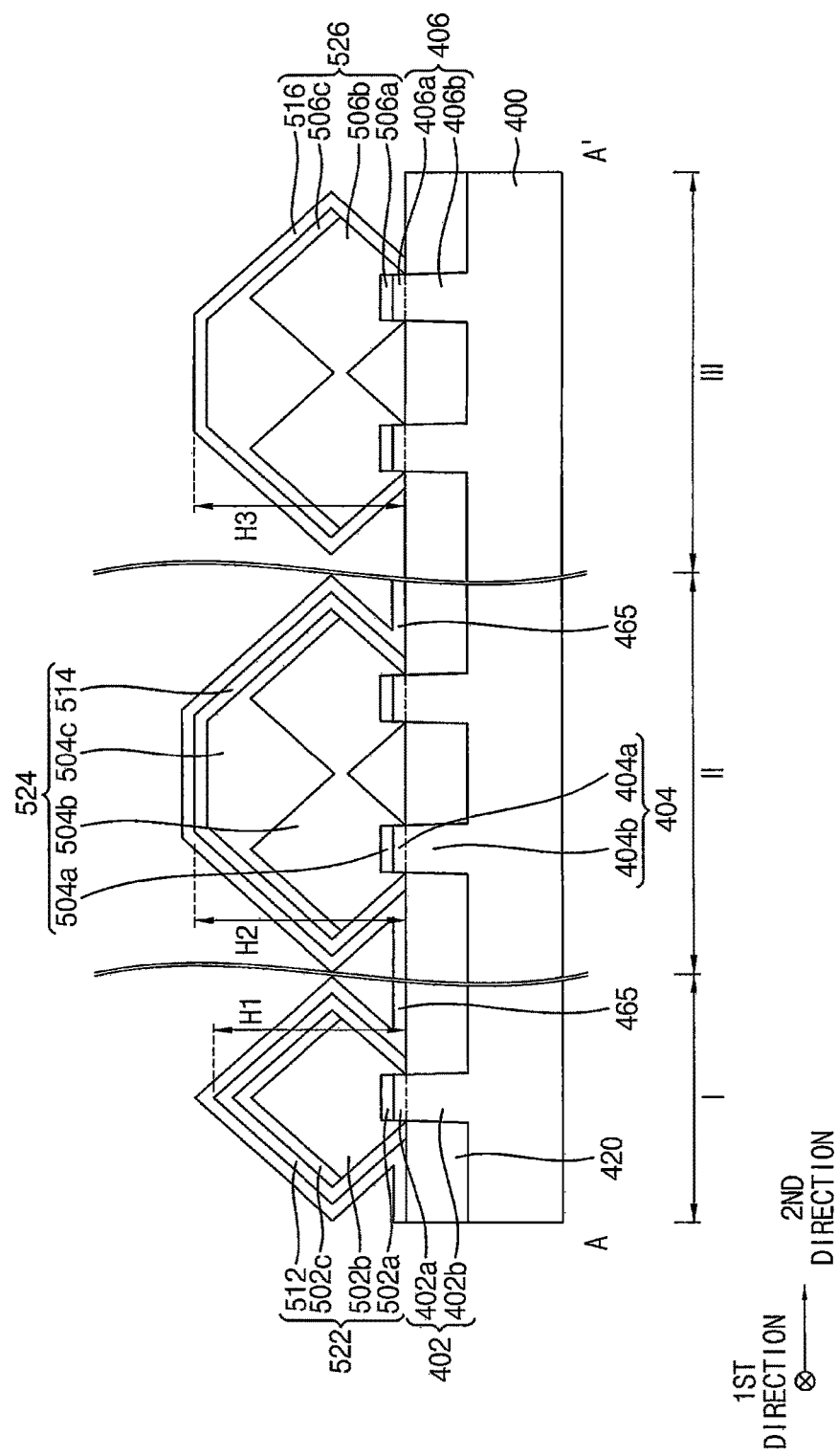
Figure 80:
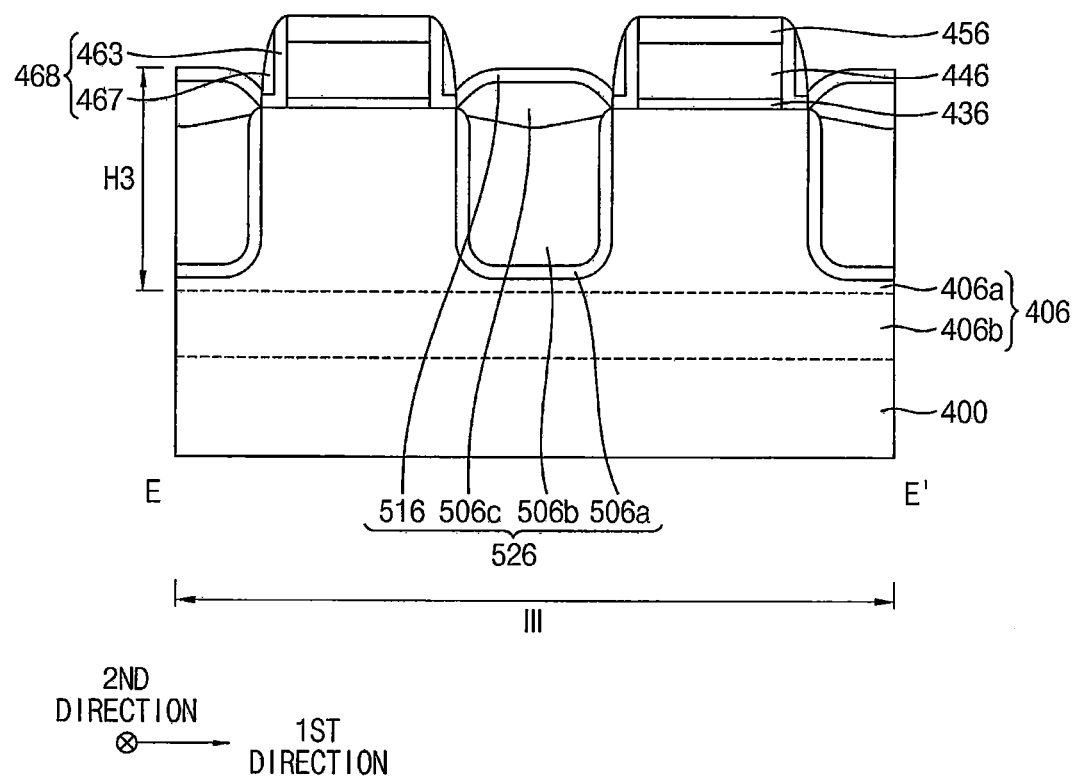

Referring to FIGS. 78 to 80, processes similar to those that are described with reference to FIGS. 12 to 24 may be performed again. That is, after removing the second photoresist pattern 20, an upper portion of the third active fin 406 adjacent the third dummy gate structure may be etched to form a sixth recess. Particularly, an upper portion of the third active fin 406 may be removed using the third dummy gate structure and the third gate spacer structure 468 on sidewalls thereof in the third region III, as an etching mask to form the sixth recess. The third fin spacer structure 478 may be also removed, and the first and second source/drain layer structures 522 and 524 may not be etched because the second spacer layer 465 may remain in the first and second regions I and II of the substrate 400.

First to fourth SEG processes may be performed again to form a third source/drain layer structure 526 on the third active fins 406 to fill the sixth recess. The third source/drain layer structure 526 may include seventh semiconductor layers 506a on the respective third active fins 406, an eighth semiconductor layer 506b commonly contacting upper surfaces of the seventh semiconductor layers 506a, a ninth semiconductor layer 506c on the eighth semiconductor layer 506b, and a third capping layer 516 on the eighth and ninth semiconductor layers 506b and 506c.

In some embodiments, the first to fourth SEG processes may be performed using a silicon source gas, a carbon source gas, an etching gas, a carrier gas and an n-type impurity source gas, so that a single crystalline silicon carbide layer doped with n-type impurities may be formed to serve as a source/drain of an NMOS transistor.

In some embodiments, a top surface of the third source/drain layer structure 526 may have a third height H3 from an upper surface of the isolation pattern 420, which may be greater than the first height H1. The upper surface of the third source/drain layer structure 526 may be constant along the second direction. Thus, the third source/drain layer structure 526 may have a relatively large volume, and may apply a sufficiently high tensile stress on a channel that may be formed at a portion of the third active fin 406 under the third dummy gate structure, which may increase the mobility of electrons. The third height H3 may be substantially equal to or different from the second height H2.

Figure 81:
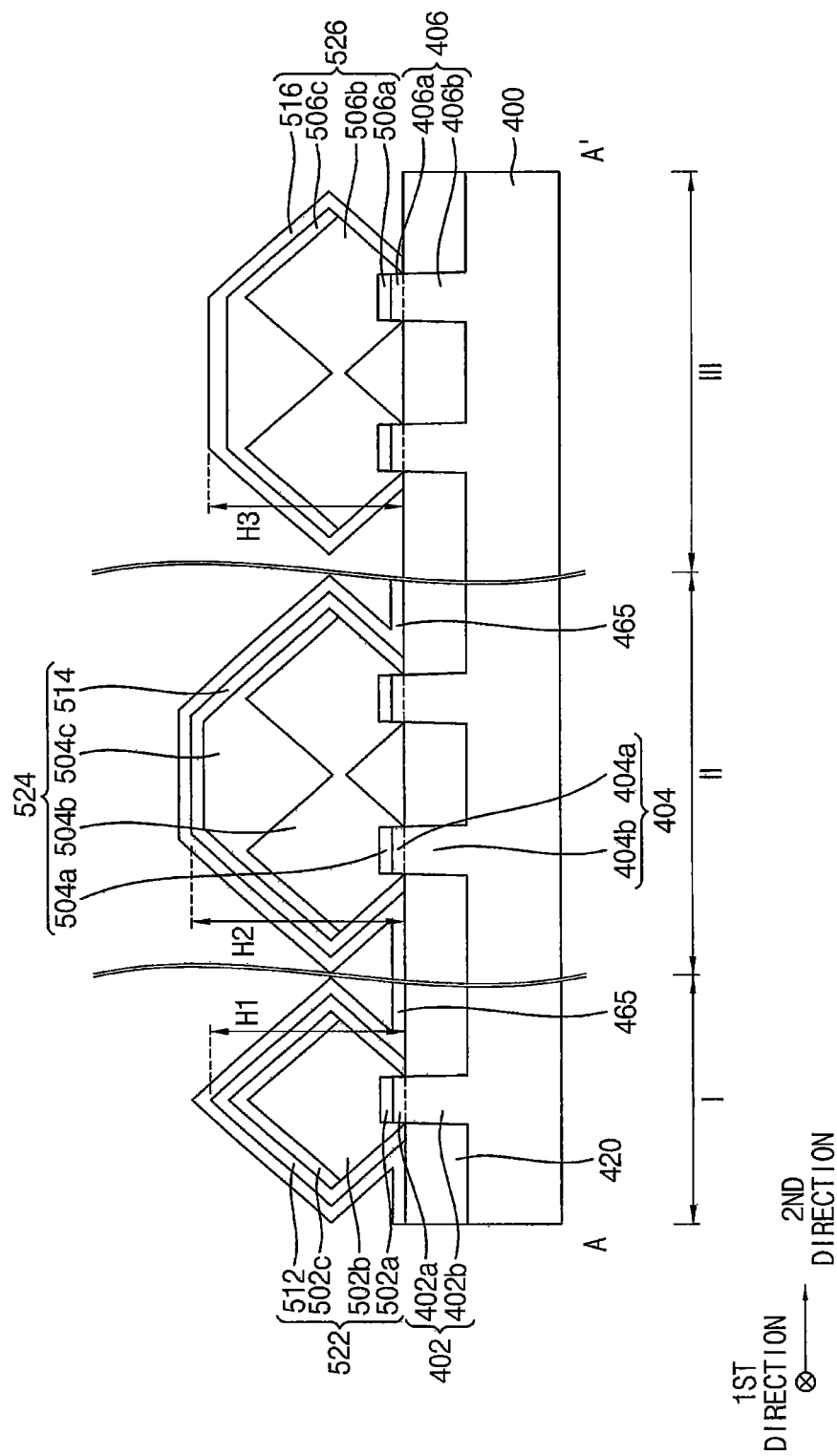
Figure 82:
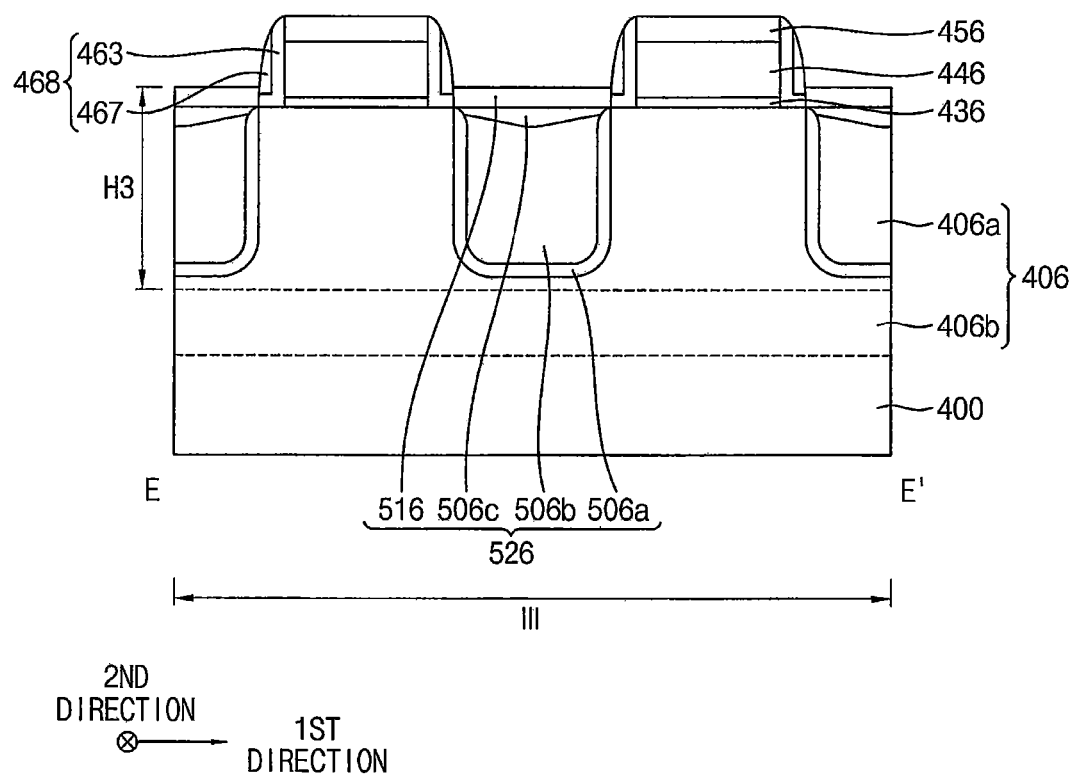
Figure 83:
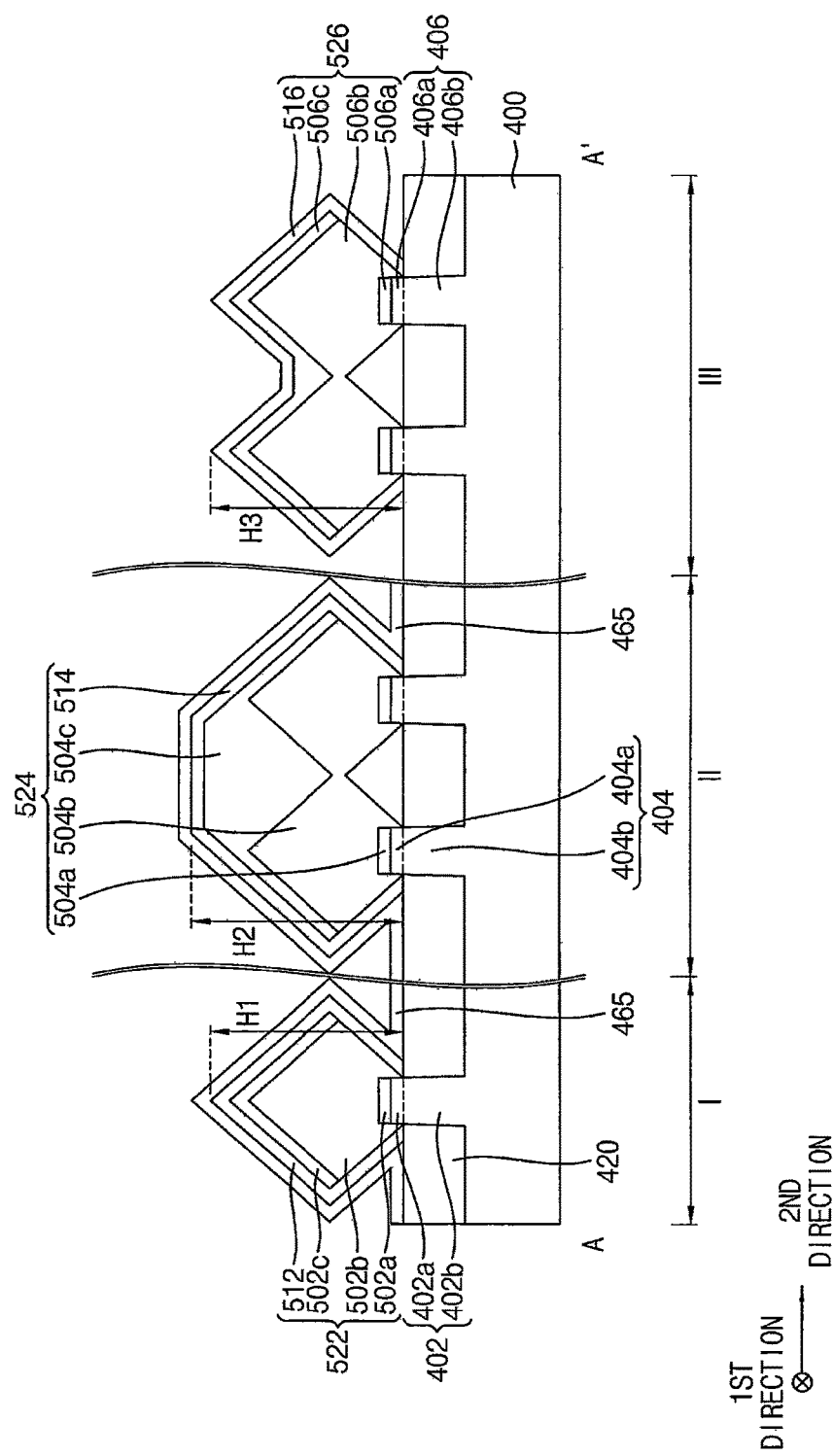
Figure 84:
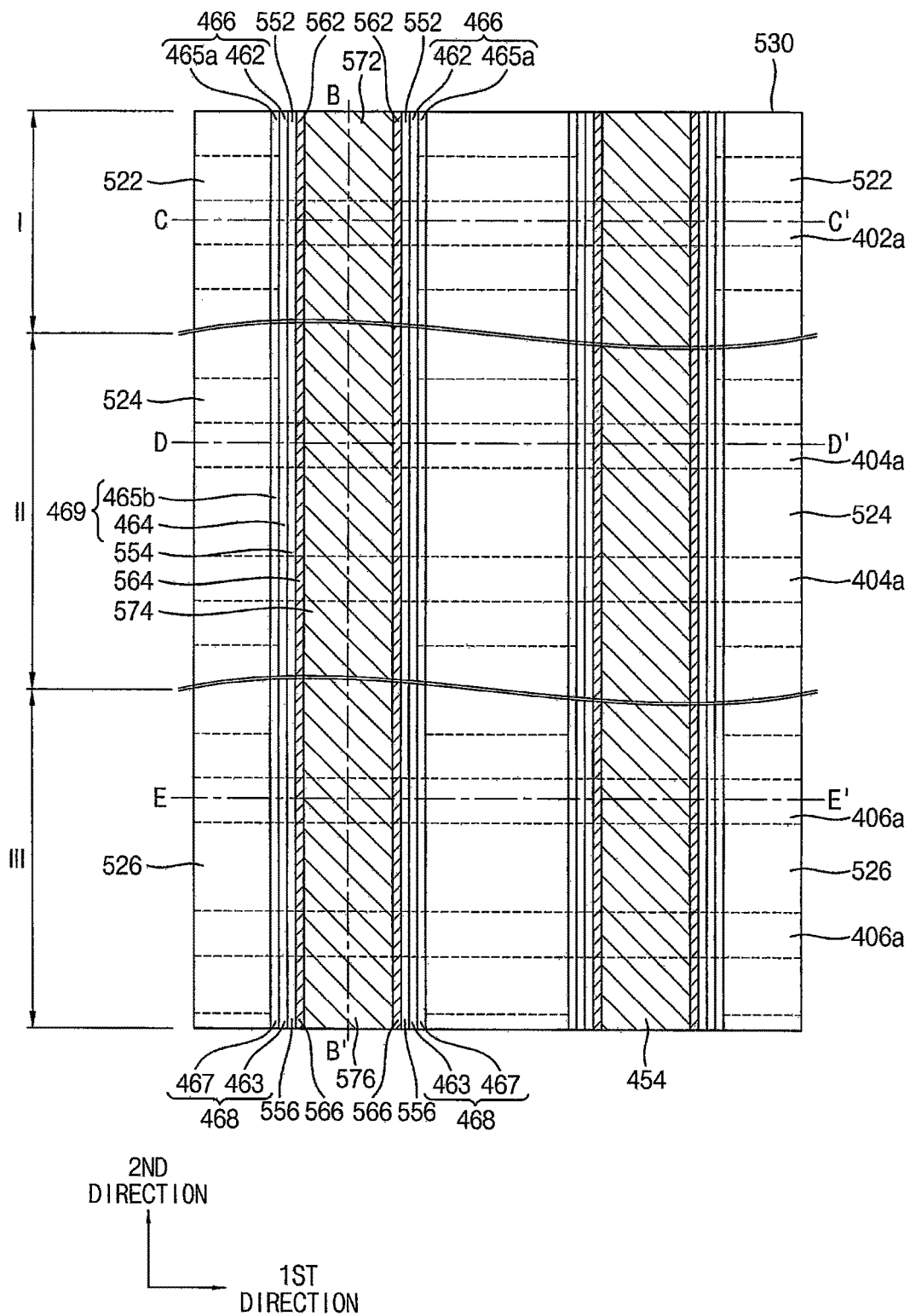

Referring to FIGS. 81 and 82, the third source/drain layer structure 526 may be formed to have a shape that is described with reference to FIGS. 25 and 26. Referring to FIG. 83, the third source/drain layer structure 526 may be formed to have a shape that is described with reference to FIG. 27. The third source/drain layer structures 526 that are described with reference to FIGS. 81 to 83 may be formed by performing the first to fourth SEG processes using a silicon source gas, an etching gas, a carrier gas and an n-type impurity source gas, and thus a single crystalline silicon layer doped with n-type impurities may be formed.

Referring to FIGS. 84 to 88, processes that are substantially the same as or similar to those that are described with reference to FIGS. 28 to 35 may be performed. Thus, an insulation layer 530 may be formed on the first to third active fins 402, 404 and 406 and the isolation pattern 420 to cover the first to third dummy gate structures, the first and second gate spacers 462 and 464, the second spacer layer 465, the third gate spacer structure 468, and the first to third source/drain layer structures 522, 524 and 526 to a sufficient height, and may be planarized until upper surfaces of the first to third dummy gate electrodes 442, 444 and 446 of the respective first to third dummy gate structures may be exposed.

In the planarization process, the first to third dummy gate masks 452, 454 and 456 may be removed, and the second spacer layer 465 and upper portions of the third gate spacer structure 468 may be partially removed. The second spacer layer 465 may be partially removed so that portions of the second spacer layer 465 may remain in the first and second regions I and II, respectively, and hereinafter, which may be referred to as fifth and sixth gate spacers 465a and 465b, respectively. Thus, the first and fifth gate spacers 462 and 465a in the first region I may form a first gate spacer structure 466, and the second and sixth gate spacers 464 and 465b in the second region II may form a second gate spacer structure 469.

The exposed first to third dummy gate electrodes 442, 444 and 446 and the first to third dummy gate insulation patterns 432, 434 and 436 thereunder may be removed to form first to third openings that expose inner sidewalls of the respective first to third gate spacer structures 466, 469 and 468 and upper surfaces of the respective first to third active fins 402, 404 and 406, and first to third gate structures 582, 584 and 586 may be formed to fill the first to third openings, respectively.

The first gate structure may include a first interface pattern 542, a first gate insulation pattern 552, a first work function control pattern 562 and a first gate electrode 572 sequentially stacked, and the first gate structure 582 together with the first source/drain layer structure 522 may form a first transistor. The second gate structure may include a second interface pattern 544, a second gate insulation pattern 554, a second work function control pattern 564 and a second gate electrode 574 sequentially stacked, and the second gate structure 584 together with the second source/drain layer structure 524 may form a second transistor. The third gate structure may include a third interface pattern 546, a third gate insulation pattern 556, a third work function control pattern 566 and a third gate electrode 576 sequentially stacked, and the third gate structure 586 together with the third source/drain layer structure 526 may form a third transistor. The first and second transistors may be PMOS transistors and the third transistor may be an NMOS transistor. In some embodiments, the first transistor may be an NMOS transistor.

Referring to FIGS. 89 to 93, processes that are substantially the same as or similar to those that are described with reference to FIGS. 36 to 39 may be performed. Thus, a fourth capping layer 590 and an insulating interlayer 600 may be sequentially formed on the insulation layer 530, the first to third gate structures 582, 584 and 586, and the first to third gate spacer structures 466, 469 and 468, and first to third contact holes 612, 614 and 616 may be formed through the insulation layer 530, the fourth capping layer 590 and the insulating interlayer 600 to expose upper surfaces of the first to third source/drain layer structures 522, 524 and 526, respectively. When the first to third contact holes 612, 614 and 616 are formed, the upper surfaces of the first to third source/drain layer structures 522, 524 and 526 may be exposed, and further partially etched.

In some embodiments, ones of the first to third contact holes 612, 614 and 616 may have a flat bottom, and thus the bottom of ones of the first to third contact holes 612, 614 and 616 may have a constant height. Alternatively, like the processes that are described with reference to FIGS. 40 to 42, ones of the first to third contact holes 612, 614 and 616 may have a bent bottom, and thus the bottom of ones of the first to third contact holes 612, 614 and 616 may have a varying height.

In some embodiments, the first to third contact holes 612, 614 and 616 may have first to third depths D1, D2 and D3, respectively, and the first depth D1 may be greater than the second and third depths D2 and D3. The second and third depths D2 and D3 may be substantially equal to or different from each other.

Referring to FIGS. 94 to 99, processes that are substantially the same as or similar to those that are described with reference to FIGS. 43 to 47 may be performed to complete the semiconductor device. That is, after forming a first metal layer on the exposed upper surfaces of the first to third source/drain layer structures 522, 524 and 526, sidewalls of the first to third contact holes 612, 614 and 616, and the upper surface of the insulating interlayer 600, a heat treatment process may be performed thereon to form first to third metal silicide patterns 622, 624 and 626 on the first to third source/drain layer structures 522, 524 and 526, respectively. An unreacted portion of the first metal layer may be removed. The first metal layer may be formed of a metal, e.g., titanium, cobalt, nickel, etc. The first metal silicide pattern 622 may include first, second and third portions 622a, 622b and 622c, the second metal silicide pattern 624 may include fourth, fifth and sixth portions 624a, 624b and 624c, and the third metal silicide pattern 626 may include seventh, eighth and ninth portions 626a, 626b and 626c.

First to third contact plugs 652, 654 and 656 may be formed on the first to third metal silicide patterns 622, 624 and 626 to fill the first to third contact holes 612, 614 and 616, respectively. The first contact plug 652 may include a first metal pattern 642 and a first barrier pattern 632 covering a bottom and a sidewall thereof, the second contact plug 654 may include a second metal pattern 644 and a second barrier pattern 634 covering a bottom and a sidewall thereof, and the third contact plug 656 may include a third metal pattern 646 and a third barrier pattern 636 covering a bottom and a sidewall thereof.

In some embodiments, ones of the first to third contact plugs 652, 654 and 656 may have a flat bottom, and thus the bottom of ones of the first to third contact plugs 652, 654 and 656 may have a constant height. Alternatively, when the first to third contact plugs 652, 654 and 656 fill the first to third contact holes 612, 614 and 616, respectively, having the shapes that are described with reference to FIGS. 40 to 42, ones of the first to third contact plugs 652, 654 and 656 may have a bent bottom, and thus the bottom of ones of the first to third contact plugs 652, 654 and 656 may have a varying height.

In some embodiments, the first to third contact plugs 652, 654 and 656 may have first, second and sixth lengths L1, L2 and L6, respectively, along a direction substantially perpendicular to the upper surface of the substrate 400, and the first length L1 may be greater than the second and sixth lengths L2 and L6. The second and sixth lengths L2 and L6 may be substantially equal to or different from each other.

Alternatively, at least one of the second and third contact plugs 654 and 656 may have the shape that is described with reference to FIGS. 48 to 50, and in this case, at least one of the second and sixth lengths L2 and L6 may be substantially equal to the first length L1.

Figure 100:
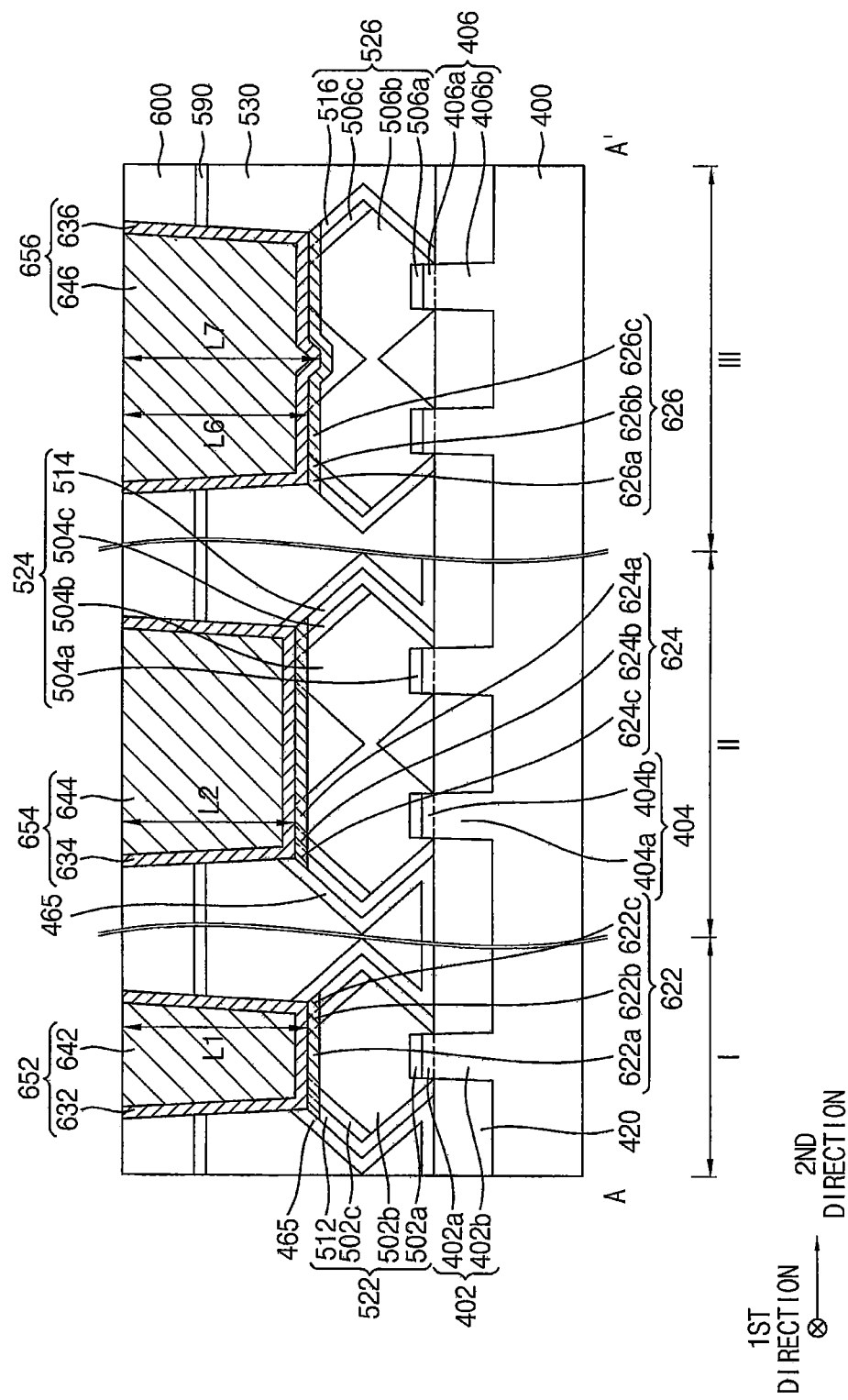

FIG. 100 shows that the third contact plug 656 may have the shape that is described with reference to FIGS. 51 to 53, and a portion of the third contact plug 656 may have a seventh length L7 greater than the first length L1. That is, the upper surface of the third source/drain layer structure 526 and the bottom of the third contact plug 656 may be bent, and thus the contact area therebetween may increase to reduce the contact resistance. The third source/drain layer structure 526 may have a multi-layered structure including a plurality of single crystalline silicon layers doped with n-type impurities.

A wiring and a via may be further formed to be electrically connected to the first to third contact plugs 652, 654 and 656.

The above method of manufacturing the semiconductor device may be applied to methods of manufacturing various types of memory devices including source/drain layers that may be formed by an SEG process. For example, the method may be applied to methods of manufacturing logic devices such as central processing units (CPUs), main processing units (MPUs), or application processors (APs), or the like. Additionally, the method may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of some embodiments of the inventive concepts and is not to be construed as limiting thereof. Although some embodiments have been described, those skilled in the art will readily appreciate that many modifications are possible without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of some embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
    a first active fin on a first region of a surface of a substrate, the surface of the substrate comprising the first region and a second region;
    a plurality of second active fins on the second region of the substrate;
    first and second gate structures on the first and second active fins, respectively;
    a first source/drain layer structure on a portion of the first active fin that is adjacent to the first gate structure; and
    a second source/drain layer structure commonly contacting upper surfaces of the second active fins adjacent to the second gate structure,
    wherein the first source/drain layer structure comprises:
        a first semiconductor layer on the first active fin;
        a second semiconductor layer on the first semiconductor layer; and
        a third semiconductor layer on the second semiconductor layer,
    wherein the second source/drain layer structure comprises:
        fourth semiconductor layers on the respective second active fins that are spaced apart from each other;
        a continuous fifth semiconductor layer commonly on the fourth semiconductor layers; and
        a continuous sixth semiconductor layer on the fifth semiconductor layer,
    wherein the second semiconductor layer is between the first semiconductor layer and the third semiconductor layer,
    wherein the fifth semiconductor layer is between the fourth semiconductor layers and the sixth semiconductor layer, and
    wherein a maximum thickness of the continuous sixth semiconductor layer is greater than that of the third semiconductor layer.

2. The semiconductor device of claim 1, wherein the first and fourth semiconductor layers comprise silicon-germanium with a first germanium concentration, the second and fifth semiconductor layers comprise silicon-germanium with a second germanium concentration greater than the first germanium concentration, and the third and sixth semiconductor layers comprise silicon-germanium with a third germanium concentration greater than the second germanium concentration.

3. The semiconductor device of claim 2, wherein the first and fourth semiconductor layers further comprise p-type impurities with a fourth impurity concentration, the second and fifth semiconductor layers further comprise p-type impurities with a fifth impurity concentration greater than the fourth impurity concentration, and the third and sixth semiconductor layers further comprise p-type impurities with a sixth impurity concentration greater than the fifth impurity concentration.

4. The semiconductor device of claim 1, wherein the first and second active fins comprise respective longest dimensions that extend in a first direction substantially parallel to the surface of the substrate, and the first and second gate structures comprise respective longest dimensions that extend in a second direction that is substantially parallel to the surface of the substrate and crosses the first direction.

5. The semiconductor device of claim 4,
wherein a cross-section of the second semiconductor layer taken along the second direction has a first shape comprising first and second exterior upper sidewall surfaces defining an angle with respect to the surface of the substrate and facing away from the substrate, lower exterior sidewall surfaces defining an angle with respect to the surface of the substrate and facing towards the surface of the substrate, and a top surface that is parallel to the surface of the substrate,
wherein the third semiconductor layer contacts the first and the second exterior upper sidewall surfaces of the second semiconductor layer,
wherein a cross-section of the fifth semiconductor layer taken along the second direction has a shape comprising a plurality of second shapes contacting each other in the second direction, the second shapes being on respective ones of the second active fins and comprising exterior upper sidewall surfaces defining an angle with respect to the surface of the substrate and facing away from the substrate and lower exterior sidewall surfaces defining an angle with respect to the surface of the substrate and facing towards the surface of the substrate, and
wherein the sixth semiconductor layer contacts the exterior upper sidewall surfaces of the fifth semiconductor layer.

6. The semiconductor device of claim 5, wherein a top surface of the sixth semiconductor layer is substantially coplanar with a flat top surface of the fifth semiconductor layer.

7. The semiconductor device of claim 5, wherein a cross-section of the sixth semiconductor layer taken along the second direction comprises a top surface that is substantially flat and substantially parallel to the surface of the substrate along the second direction.

8. The semiconductor device of claim 1, further comprising:
a first contact plug on the first source/drain layer structure; and
a second contact plug on the second source/drain layer structure.

9. The semiconductor device of claim 8, further comprising:
a first metal silicide pattern between the first source/drain layer structure and the first contact plug; and
a second metal silicide pattern between the second source/drain layer structure and the second contact plug.

10. The semiconductor device of claim 1,
wherein the first active fin comprises a plurality of first active fins,
and wherein the first source/drain layer structure comprises a plurality of structures that are spaced apart from each other with ones of the plurality of structures on respective ones of the plurality of first active fins.

11. A semiconductor device, comprising:
a first active fin on a first region of a surface of a substrate, the surface of the substrate comprising the first region, a second region and a third region;
a plurality of second active fins and a plurality of third active fins on the second and third regions, respectively, of the substrate;
first, second and third gate structures on the first, second and third active fins, respectively;
a first epitaxial layer structure on a portion of the first active fin adjacent the first gate structure;
a second epitaxial layer structure commonly contacting upper surfaces of the second active fins adjacent the second gate structure;
a third epitaxial layer structure commonly contacting upper surfaces of the third active fins adjacent the third gate structure;
a first contact plug on the first epitaxial layer structure;
a second contact plug on the second epitaxial layer structure; and
a third contact plug on the third epitaxial layer structure,
wherein a bottom of at least one of the second and third contact plugs is substantially flat and substantially parallel to the surface of the substrate,
wherein the first epitaxial layer structure comprises:
a first semiconductor layer on the first active fin;
a second semiconductor layer on the first semiconductor layer; and
a third semiconductor layer on the second semiconductor layer,
wherein the second epitaxial layer structure comprises:
fourth semiconductor layers on the respective second active fins that are spaced apart from each other;
a continuous fifth semiconductor layer commonly on the fourth semiconductor layers; and
a continuous sixth semiconductor layer on the fifth semiconductor layer,
wherein the second semiconductor layer is between the first semiconductor layer and the third semiconductor layer,
wherein the fifth semiconductor layer is between the fourth semiconductor layers and the sixth semiconductor layer, and
wherein a maximum thickness of the continuous sixth semiconductor layer is greater than that of the third semiconductor layer.

12. The semiconductor device of claim 11,
wherein the second epitaxial layer structure comprises silicon-germanium, and the third epitaxial layer structure comprises silicon carbide.

13. The semiconductor device of claim 11, wherein the second epitaxial layer structure comprises silicon-germanium, and the third epitaxial layer structure comprises silicon.

14. The semiconductor device of claim 11, wherein the first region is a static random access memory (SRAM)

region comprising an SRAM device, and the second and third regions are logic regions comprising respective logic devices.

15. A semiconductor device, comprising:
a substrate;
an active fin on the substrate that extends with a longest dimension in a first direction that is parallel to a surface of the substrate;
a gate pattern on the active fin that extends with a longest dimension in a second direction that is parallel to the surface of the substrate and that crosses the first direction;
a first semiconductor layer that is on a bottom and sidewalls of a recessed portion of the active fin that is adjacent the gate pattern, the first semiconductor layer comprising silicon germanium with a first germanium concentration;
a second semiconductor layer on the first semiconductor layer having a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate, adjacent ones of the upper sidewall surfaces and the lower sidewall surfaces defining intersections therebetween, the second semiconductor layer comprising silicon germanium with a second germanium concentration that is greater than the first germanium concentration; and
a third semiconductor layer that is on at least two ones of the upper sidewall surfaces of the second semiconductor layer and not extending substantially below the intersections between the upper sidewall surfaces and the lower sidewall surfaces of the second semiconductor layer, the at least two ones of the upper sidewall surfaces sharing no intersections, and the third semiconductor layer comprising silicon germanium with a third germanium concentration that is greater than the second germanium concentration,
wherein the third semiconductor layer is between and in direct contact with the upper sidewall surfaces of the second semiconductor layer and an upper sidewall of a capping layer.

16. The semiconductor device of claim 15, wherein the first semiconductor layer comprises p-type impurities with a first impurity concentration, the second semiconductor layer comprises p-type impurities with a second impurity concentration that is greater than the first impurity concentration, and the third semiconductor layer comprises p-type impurities with a third impurity concentration that is greater than the second impurity concentration.

17. The semiconductor device of claim 15, wherein the active fin and the gate pattern are a first active fin and a first gate pattern, respectively, on a first region of the substrate, the semiconductor device further comprising:
a plurality of second active fins on a second region of the substrate that extend parallel to each other with longest dimensions in the first direction;
a second gate pattern on the plurality of second active fins that extends with a longest dimension in the second direction;
a plurality of fourth semiconductor layers that are on bottoms and sidewalls of recessed portions of respective ones of the plurality of second active fins that are adjacent the second gate pattern, the fourth semiconductor layers comprising silicon germanium with a fourth germanium concentration and being spaced apart from each other;
a fifth semiconductor layer on the plurality of fourth semiconductor layers, the fifth semiconductor layer comprising a plurality of shapes, ones of the plurality of shapes being on respective ones of the plurality of fourth semiconductor layers and having a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate, the fifth semiconductor layer comprising silicon germanium with a fifth germanium concentration that is greater than the fourth germanium concentration, adjacent ones of the shapes of the fifth semiconductor layer contacting each other; and
a sixth semiconductor layer that is on the upper sidewall surfaces of the shapes of the fifth semiconductor layer and not extending substantially below intersections between the upper sidewall surfaces the lower sidewall surfaces of the shapes of the fifth semiconductor layer, the sixth semiconductor layer comprising silicon germanium with a sixth germanium concentration that is greater than the fifth germanium concentration.

18. The semiconductor device of claim 17,
wherein the plurality of second active fins comprises two outermost ones of the second active fins and at least one inner second active fin that is between the outermost ones of the second active fins,
wherein the plurality of shapes of the fifth semiconductor layer comprises outermost shapes on the outermost ones of the second active fins and at least one inner shape that is on the at least one inner second active fin,
wherein the outermost shapes of the fifth semiconductor layer comprise inner upper sidewall surfaces that are adjacent to the at least one inner shape and outer upper sidewall surfaces opposite from the at least one inner shape,
wherein a thickness of the third semiconductor layer on the upper sidewall surfaces of the second semiconductor layer is less than a thickness of the sixth semiconductor layer on the inner upper sidewall surfaces of the outermost shapes of the fifth semiconductor layer and less than thicknesses of the sixth semiconductor layer on the upper sidewall surfaces of the inner shapes of the fifth semiconductor layer, and
wherein a thickness of the sixth semiconductor layer on the outer upper sidewall surfaces of the outermost shapes of the fifth semiconductor layer is less than the thickness of the sixth semiconductor layer on the inner upper sidewall surfaces of the outermost shapes of the fifth semiconductor layer and less than the thicknesses of the sixth semiconductor layer on the upper sidewall surfaces of the inner shapes of the fifth semiconductor layer.

19. The semiconductor device of claim 17, further comprising:
a plurality of third active fins on a third region of the substrate that extend parallel to each other with longest dimensions in the first direction, the plurality of third active fins comprising outermost ones of the third active fins and at least one inner third active fin that is between the outermost ones of the third active fins;

a third gate pattern on the plurality of third active fins that extends with a longest dimension in the second direction;

a plurality of seventh semiconductor layers that are on bottoms and sidewalls of recessed portions of respective ones of the plurality of third active fins that are adjacent the third gate pattern, the seventh semiconductor layers comprising silicon carbide with a first carbon concentration and being spaced apart from each other;

an eighth semiconductor layer on the plurality of seventh semiconductor layers, the eighth semiconductor layer comprising a plurality of shapes, ones of the plurality of shapes being on respective ones of the plurality of seventh semiconductor layers and having a cross-section taken in the second direction comprising upper sidewall surfaces defining an angle with respect to the surface of the substrate and facing away from the substrate and lower sidewall surfaces defining an angle with respect to the surface of the substrate and facing towards the surface of the substrate, the eighth semiconductor layer comprising silicon carbide with a second carbon concentration that is greater than the first carbon concentration, adjacent ones of the shapes of the eighth semiconductor layer contacting each other; and a ninth semiconductor layer that is on the upper sidewall surfaces of the shapes of the eighth semiconductor layer and not on the lower sidewall surfaces of the shapes of the eighth semiconductor layer, the ninth semiconductor layer comprising silicon carbide with a third carbon concentration that is greater than the second carbon concentration.

* * * * *